(12) United States Patent
Nequist

(10) Patent No.: US 8,069,426 B2
(45) Date of Patent: Nov. 29, 2011

(54) METHOD AND MECHANISM FOR IDENTIFYING AND TRACKING SHAPE CONNECTIVITY

(75) Inventor: Eric Nequist, Monte Sereno, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 321 days.

(21) Appl. No.: 12/242,356

(22) Filed: Sep. 30, 2008

(65) Prior Publication Data

US 2009/0089720 A1  Apr. 2, 2009

Related U.S. Application Data

(62) Division of application No. 11/229,320, filed on Sep. 15, 2005, now Pat. No. 7,665,045.

(51) Int. Cl.
*G06F 17/50* (2006.01)

(52) U.S. Cl. ......... 716/106; 110/110; 110/112; 110/136

(58) Field of Classification Search .......... 716/106–112, 716/136
See application file for complete search history.

(56) References Cited

U.S. PATENT DOCUMENTS

| | | | |
|---|---|---|---|
| 5,838,583 A | 11/1998 | Varadarajan et al. | |
| 6,066,180 A | 5/2000 | Kim et al. | |
| 6,077,308 A * | 6/2000 | Carter et al. | 716/103 |
| 6,275,974 B1 | 8/2001 | Bartels et al. | |
| 6,546,529 B1 * | 4/2003 | Dansky et al. | 716/115 |
| 6,931,613 B2 | 8/2005 | Kauth et al. | |
| 2003/0018948 A1 | 1/2003 | Chang et al. | |
| 2003/0084416 A1 | 5/2003 | Dai et al. | |
| 2005/0132320 A1 | 6/2005 | Allen et al. | |
| 2005/0204315 A1 | 9/2005 | Knol et al. | |
| 2006/0074595 A1 * | 4/2006 | Yuan et al. | 702/182 |
| 2006/0101358 A1 | 5/2006 | Shah et al. | |
| 2006/0112356 A1 | 5/2006 | McGaughy et al. | |
| 2007/0157140 A1 | 7/2007 | Holesovsky et al. | |

OTHER PUBLICATIONS

Non-Final Office Action dated Mar. 9, 2009 for U.S. Appl. No. 11/229,320.
Notice of Allowance dated Sep. 25, 2009 for U.S. Appl. No. 11/229,320.
Non-Final Office Action dated Apr. 4, 2008 for U.S. Appl. No. 11/229,320.
Notice of Allowance dated Nov. 5, 2008 for U.S. Appl. No. 11/229,320.
Non-Final Office Action dated Dec. 9, 2010 for U.S. Appl. No. 12/648,843.
Notice of Allowance dated Jul. 28, 2008 for U.S. Appl. No. 11/229,344.
Final Office Action dated Apr. 19, 2011 for U.S. Appl. No. 12/648,843.

(Continued)

*Primary Examiner* — Paul Dinh
(74) *Attorney, Agent, or Firm* — Vista IP Law Group, LLP

(57) ABSTRACT

A method and mechanism is disclosed for identifying and tracking nets in an electrical design. A hierarchical design does not have to be flattened to perform the operation of identifying and tracking nets. To identify sets of connected shapes, instead of having to unfold the entire design hierarchy, only the specific instances of shapes falling within the geometric bounds of shapes identified as being part of a net needs to be unfolded to perform the search. When composing the list of nets for a hierarchical design, the unfolded shapes at other hierarchical levels of the design can be derived based upon virtual terminal structures that implicitly references nets and objects at other levels.

21 Claims, 56 Drawing Sheets

Example Design Hierarchy

OTHER PUBLICATIONS

Notice of Allowance dated Oct. 17, 2011 for U.S. Appl. No. 12/648,843.

Final Office Action dated Oct. 18, 2011 for U.S. Appl. No. 12/325,242.

\* cited by examiner

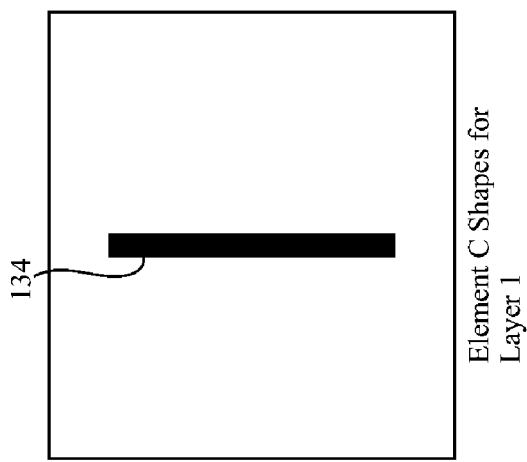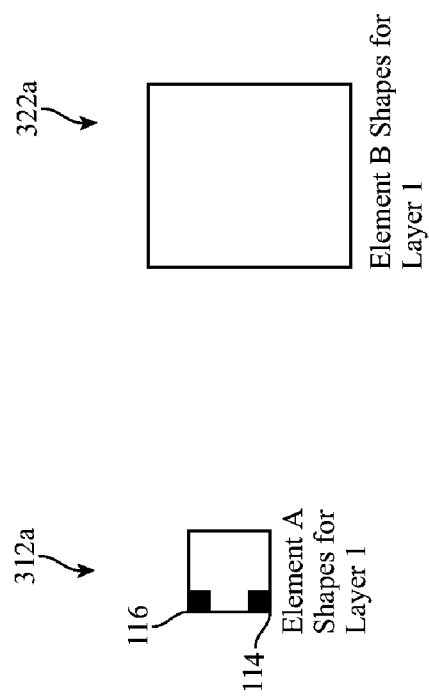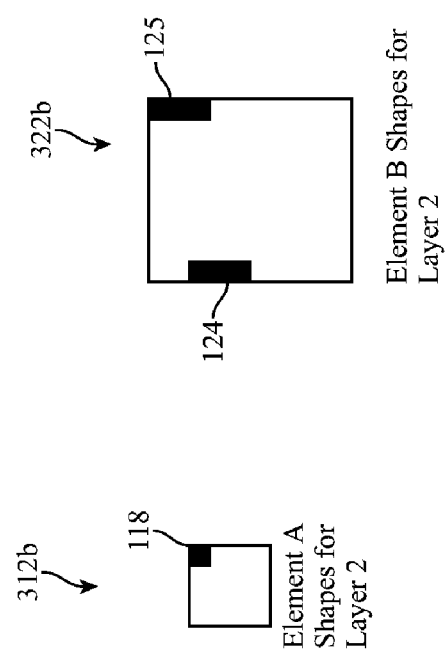
FIG. 3A
FIG. 3B

Element C
Layer 1 Shapes

Search shape tree (FIG. 8B)

Transform Search Area and search shape tree of master for instance B1 (FIG. 8D)

Element B Shapes for
Layer 1

Use transformed search area and search
shadow tree of master for instance B1
(FIG. 8E)

Element B
Shadow Layer 1

Transform Search Area and search shape tree of master for instance A2 (FIG. 8F)

Report Shape 114 and
Search shadow tree (FIG. 8G)

Element C
Layer 2 Shapes

Search shape tree (FIG. 9B)

Connectivity Extraction

(Box 1004 - Extract Nets)

(Box 1110 - Associate Shape to a net)

Example Design Hierarchy

Flattened Design Hierarchy

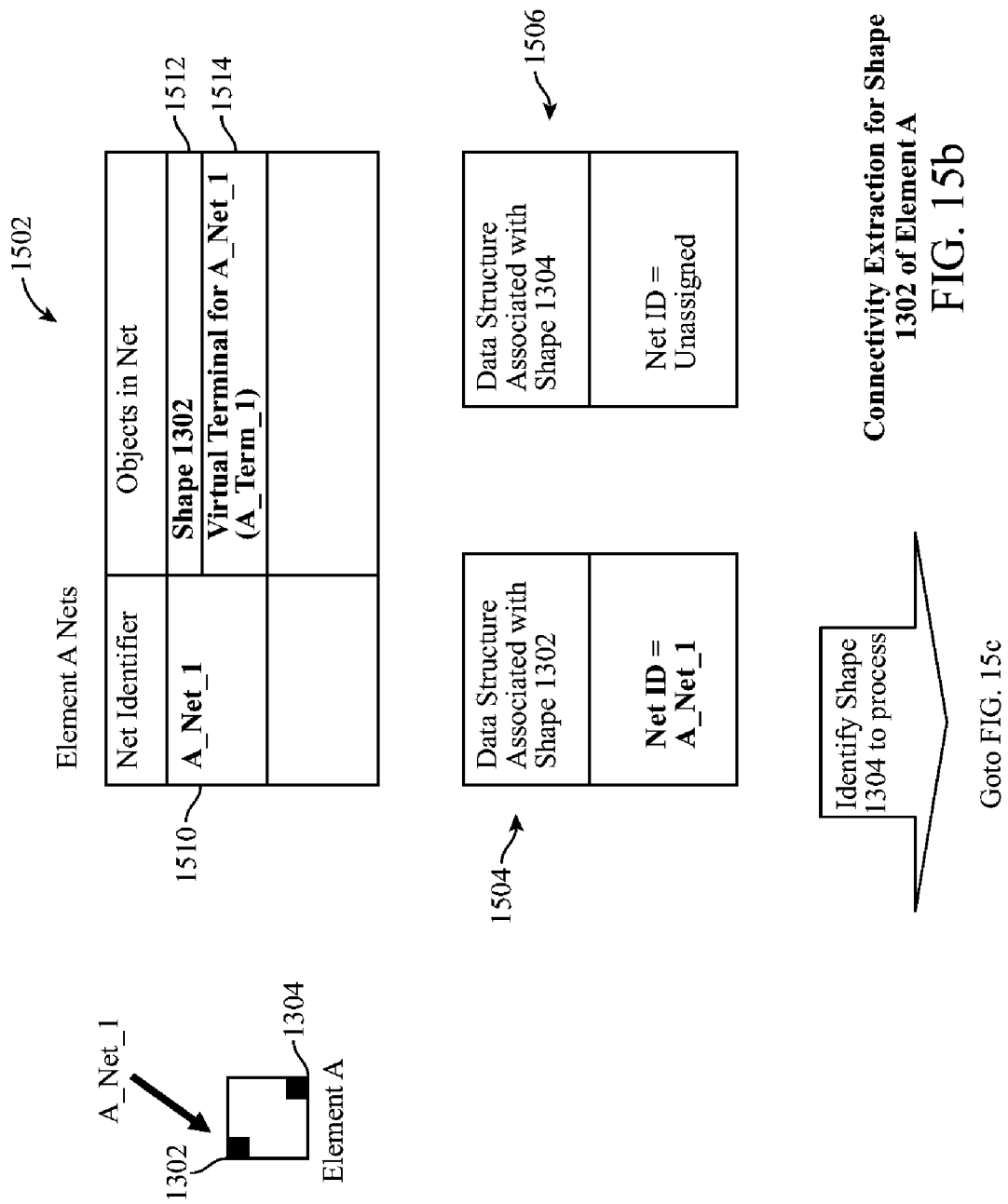

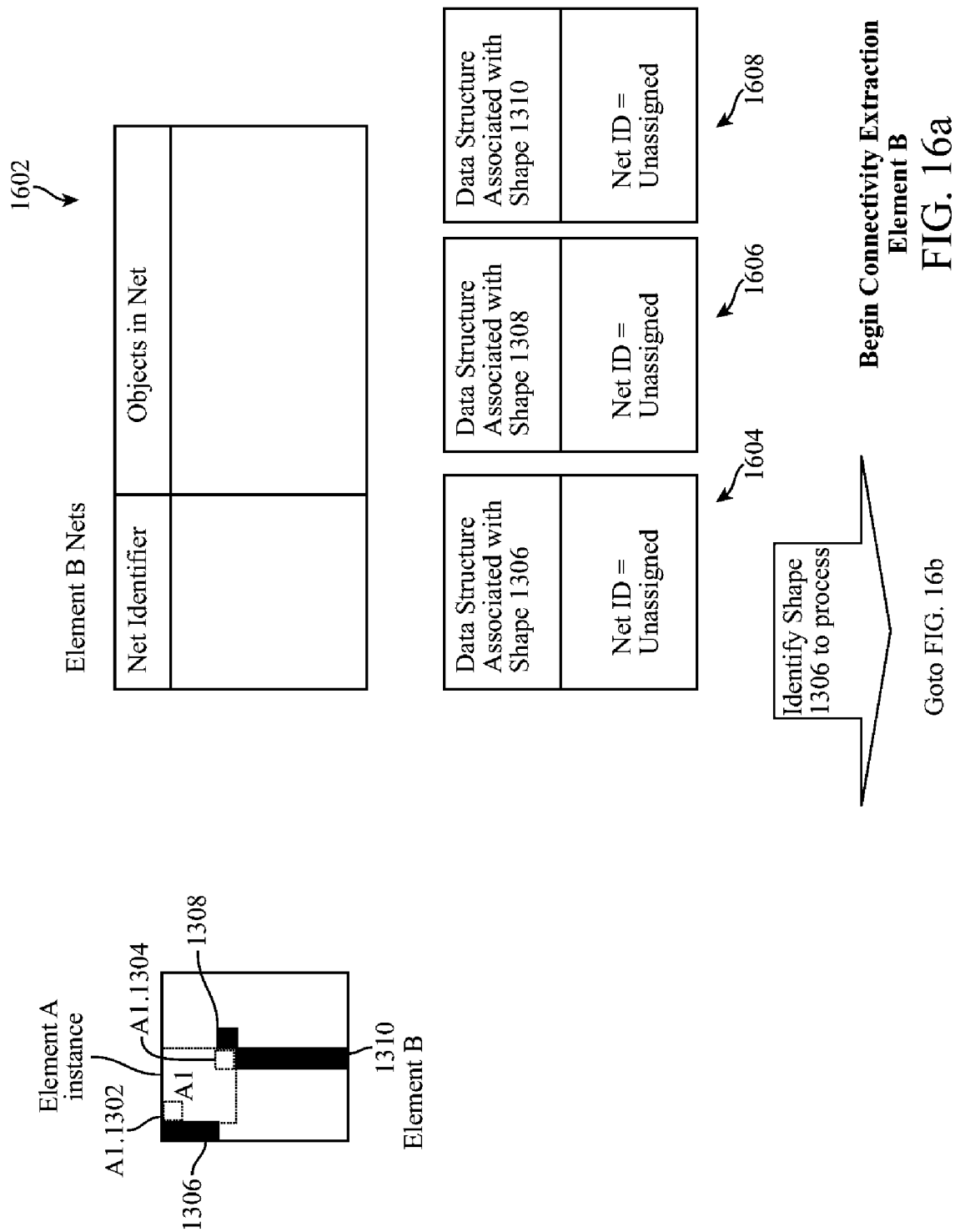

Connectivity Extraction for Shape 1306 of Element B

**Connectivity Extraction for Shape
1306 of Element B**

Connectivity Extraction for Shape 1308 of Element B

Connectivity Extraction for Shape 1308 of Element B

Connectivity Extraction for Shape 1312 of Element C

Connectivity Extraction for Shape 1314 of Element B

Element C

Update Connectivity

Element C

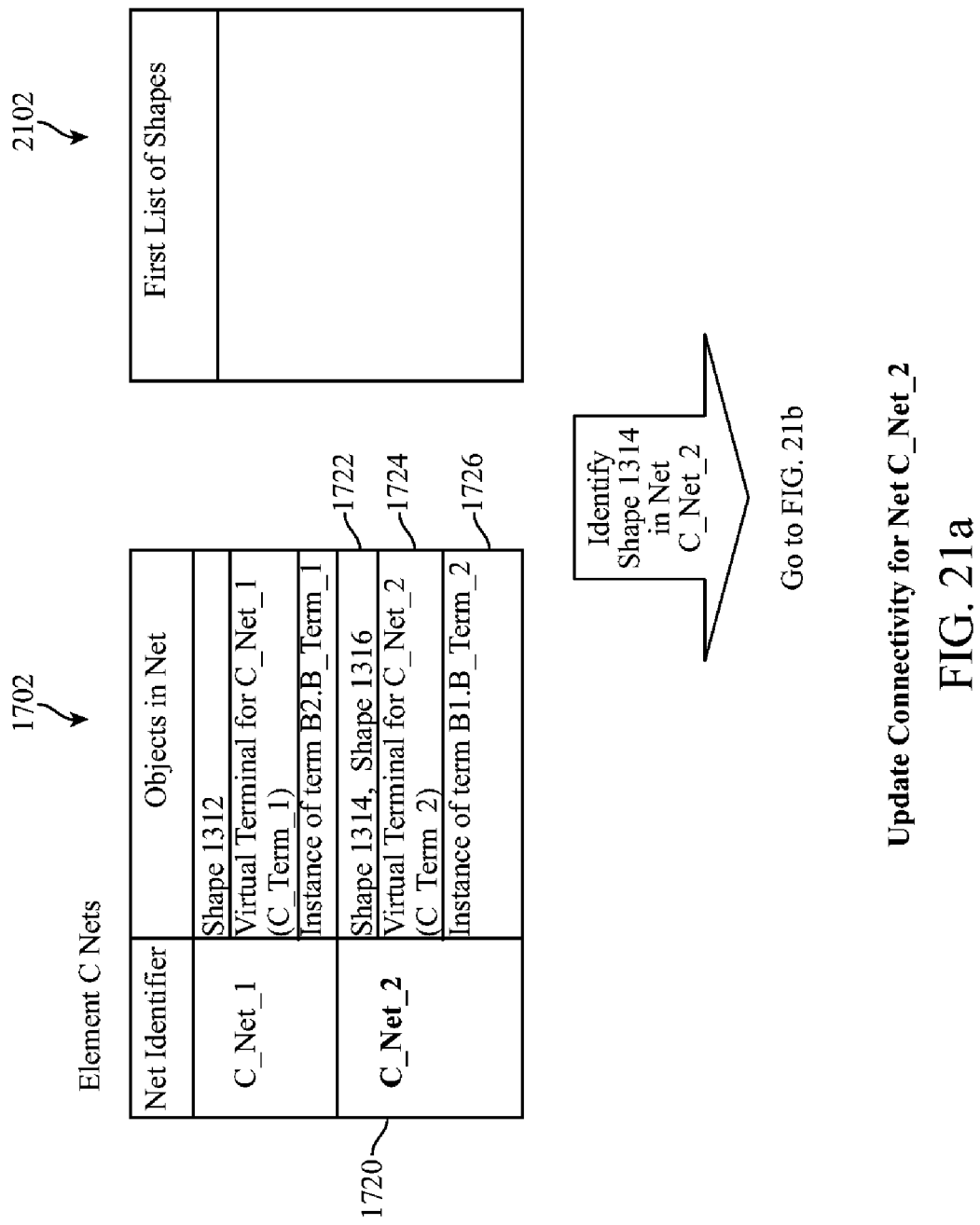

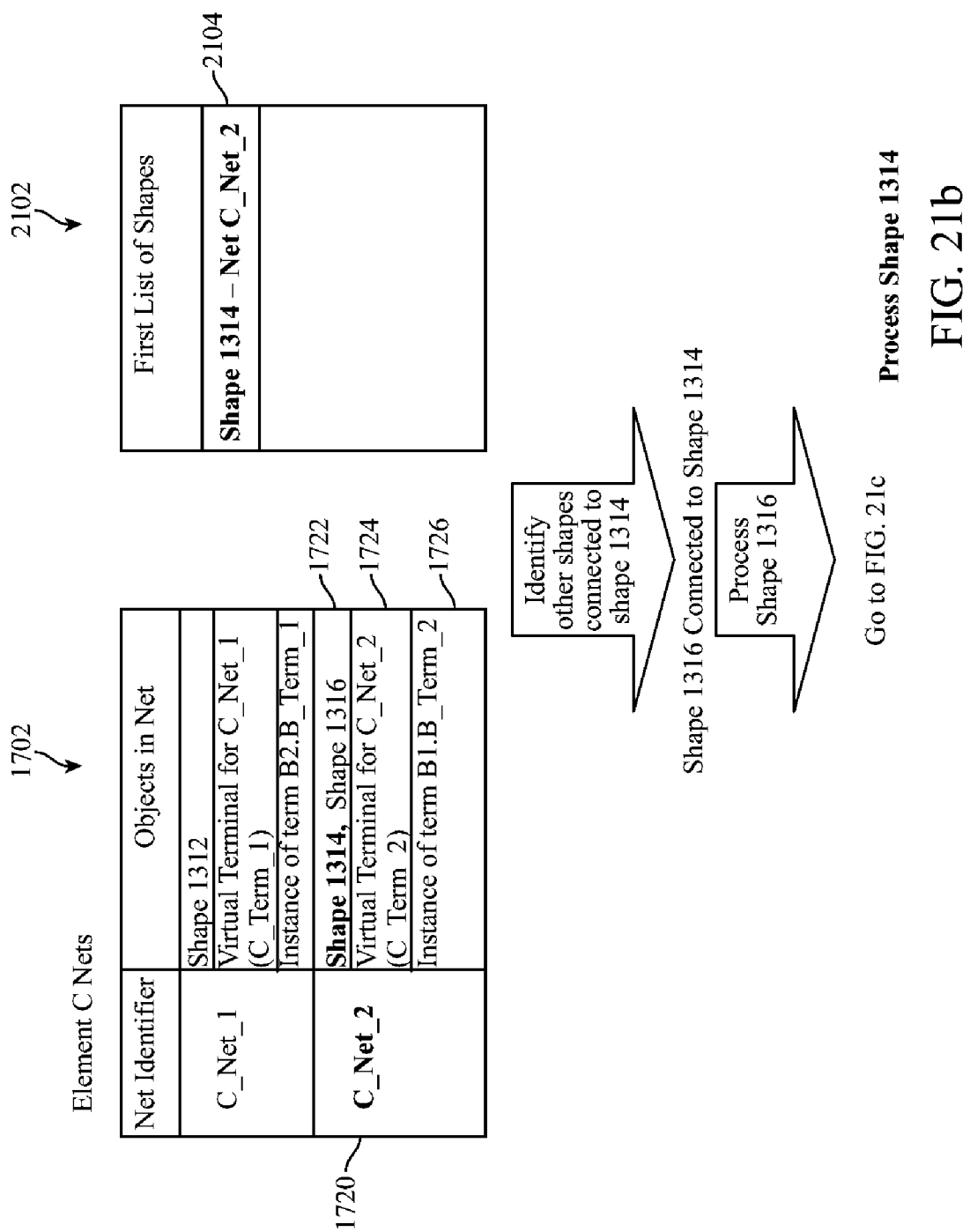

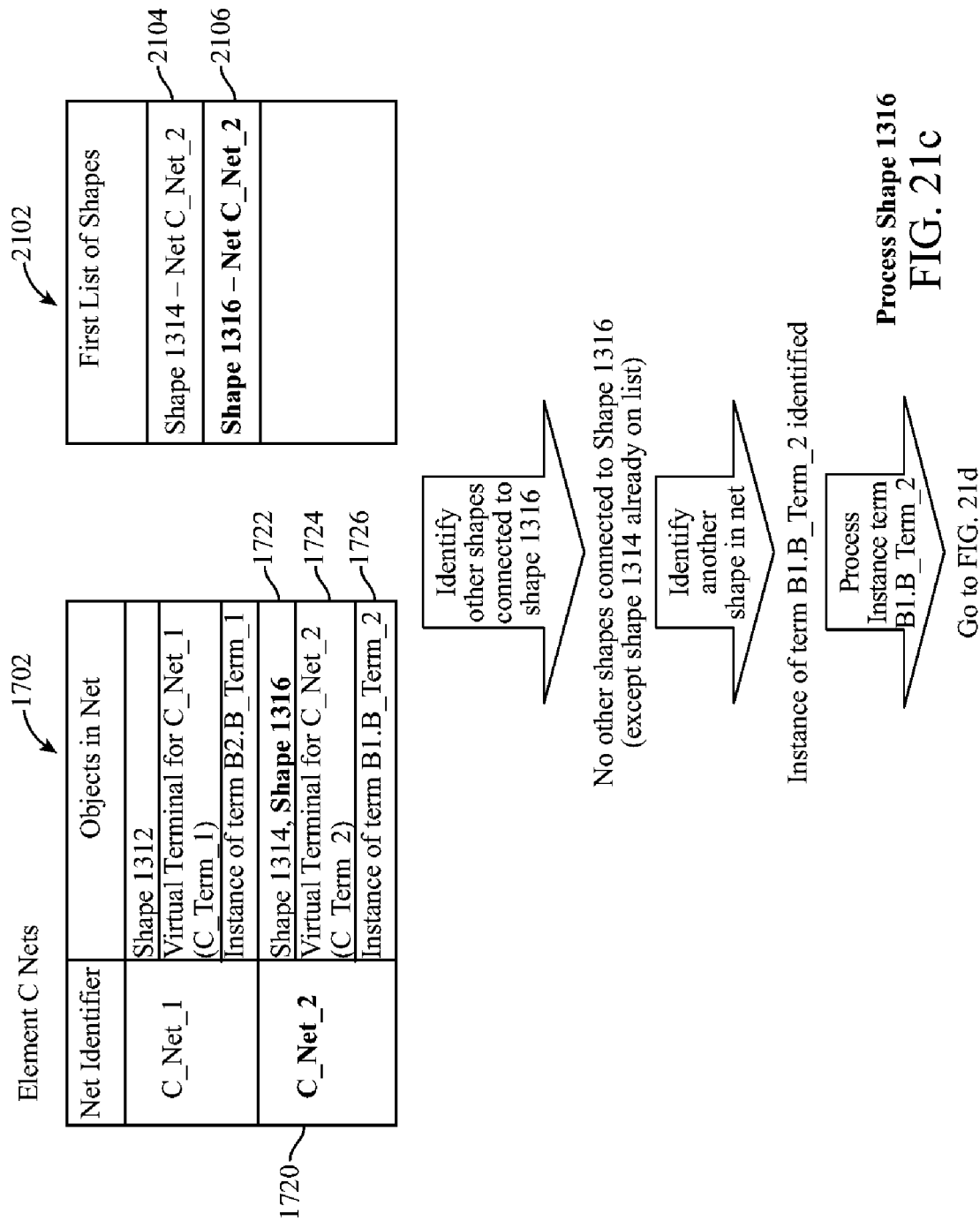

Element C

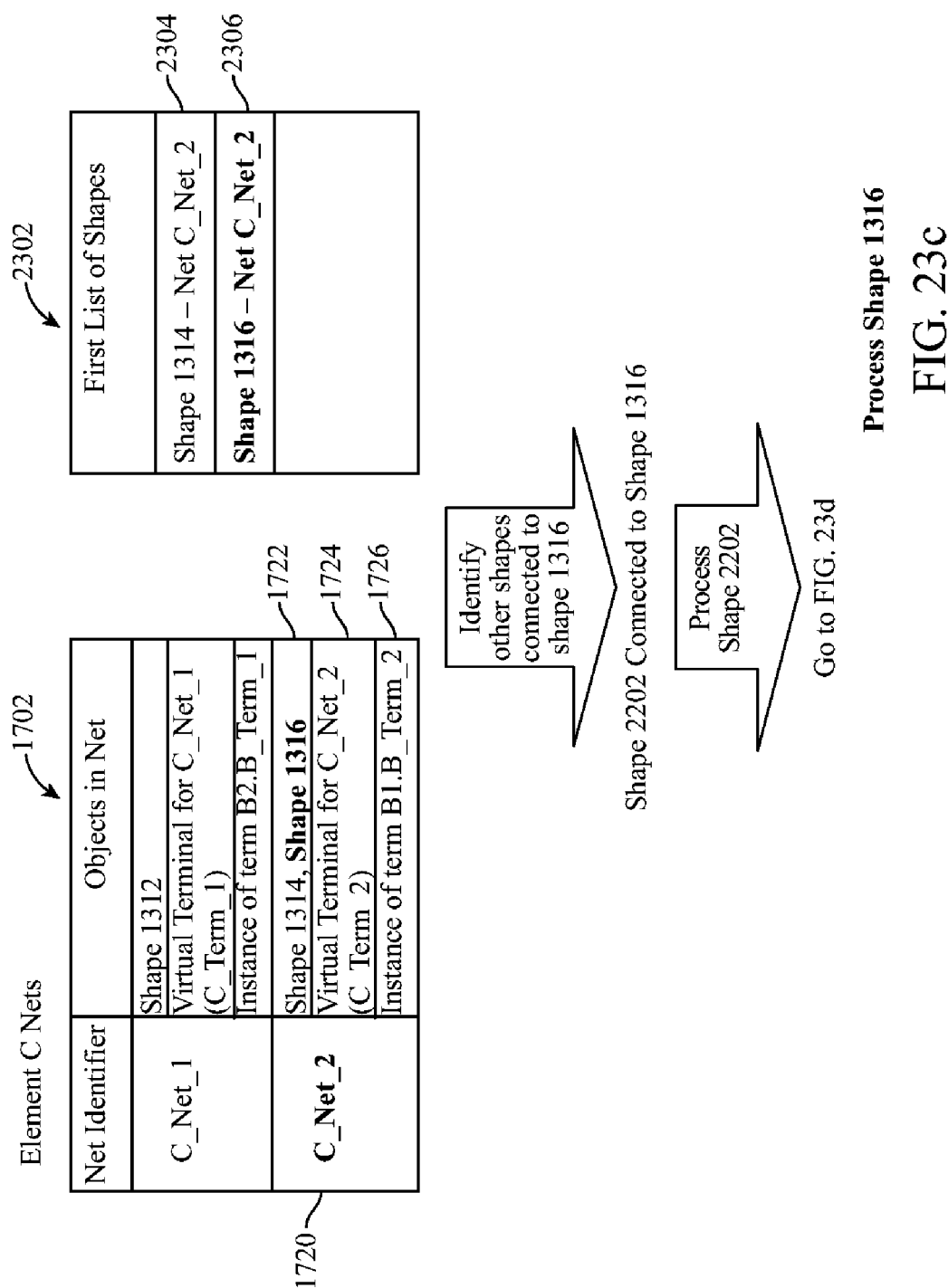

METHOD AND MECHANISM FOR IDENTIFYING AND TRACKING SHAPE CONNECTIVITY

CROSS-REFERENCE TO RELATED APPLICATIONS

The present application is a divisional application of and thereby claims the benefit of the U.S. patent application Ser. No. 11/229,320, filed on Sep. 15, 2005, now U.S. Pat. No. 7,665,045 entitled "METHOD AND MECHANISM FOR IDENTIFYING AND TRACKING SHAPE CONNECTIVITY", which is hereby incorporated by reference in its entirety.

The present application is related to co-pending U.S. application Ser. No. 11/229,344, filed on Sep. 15, 2005, entitled "METHOD AND MECHANISM FOR DETERMINING SHAPE CONNECTIVITY", which is hereby incorporated by reference in its entirety.

FIELD OF THE INVENTION

The present invention relates generally to electronic circuit design and manufacturing.

BACKGROUND OF THE INVENTION

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design. After the layout is complete, it is then checked to ensure that it meets the design requirements. The result is a set of design files, which are then converted into pattern generator files. The pattern generator files are used to produce patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

Geometric information about the placement of the nodes and components onto the chip is determined by a placement process and a routing process. The placement process is a process for placing electronic components or circuit blocks on the chip and the routing process is the process for creating interconnections between the blocks and components according to the specified netlist.

IC layouts are often constructed in a hierarchical fashion, in which a master version or occurrence of a particular geometric element is created once, but where one or more instances of the geometric element may be inserted into various locations and levels within the IC design. In this type of approach, the IC layout is hierarchically set out by re-using elements over and over again. Rather than copying duplicates of the same geometric element everywhere that it is used, instances of the elements are inserted in the appropriate locations that logically reference the appropriate master occurrence or version.

FIG. 1A shows an example design hierarchy, in which an occurrence 112 of element A comprises three shapes 114, 116, and 118. As used herein, occurrence is a master or reference copy of an element and an instance is an instantiation of an occurrence. At a different level in the IC design, an occurrence 122 of element B may be created that includes its own shapes 124 and 125, as well as two instances 126 and 128 of element A. At yet another level of the IC design, an occurrence 132 for element C may be created-that includes a shape 134 as well as two instances 136 and 138 of element B. Instances 136 and 138 each contain instances of element A as shown in occurrence 122 (which are "nested instances"). In the hierarchy of FIG. 1A, each instance provides a logical reference to its master occurrence rather than a physical manifestation of the occurrence at the instance locations. Assume that shapes 114, 116, and 134 are on layer 1 of the design and shapes 118, 124, and 125 are on layer 2 of the design. FIG. 1B shows the shapes that would be present on layer 1 for these portions of the design and FIG. 1C shows the shapes that would be present on layer 2.

An advantage of this approach is improved efficiency with respect to memory usage when storing design data for an IC design. Memory efficiencies are gained since instances of an element are used and placed in the design, rather than requiring a full copy of that element to be duplicated numerous times in the design data.

However, the hierarchical nature of this approach can also cause inefficiencies when attempting to access the design data. As just one example, consider the process to search a portion of the IC design for the shapes within a particular search area. The search area may encompass parts of one or more instances in the design. However, only a subset of the shapes within the instances may actually fall within the search area. Because the shapes are not actually stored at each level, the search process may need to traverse the entire hierarchy of the corresponding instances on every layer and their nested instances to confirm which shapes in the instances relate to the search area, even through portions of the hierarchy that do not contain any shapes at the correct layer or design area. Depending upon the complexity of the design, this could be a very lengthy and expensive process.

In an alternate approach, the design hierarchy can be flattened so that the design data is not hierarchical in nature. In this approach, rather than inserting instances of elements into the design, actual copies of the elements are placed in the appropriate locations within the design data. FIG. 2 shows a flattened version of the design data shown in FIG. 1. Here, occurrence 122a for a flattened element B includes copies 126a and 128a of element A112, rather than the instances 126 and 128 of element A shown in FIG. 1 that refers back to the master copy 112. Similarly, occurrence 132a for a flattened element C includes copies 136a and 138a of element B 122a, rather than instances that refer back to the master copy. The advantage of this approach is that it is very efficient to search the flattened design data, since chains of instances do not need to be followed to identify shapes within a search area. However, if the design includes a large number of geometric elements, then this approach may also consume an excessive amount of memory and storage resources.

A useful function for EDA software is to identify and track "nets," which are sets of interconnected shapes in a design. The connected shapes may be on the same layer of a design or on different layers connected through vias. A first example operation that may be performed is "connectivity extraction", which extracts the nets that are present in an IC design. In this operation, a list of nets, e.g., in a netlist, may not exist or may not be reliable, and a new list is created to identify the nets in the design. A second example operation that may be performed is "connectivity verification", in which a netlist already exists and the operation is intended to verify/update the accuracy and/or completeness of the nets identified in the netlist.

In traditional EDA systems, these operations for identifying and tracking nets require the IC design to be a flat design. In part, this is because traditional approaches need the design to be flat to allow efficient identification of shapes that geometrically overlap with each other. If the design is originally in a hierarchical format, then the design must be flattened/unfolded before performing the operations to extract or verify the sets of connected shapes. While iterating through the collection of unfolded shapes in the design, "islands" of shapes are tracked and merged together when shapes are identified that short to other shapes or to other islands. At the end of the process, each island of connected shapes is considered a separate net. One possible drawback of this traditional approach is that if the design includes a large number of geometric elements, then working with an unfolded design may also consume an excessive amount of memory and storage resources to store numerous copies of the exact same design elements/shapes, which could negatively affect the performance and usability of the system. Moreover, if the design is originally in a hierarchical format, then the process of flattening the entire design could itself be excessively expensive and delay the overall results.

Therefore, it is desirable to implement an improved method and mechanism for identifying and verifying connectivity in the hierarchical design for an integrated circuit that address these drawbacks of the traditional approaches. In particular, it is desirable to have a method and mechanism for identifying and verifying connectivity in a hierarchical design which do not require the hierarchical design to be fully flattened.

SUMMARY

A method and system is provided for identifying and tracking nets in a hierarchical design without requiring the hierarchical design to be flattened. To identify sets of connected shapes, instead of having to unfold the entire design hierarchy, only the specific instances of shapes falling within the geometric bounds of shapes identified as being part of a net needs to be unfolded to perform the search. When composing the list of nets for a hierarchical design, the unfolded shapes at other hierarchical levels of the design can be derived based upon virtual terminal structures that implicitly references nets and objects at other levels. In one embodiment, the hierarchical design is structured to have multiple layers includes, for each layer, storing a plurality of shape occurrences for the layer, in which a hierarchy of shape instances has a plurality of levels. Each shape instance corresponds to one of the shape occurrences. A hierarchy of shadow instances has a plurality of levels.

Other and additional objects, features, and advantages of the invention are described in the detailed description, figures, and claims.

BRIEF DESCRIPTION OF THE DRAWINGS

The drawings illustrate the design and utility of embodiments of the present invention, in which similar elements are referred to by common reference numerals. In order to better appreciate the advantages and objects of a preferred embodiment, reference should be made to the accompanying drawings that illustrate this preferred embodiment. However, the drawings depict only one embodiment of the invention, and should not be taken as limiting its scope.

FIGS. 3A-B illustrate examples of information stored in a shape tree according to one embodiment of the invention.

FIGS. 15a-c, 16a-c, and 17a-d illustrate an example process for connectivity extraction according to an embodiment of the invention.

FIGS. 21a-d illustrate an example process for updating connectivity according to an embodiment of the invention.

FIGS. 23a-e illustrate an example process for updating connectivity according to an embodiment of the invention.

DETAILED DESCRIPTION

The present invention is directed to a method and mechanism for identifying and tracking nets in an electrical design. In one embodiment, a hierarchical design does not have to be flattened to perform the operation of identifying and tracking nets. To identify sets of connected shapes, instead of having to unfold the entire design hierarchy, only the specific instances of shapes falling within the geometric bounds of shapes identified as being part of a net needs to be unfolded to perform the search. When composing the list of nets for a hierarchical design, the unfolded shapes at other hierarchical levels of the design can be derived based upon virtual terminal structures that implicitly references nets and objects at other levels. In one embodiment, the hierarchical design is structured to have multiple layers includes, for each layer, storing a plurality of shape occurrences for the layer, in which a hierarchy of shape instances has a plurality of levels. Each shape instance corresponds to one of the shape occurrences. A hierarchy of shadow instances has a plurality of levels.

Shape Abstraction

It is useful at this point to describe an example approach for storing and processing a hierarchical structure for an electrical design. This example hierarchical approach will be used later to illustrate the disclosed embodiment of the method and mechanism for extracting and tracking connectivity in a design. It is noted, however, that the described approach for identifying and tracking connectivity in a design may be employed with many hierarchical formats, and thus is not to be limited to the specific hierarchical format described in this section.

In one embodiment, the hierarchical format comprises a set of structures (referred to herein as "shape abstraction data structures") in which a hierarchical design structure is maintained but which provides many advantages of a flattened design. In this embodiment, the shape abstraction data structures store geometric information for shapes in each layer of the design and track the boundaries of shape instances ("shadows") at each layer. The shapes are tracked for each occurrence for each layer of the design. Any suitable data structure may be employed to track the shapes, e.g., using a tree structure, list structure, etc. As used herein, the term "shape tree" refers to a data structure for tracking the shapes on a layer for an occurrence.

Figure 1A:
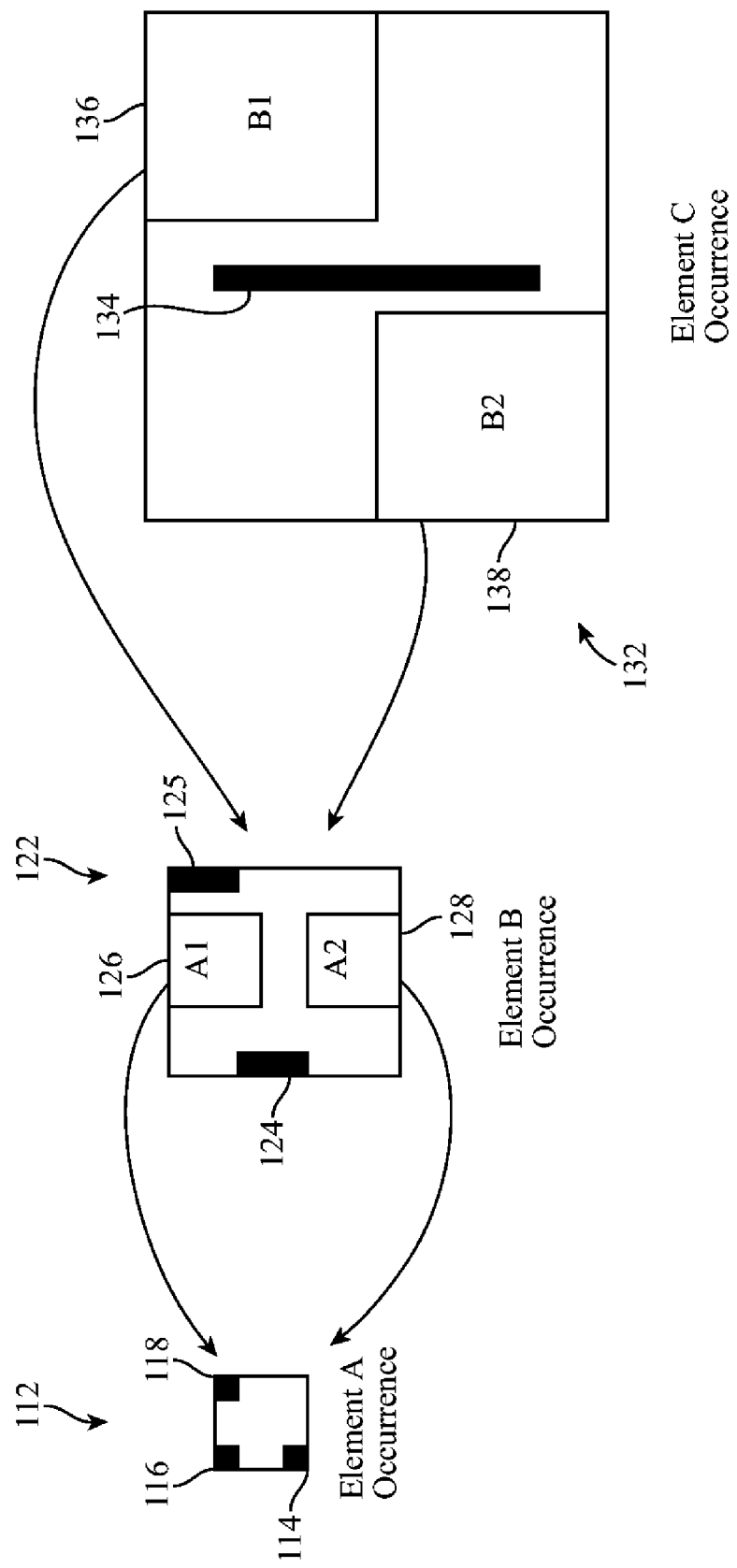
FIG. 1A-C shows an example design hierarchy.
Figure 1B:
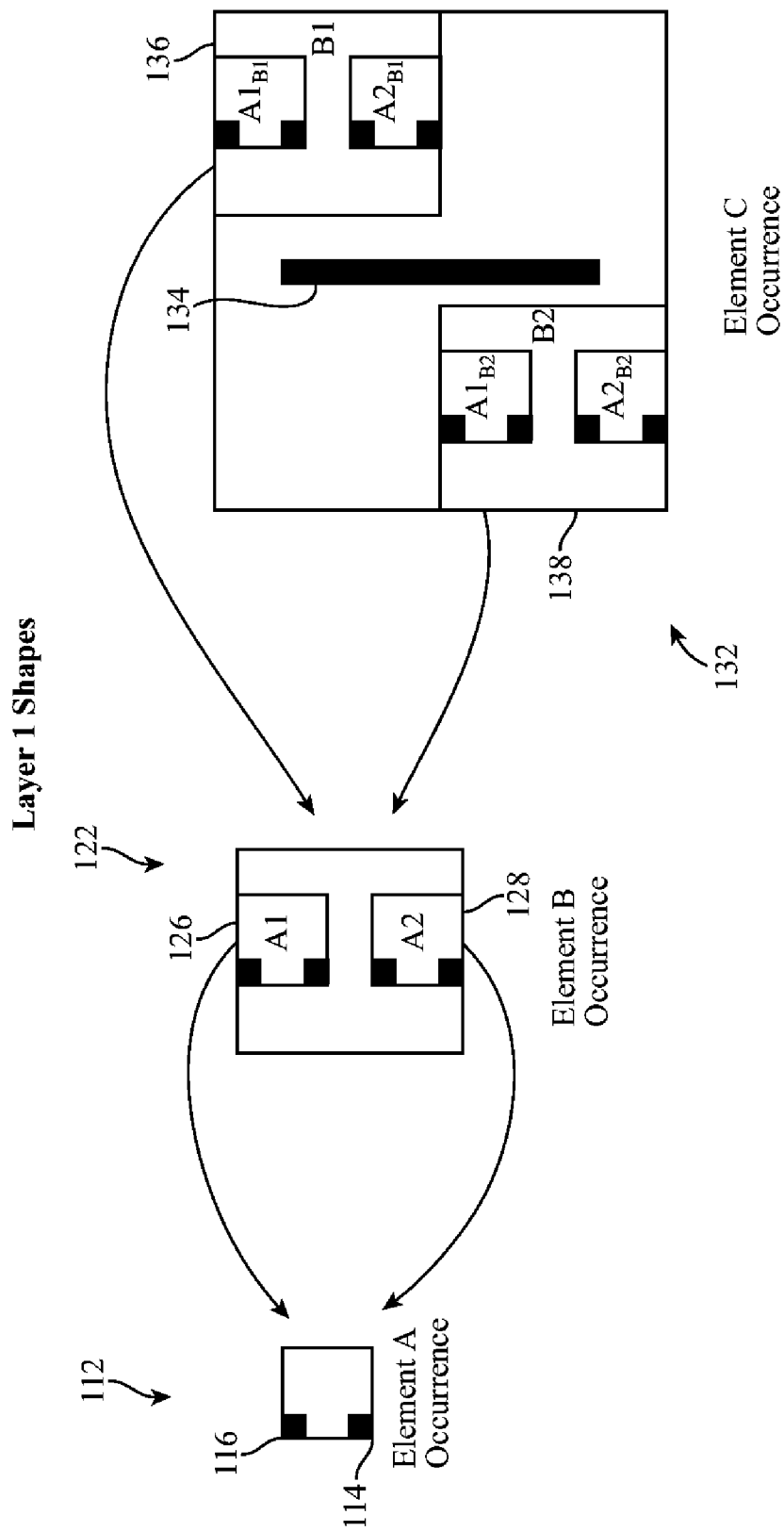
Figure 1C:
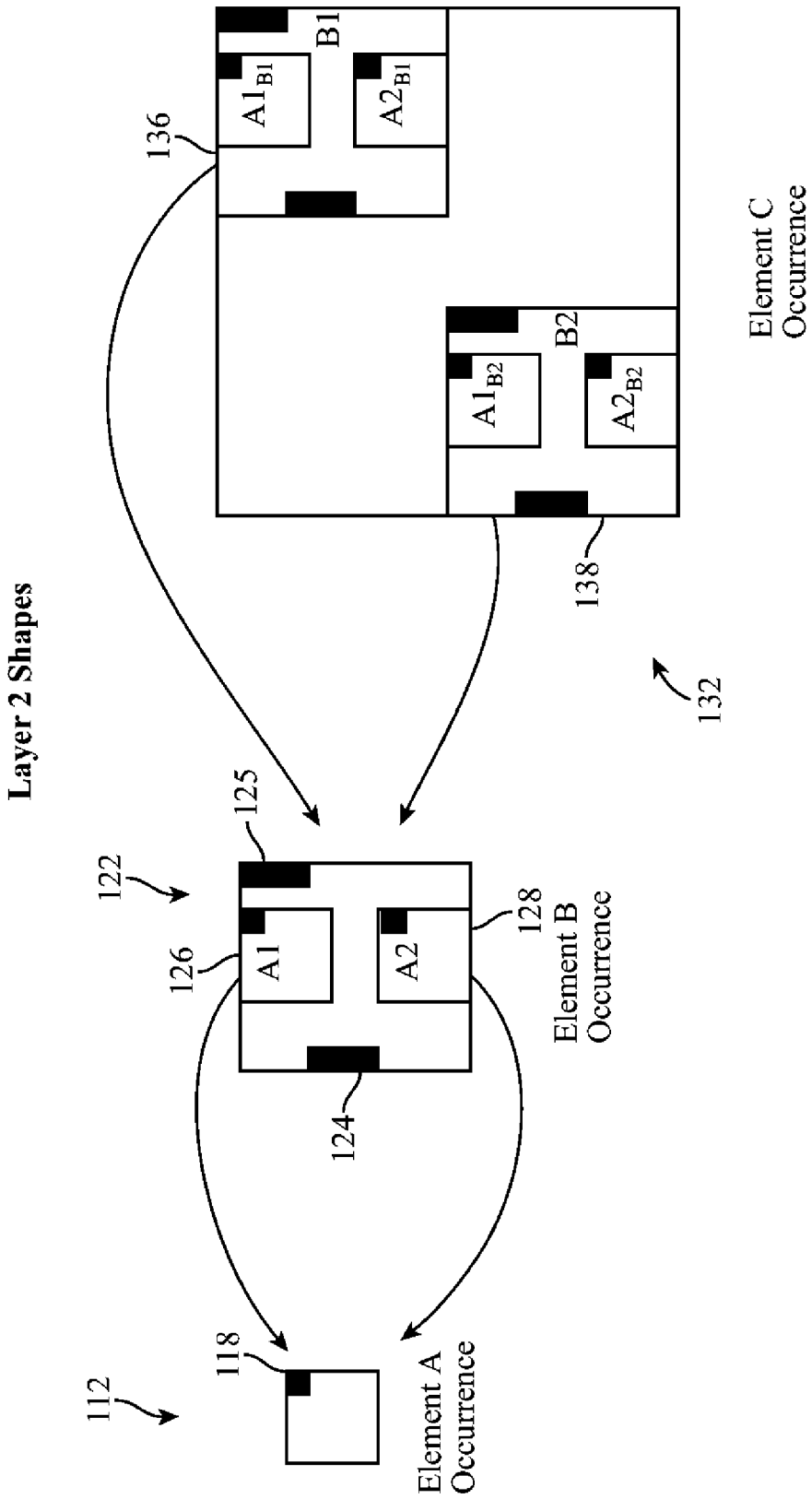
Figure 2:
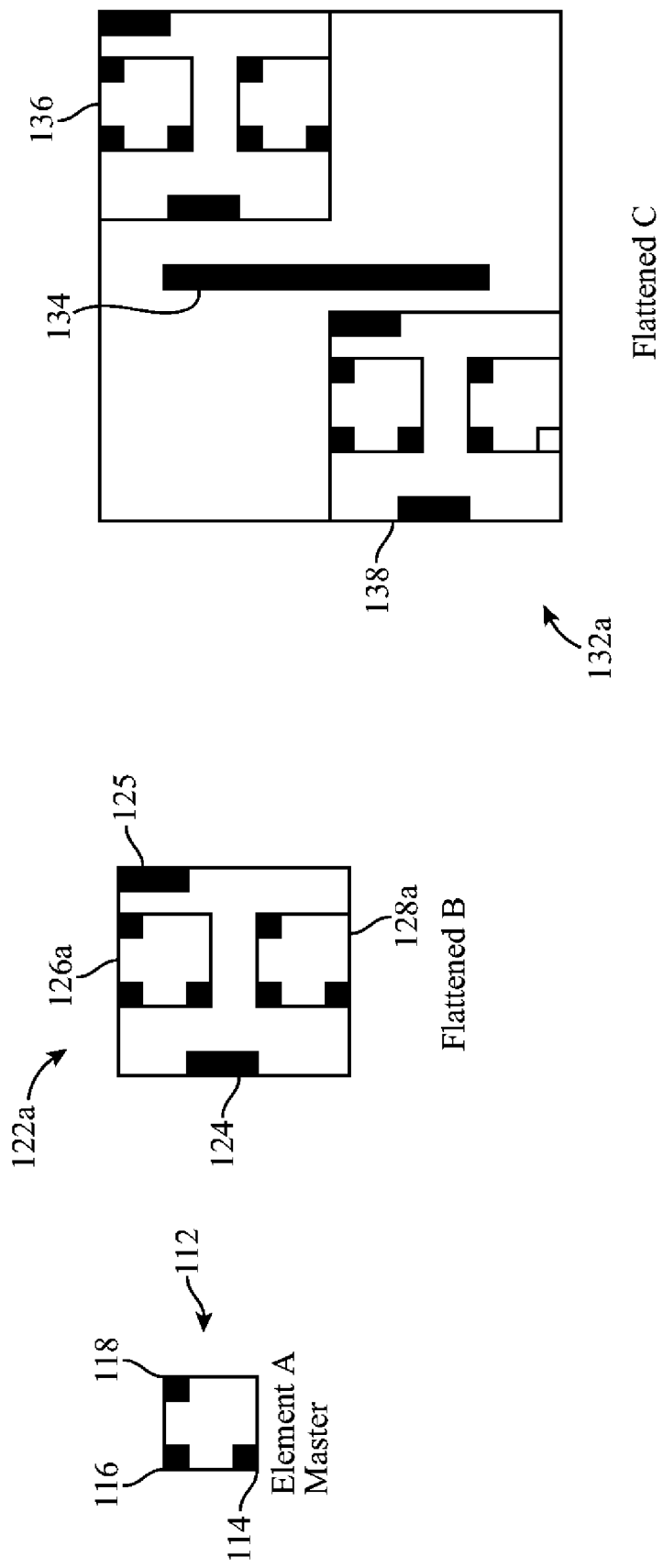
FIG. 2 shows an example of a flattened design hierarchy.

To illustrate and explain the present approach, reference will be made to the design hierarchy of FIG. 1A. Recall that FIG. 1A shows an example design hierarchy, in which an occurrence 112 of element A comprises three shapes 114, 116, and 118. At a different level in the IC design, an occurrence 122 of element B may be created that includes its own shapes 124 and 125, as well as two instances 126 and 128 of element A. At yet another level of the IC design, an occurrence 132 for element C may be created that includes a shape 134 as well as two instances 136 and 138 of element B. It is assumed that shapes 114, 116, and 134 are on layer 1 of the design and shapes 118, 124, and 125 are on layer 2 of the design. FIG. 1B shows the shapes that would be present on layer 1 for these portions of the design and FIG. 1C shows the shapes that would be present on layer 2. Each instance in the instance hierarchy points to a master data structure of the corresponding occurrence for the shape. The master data structure contains data, such as the bounds for the shape.

A first set of structures in the shape abstraction data structures is referred to herein as the shape trees, which track the native shapes on each layer for each geometric element. In the present embodiment, a separate shape tree is maintained for each occurrence for each layer. However, as is evident to those skilled in the art, other organizations of the data can also be used to implement the shape trees.

FIG. 3A illustrates the contents of the shape trees for layer 1 of the design hierarchy of FIG. 1A. Shape tree 312a tracks the shapes on layer 1 for element A, illustrating that element A includes shapes 114 and 116 on layer 1 at the indicated locations. Shape tree 322a tracks the shapes on layer 1 for element B, illustrating that element B does not have any native shapes on layer 1. Shape tree 332a tracks the shapes on layer 1 for element C, illustrating that element C includes a shape 134 on layer 1 at the indicated location.

FIG. 3B illustrates the contents of the shape trees for layer 2 of the design hierarchy of FIG. 1A. Shape tree 312b tracks the shapes on layer 2 for element A, illustrating that element A includes shape 118 on layer 2 at the indicated location. Shape tree 322b tracks the shapes on Another set of structures (referred to herein as "shadow trees") is maintained to track the boundaries of the shape for instances ("shadows") at each layer. Each instance refers to a master structure that may include one or more shapes on one or more layers of the design. The shadow trees provide a structure that tracks the identity and location for the boundaries of the shapes referred to by instances in the design. Any suitable data structure may be used to track the information in the shadow trees, such as tree structures and list strictures. In the present embodiment, a separate shadow tree is maintained for each occurrence for each layer. However, as is evident to those skilled in the art, other organizations of the data can also be used to implement the shadow trees.

The shadow tree for an occurrence on a layer is determined by identifying a "shadow" for shapes in the appropriate layer for the top-level instances in the element. Each top-level instance having shapes at the appropriate layer is associated with its own shadow. Each top-level instance may have its own nested instances. The boundary of the shadow for the instance is determined by performing a union of the coverage area for all shapes at the appropriate layer for that top-level instance with the coverage area of shapes at the layer in its nested instances.

Figure 4:
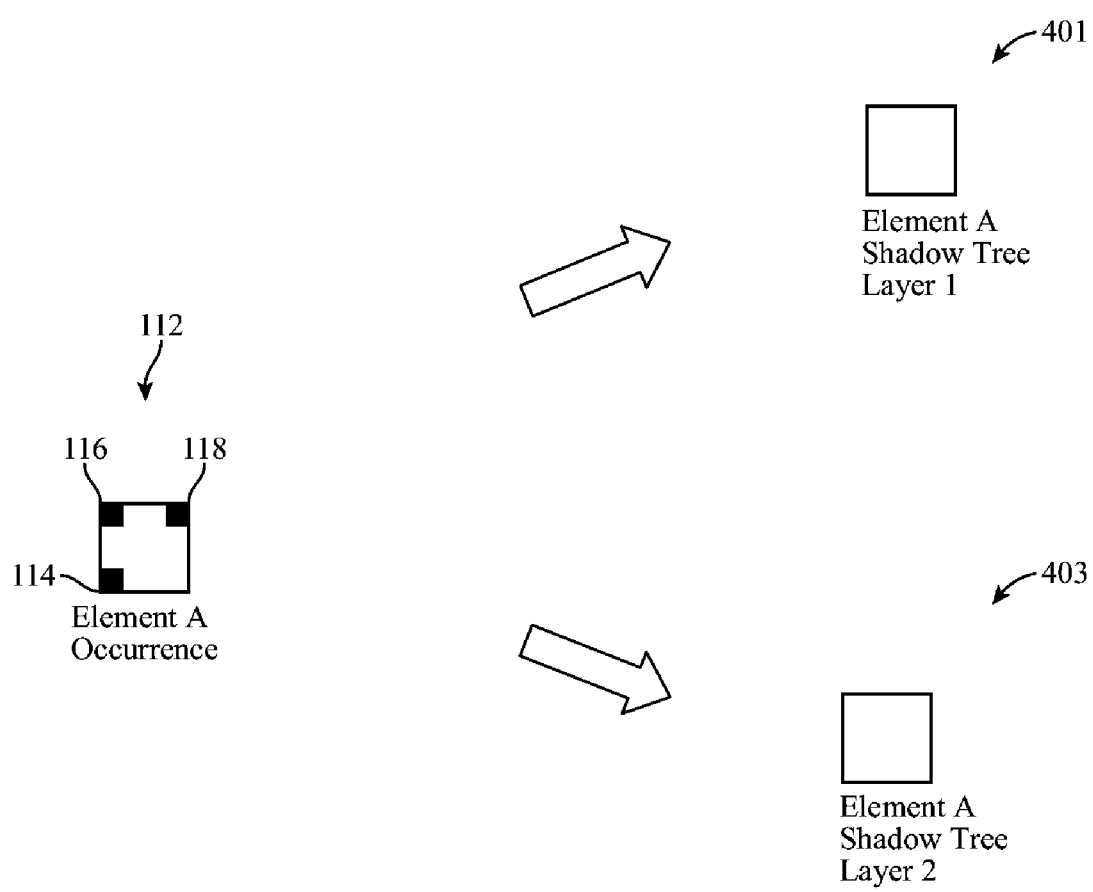
FIGS. 4, 5A-C, and 6A-C illustrate an embodiment of a process for determining shadow boundaries and shadow trees.

Referring to FIG. 4, shown are the contents of shadow trees that may be created for element A. The shapes in instances for element A at layer 1 would be represented in a layer 1 shadow tree 401 and the shapes in instances A at layer 2 would be represented in a layer 2 shadow tree 403. Here, since element A does not contain any instances, there are no instance shadows, at either layer 1 or layer 2, to populate the shadow trees for element A. Therefore, no shadows exist in shadow trees 401 and 403 for element A.

Figure 5A:
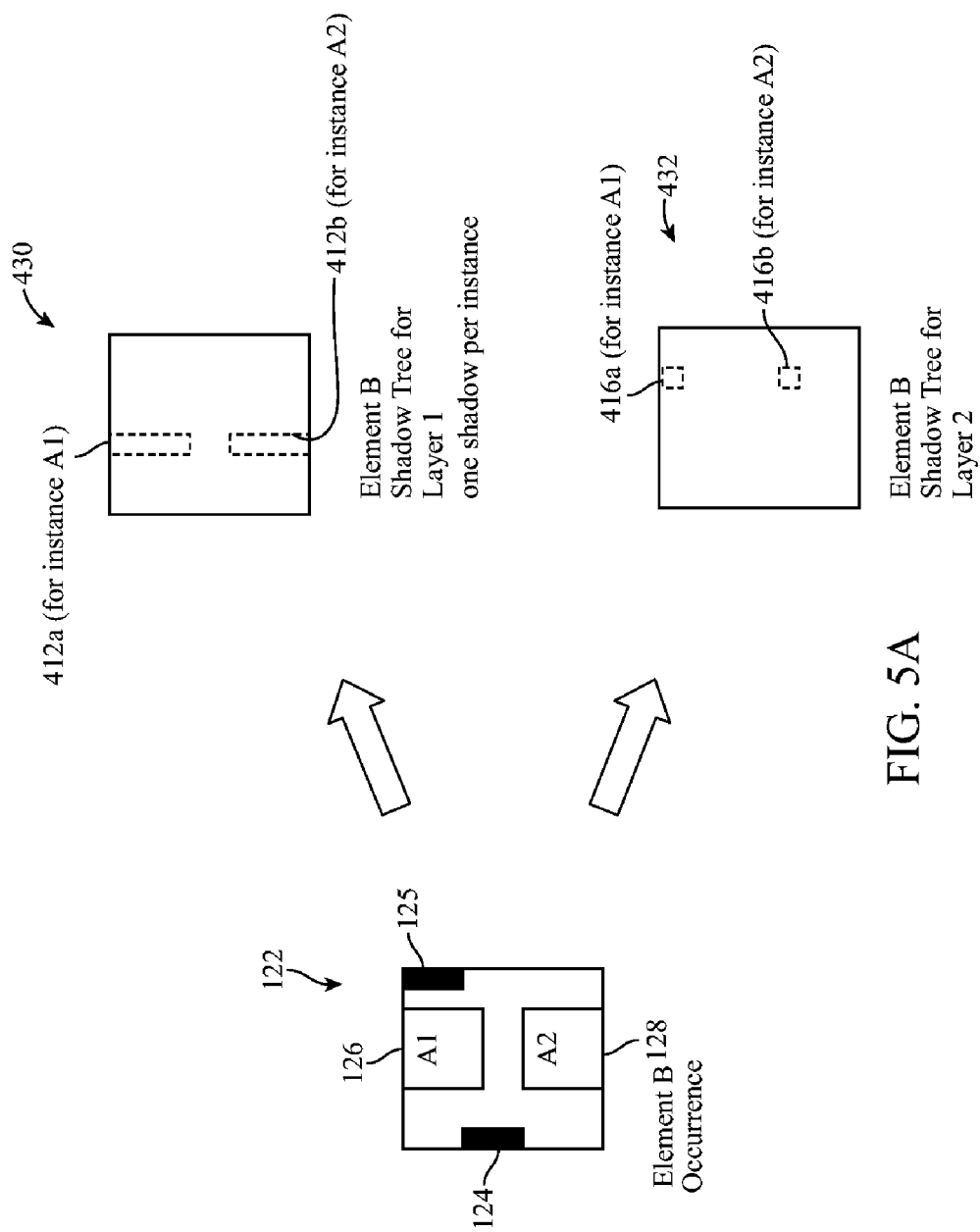

FIG. 5A illustrates the presently embodied process for forming shadow trees for occurrence 122 of element B. Occurrence 122 for element B includes two instances A1 126 and A2 128 of element A. The shadow trees for element B contain a shadow for each instance that contains shapes at the appropriate layer of the design. Each shadow tracks the boundaries of the shapes in the instance, and shapes in its nested instances, that exist on the appropriate layer of the design.

Shadow tree 430 tracks the boundaries of shapes on layer 1 for instances of element B. Here, shadow tree 430 contains a first shadow 412a corresponding to instance A1 and a second shadow 412b corresponding to instance A2.

Figure 5B:
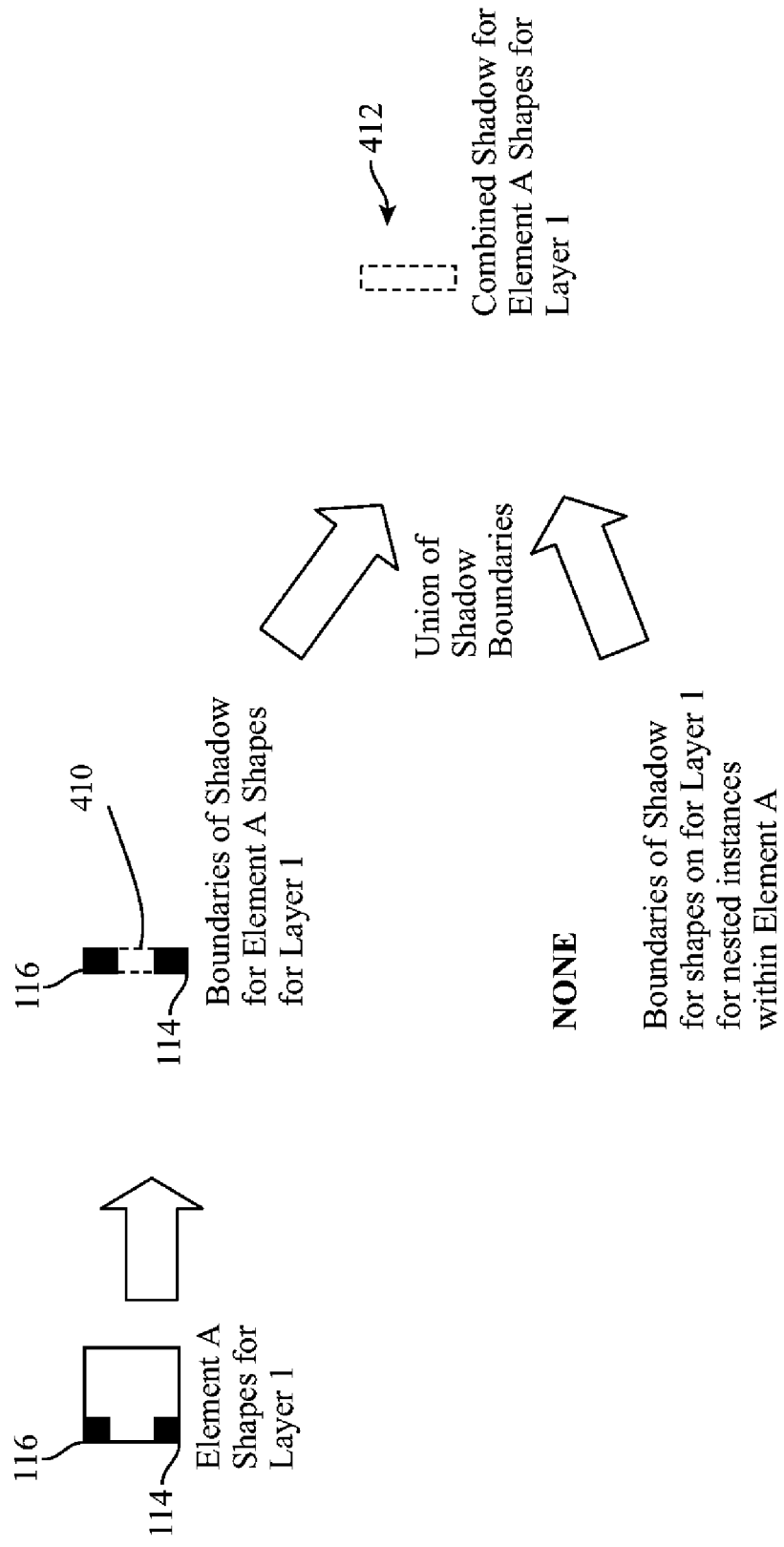

FIG. 5B illustrates an embodiment of a process for determining the boundaries and locations of the shadows 412a and 412b for the shapes of instances of element A at layer 2. The first action is to identify the native shapes for element A that exist on layer 1 of each instance. For this example, shapes 114 and 116 have been identified as being on layer 1 of element A (see FIG. 1B). A boundary is drawn around the identified shapes on the layer. In one embodiment, the boundary is a rectangle that is sized to fit around the boundary of all the identified shapes on the layer. Here, boundary 410 is a rectangular shape that matches and encompasses the outer boundaries of all the identified shapes 114 and 116 for element A on layer 1. Since shapes 114 and 116 are separated by a certain distance, the boundary 410 may encompass additional area within the geometric element. Next, identification is made of a boundary for all shapes for layer 1 within nested instances of element A. To identify the boundaries of the final shadow 412 for instances of element A, a union is performed between the boundary 410 of the native shapes in element A and the boundary of the shapes for nested instances within element A. Here, element A does not have any nested instances. Therefore, the coverage area and relative location of boundary 410 for the native shapes 114 and 116 in element A form the shadow 412 for element A on layer 1.

Shadow 412 is duplicated as shadow 412a in shadow tree 430 of FIG. 5A at a location relative to its positioning, within instance A1. In like manner, shadow 412 is also duplicated as shadow 412b in shadow tree 430 at a location relative to its positioning within instance A2.

Shadow tree 432 in FIG. 5A tracks the boundaries of shapes on layer 2 for instances of element B. Here, shadow tree 432 contains a first shadow 416a corresponding to instance A1 and a second shadow 416b corresponding to instance A2.

Figure 5C:
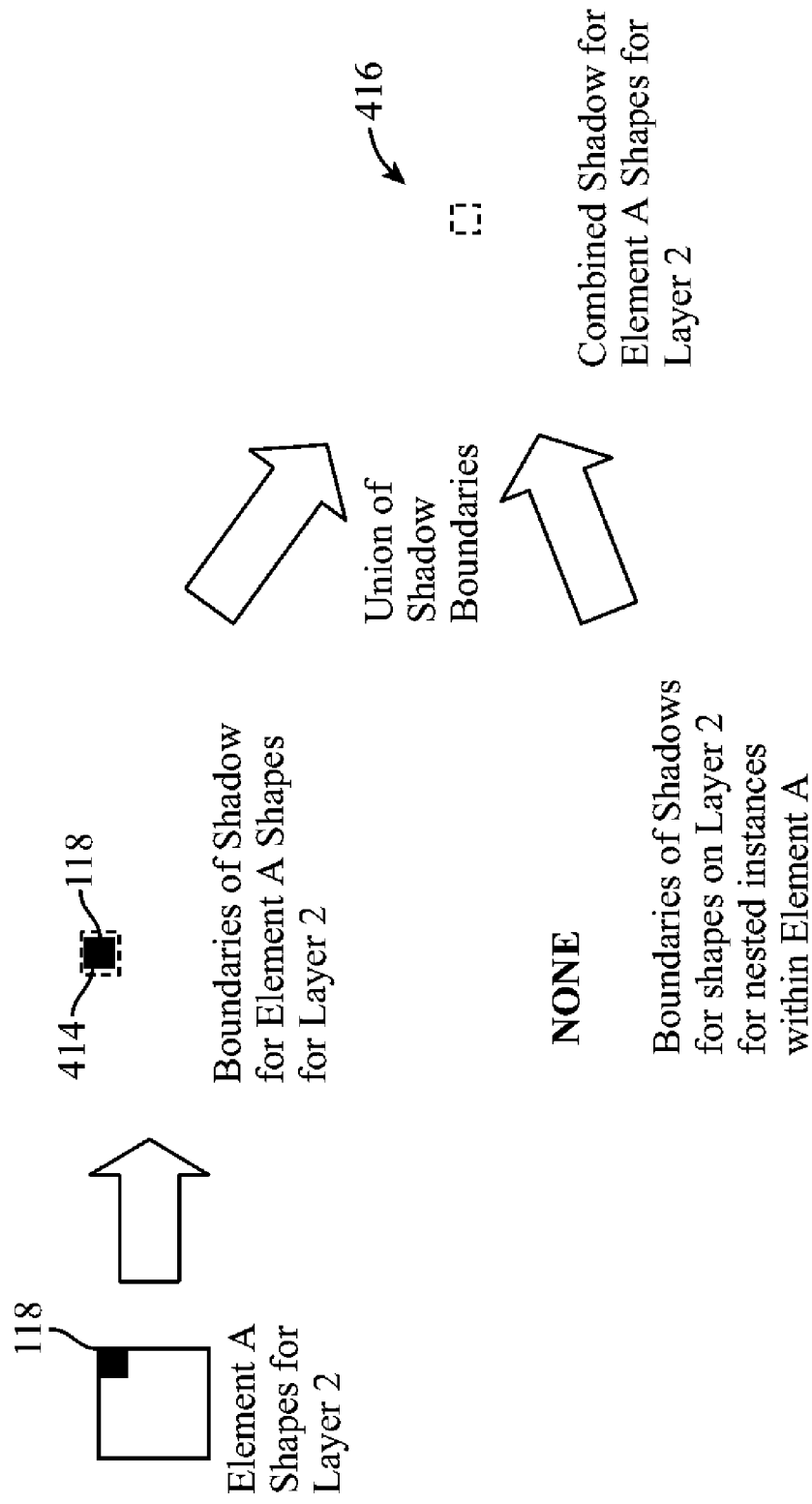

FIG. 5C illustrates an embodiment of a process for determining the boundaries and locations of the shadows 416a and 416b for the shapes of instances of element A at layer 2. The first action is to identify the native shapes for element A that exist on layer 2 of each instance A1 and A2. Here, only shape 118 of element A has been identified as being on layer 2 (See FIG. 1C). Therefore, the boundary 414 that is drawn around native shapes at the top-level instance (i.e., shape 118) exactly matches the dimensions and relative location for shape 118 within element A. Next, identification is made of the boundary for all shapes on layer 2 within nested instances in element A, which will be combined with boundary 414 to form shadow 416. Here, element A does not have any nested instances. Therefore, the coverage area and relative location of boundary 414 for shape 118 forms the shadow 416 for element A on layer 2.

Shadow 416 is duplicated as shadow 416a in shadow tree 432 of FIG. 5A at a location relative to its positioning within instance A1. In like manner, shadow 416 is also duplicated as shadow 416b in shadow tree 432 at a location relative to its positioning within instance A2.

Figure 6A:
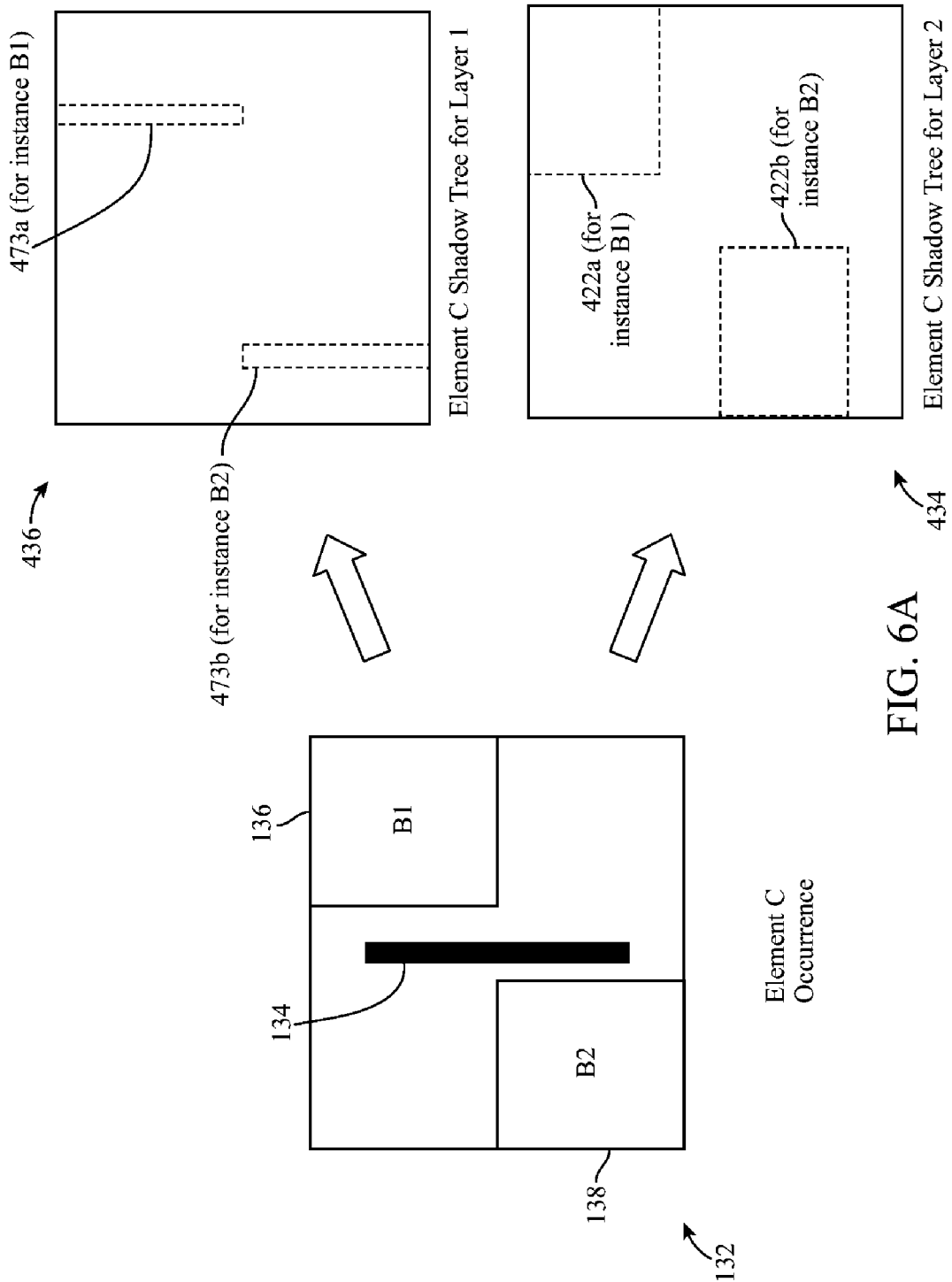

FIG. 6A illustrates the presently embodied process for forming shadow trees for occurrence 132 of element C. Occurrence 132 for element C includes two instances B1 136 and B2 138 of element B. The shadow trees for element C contain a shadow for each instance that contains shapes at the appropriate layer of the design. Each shadow tracks the boundaries of the shapes in the instance, and shapes in its nested instances, that exist on the appropriate layer of the design.

Shadow tree 436 tracks the boundaries of shapes on layer 1 for instances of element C. Here, shadow tree 436 contains a first shadow 473a corresponding to instance B1 and a second shadow 473b corresponding to instance B2.

Figure 6B:
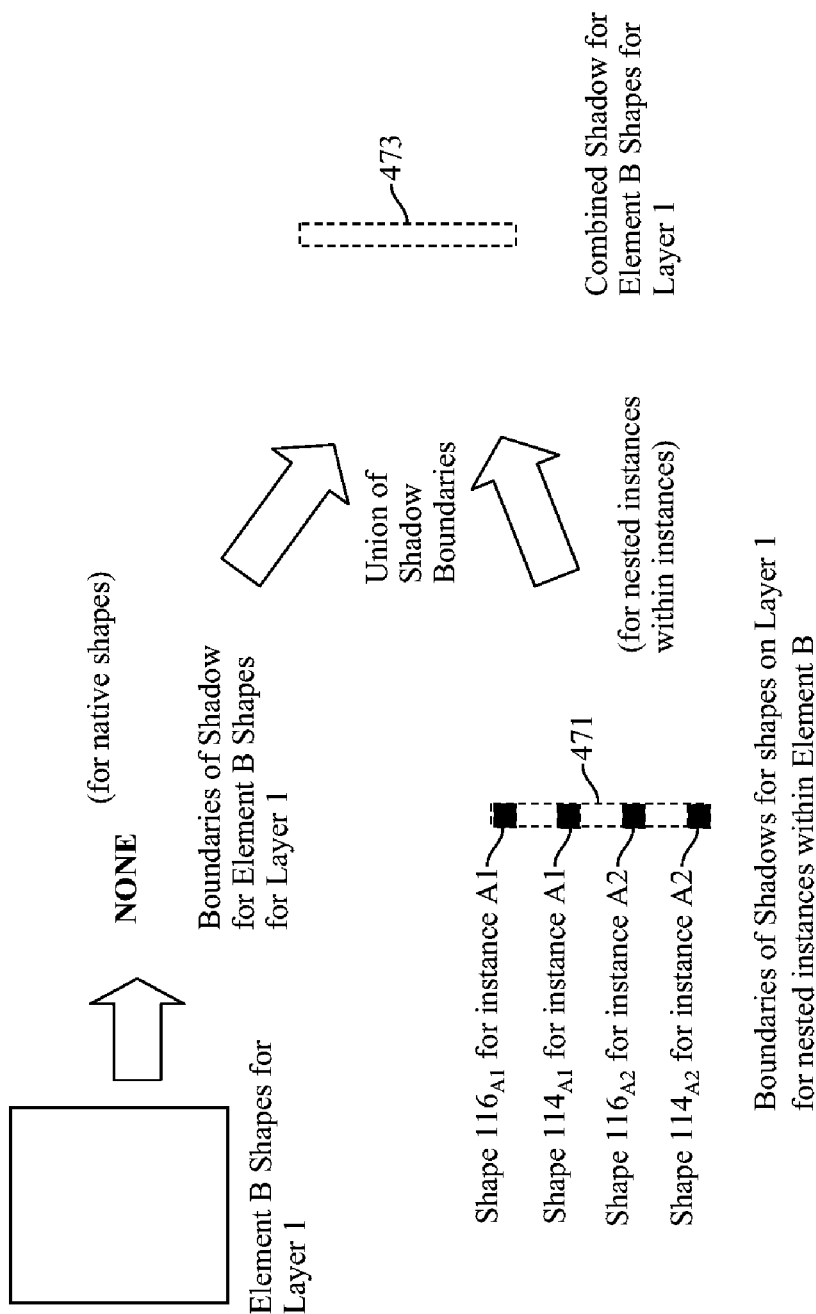

FIG. 6B illustrates an embodiment of a process for determining the boundaries and locations of the shadows 473a and 473b for the shapes of instances of element B at layer 1. The first action is to identify the native shapes for element B that exist on layer 1 of each instance. In this example, there are no native shapes for instances of element B on layer 1 (See FIG. 1B). Therefore, a shadow does not exist for native shapes for instances of element B on layer 1. Next, identification is made of the boundary for shapes on layer 1 for nested instances within instances of element B. Here, element B includes two instances of element A (element A1 and A2). Each instance A1 and A2 includes a shape 114 and a shape 116 on layer 1. Therefore, a boundary 471 exists for all the shapes $114_{A1}$, $116_{A1}$, $114_{A2}$, and $116_{A2}$ for nested instances A1 and A2. As before, the boundary can be drawn as a rectangle that is sized to fit around the outer boundaries of all the identified shapes, even if the boundary includes open area between the shapes. The shadow 473 for layer 1 of element B is formed from a union of the boundary for the native shapes and the boundary 471 for the shapes at layer 1 of nested instances. Here, since element B does not have any shapes on layer 1, the coverage area and relative location of boundary 471 for the nested instances form the shadow 473 for element B on layer 1.

Shadow 473 is duplicated as shadow 473a in shadow tree 436 of FIG. 6A at a location relative to its positioning within instance B1. In like manner, shadow 473 is also duplicated as shadow 473b in shadow tree 436 at a location relative to its positioning within instance B2.

Shadow tree 434 tracks the boundaries of shapes on layer 2 for instances of element C. Here, shadow tree 434 contains a first shadow 422a corresponding to instance B1 and a second shadow 422b corresponding to instance B2.

Figure 6C:
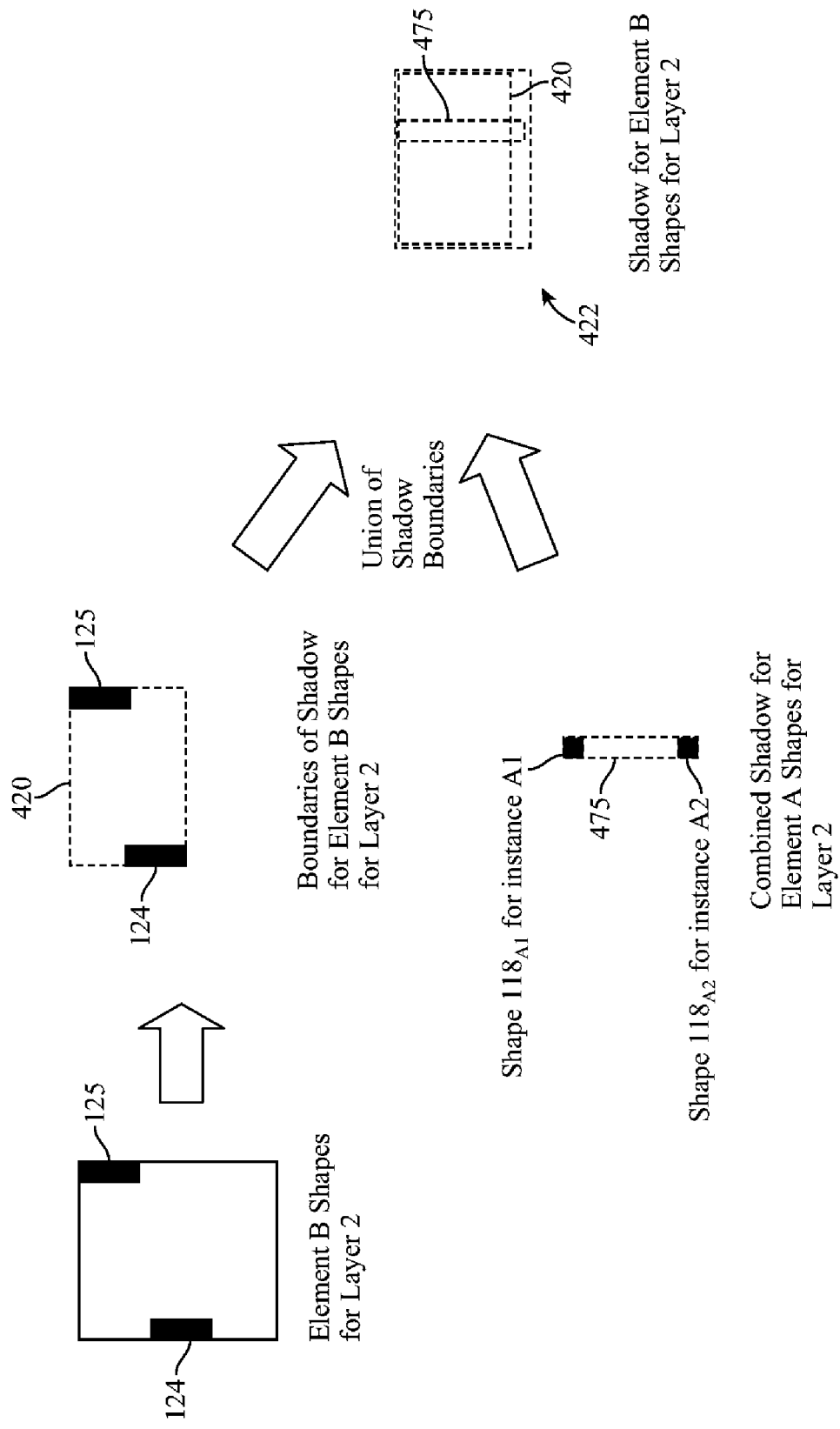

FIG. 6C illustrates an embodiment of a process for determining the boundaries and locations of the shadows 422a and 422b for the shapes of instances of element B at layer 2. The first action is to identify the native shapes for element B that exist on layer 2 of each instance B1 and B2. Shapes 124 and 125 have been identified as natively being on layer 2 of instances of element B. A boundary 420 is drawn around the identified shapes 124 and 125 on the layer. Here, boundary 420 is a rectangular shape that matches and encompasses the outer boundaries of all the identified shapes 124 and 125 for element B on layer 2. Since a distance separates shapes 124 and 125, the boundary 420 encompasses additional area within the geometric elements of the two shapes.

Next, identification is made of the boundary for shapes on layer 2 for nested instances within element B. Here, element B includes two instances of element A (element A1 and A2). Each instance A1 and A2 includes a shape 118 on layer 2. Therefore, a shadow boundary 475 exists surrounding the outer boundaries of shapes $118_{A1}$ and $118_{A2}$ for nested instances A1 and A2.

The shadow 422 for layer 2 shapes of element B is defined from a union of the boundary 420 for the native shapes and the boundary 475 for the shapes of nested instances within layer 2. As before, the boundary can be drawn as a rectangle that is sized to fit around the outer boundaries of all the identified shapes, even if the boundary includes open area between or around the shapes. Shadow 422 is duplicated as shadow 422a in shadow tree 434 of FIG. 6A at a location relative to its positioning within instance B1. In like manner, shadow 422 is also duplicated as shadow 422b in shadow tree 434 at a location relative to its positioning within instance B2.

Figure 7:
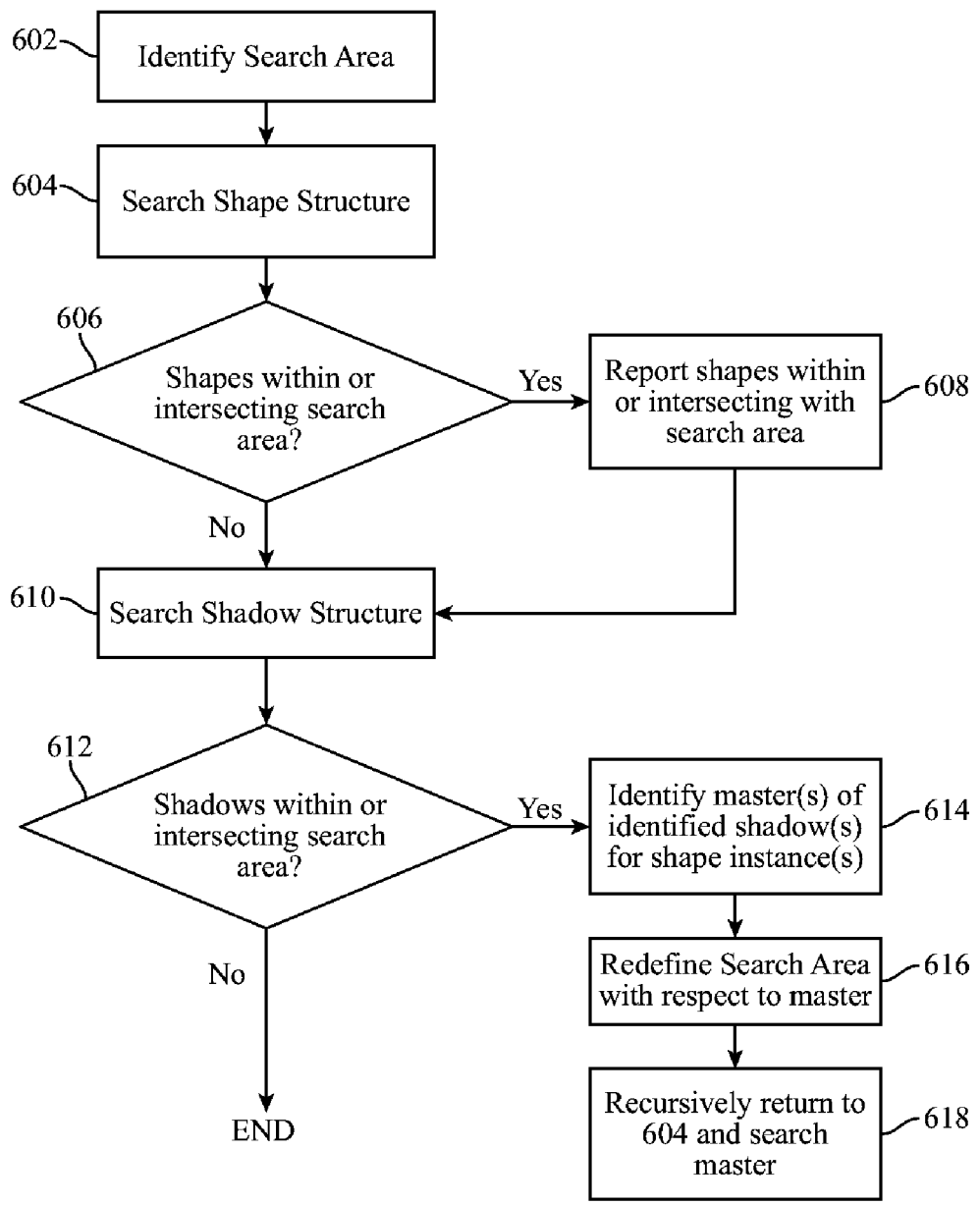
FIG. 7 is a flowchart of a process for searching an area of a layer of a design according to an embodiment of the invention.

FIG. 7 shows a flowchart of an embodiment of a method to identify or search for objects within a layer of a design when using the disclosed shape abstraction data structures. A desired region or area of a given layer to be searched is defined (602). Shapes within or intersecting with the search area on the desired level are identified. In one approach, this is performed by searching the appropriate shape tree for the object or area being searched (604). A determination is made whether any shapes exist within or intersect with the search area (606). If so, then the identified shapes are reported as being within the search area (608). One exemplary approach for identifying geometric objects within a given search area is described in co-pending U.S. application Ser. No. 10/342,823, entitled, "Zone Tree Method and Mechanism", filed on Jan. 14, 2003, which is hereby incorporated by reference in its entirety.

Next, the shapes for instances within the search area are identified. In one approach, this is performed by searching the appropriate shadow tree for the object or area being searched (610). A determination is made whether any shadows exist within or intersect with the search area (612). If so, then identification is made of the master structure(s) for the identified shadow(s) (614). The search area is re-defined to cover the corresponding portions of each identified master structure (616). For each identified master, the process recursively returns back to 604 to identify shapes associated within the re-defined search area of the master (618).

Figure 8A:
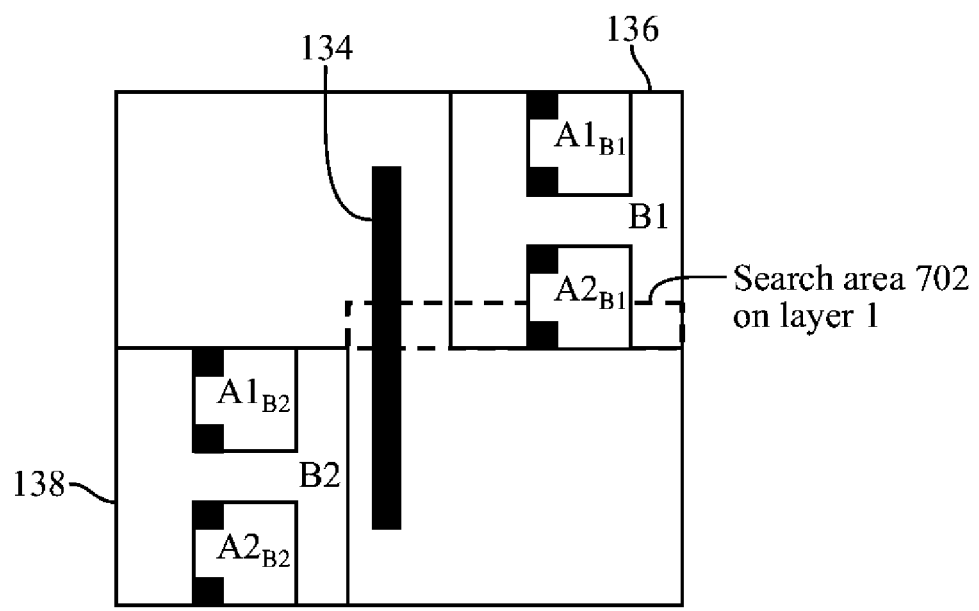
FIGS. 8A-G and 9A-C illustrate an example process for searching an area of a layer of a design according to an embodiment of the invention.
Figure 8A:
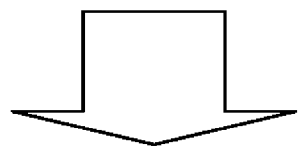
Figure 8B:
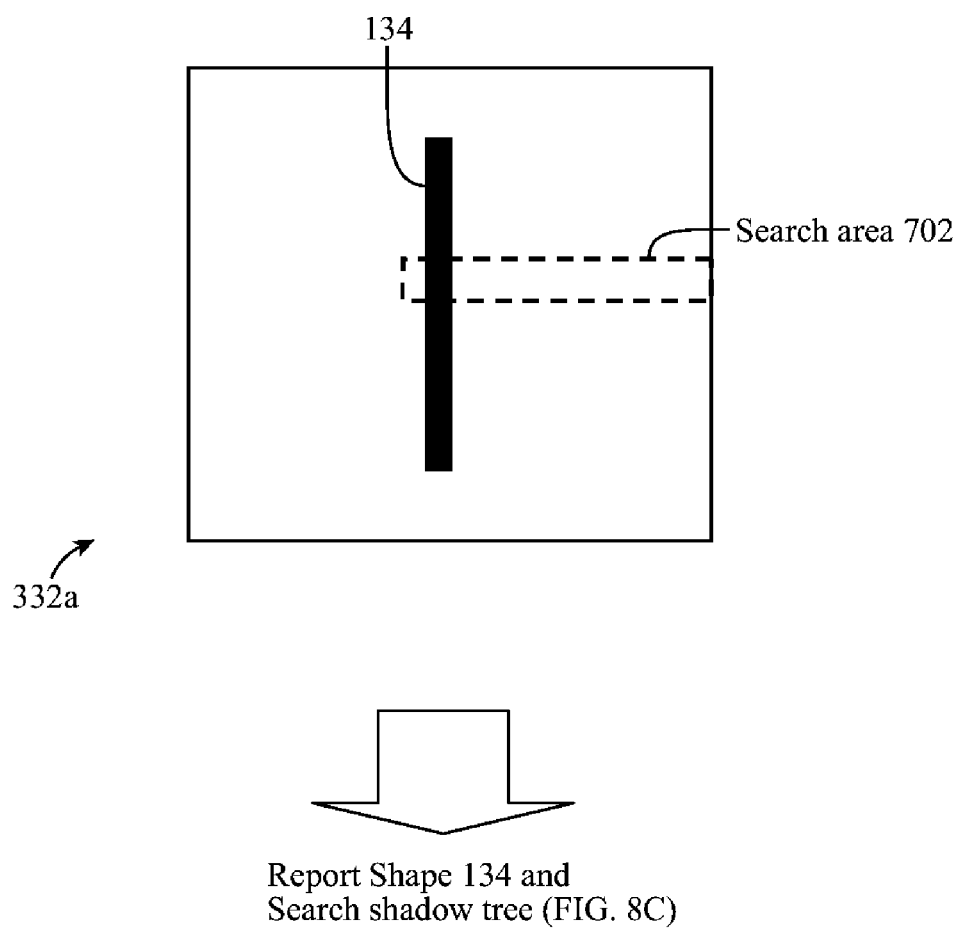

FIGS. 8A-G illustrate an example of this process for identifying objects within a search area. FIG. 8A shows a search area 702 that has been defined for layer 1 to search for shapes within element C. A search of the shape tree is performed. To depict a search of the shape tree, FIG. 8B shows the search area 702 overlaid on the shape tree 332a (FIG. 3A) for layer 1 of element C. Here, it can be seen that shape 134 intersects with the boundaries of search area 702. Therefore, the process reports shape 134 as being within/intersecting with the search area.

Figure 8C:
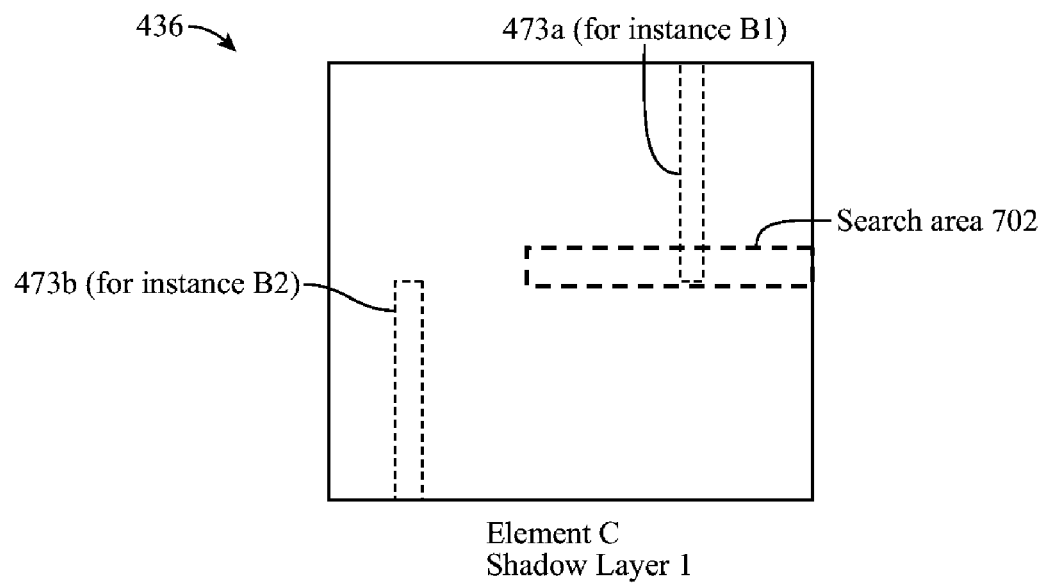
Figure 8C:
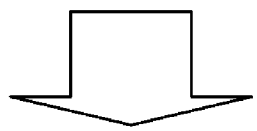

Next, the shadow tree is searched with respect to the search area 702. Referring to FIG. 8C, shown is the search area 702 overlaid onto the visualization of shadow tree 436 (FIG. 6A) for layer 1 of element C. Here, it can be seen that shadow 473a intersects with the boundaries of the search area 702.

The shadow 473a is identified as being associated with instance B1. Therefore, the next action is to transform the search area 702 relative to its corresponding portion of the master for instance B1, and then recursively perform a search for shapes within that re-defined search area 702a for the master structures for instance B1 at the appropriate layer.

Figure 8D:
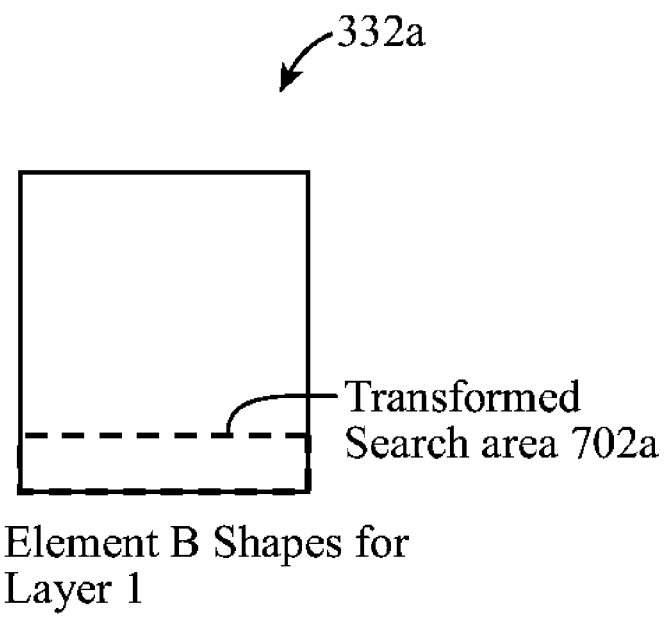
Figure 8D:
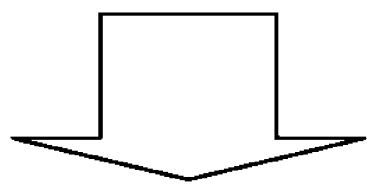

A search of the shape tree 322a (FIG. 3A) for the master of instance B1 is performed. To depict a search of the shape tree, FIG. 8D shows the re-defined search area 702a overlaid on the shape tree 322a for layer 1 of element B. Here, it can be seen that no shapes exist in the shape tree 322a for element B within tile re-defined search area 702a.

Figure 8E:
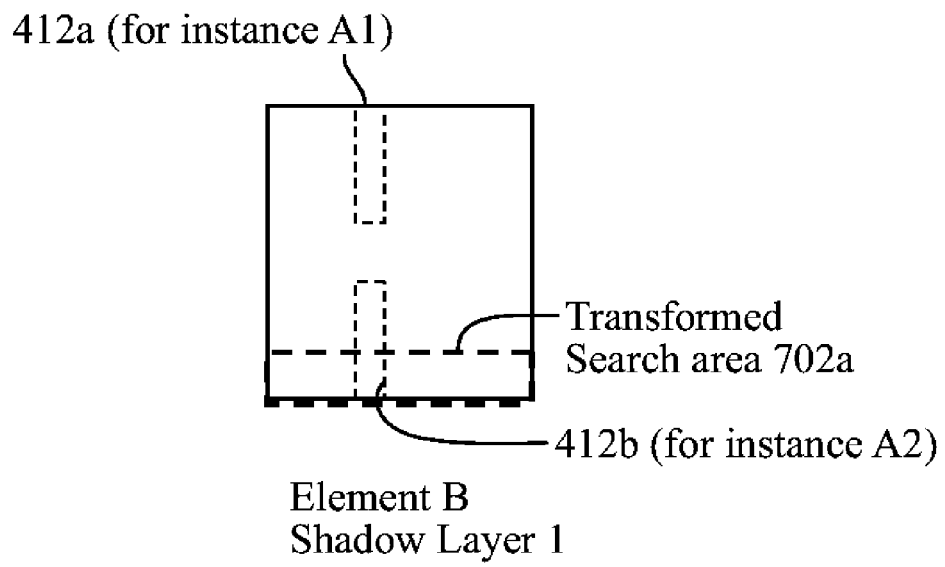
Figure 8E:
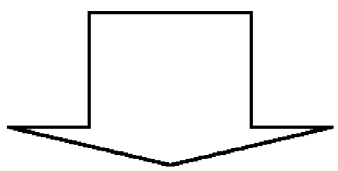

Next, the shadow tree for layer 1 of element B is searched with respect to the search area 702a. Referring to FIG. 8E, shown is the search area 702a overlaid onto the visualization of shadow tree 430 (FIG. 5A) for layer 1 of element B. Here, it can be seen that shadow 412b intersects with the boundaries of the search area 702a.

The shadow 412b is identified as being associated with instance A2 of element B. Therefore, the next action is to transform the search area 702a relative to its corresponding portion of the master for instance A2, and then recursively perform a search for shapes within that re-defined search area 702b for the master structures for instance A2 at the appropriate layer.

Figure 8F:
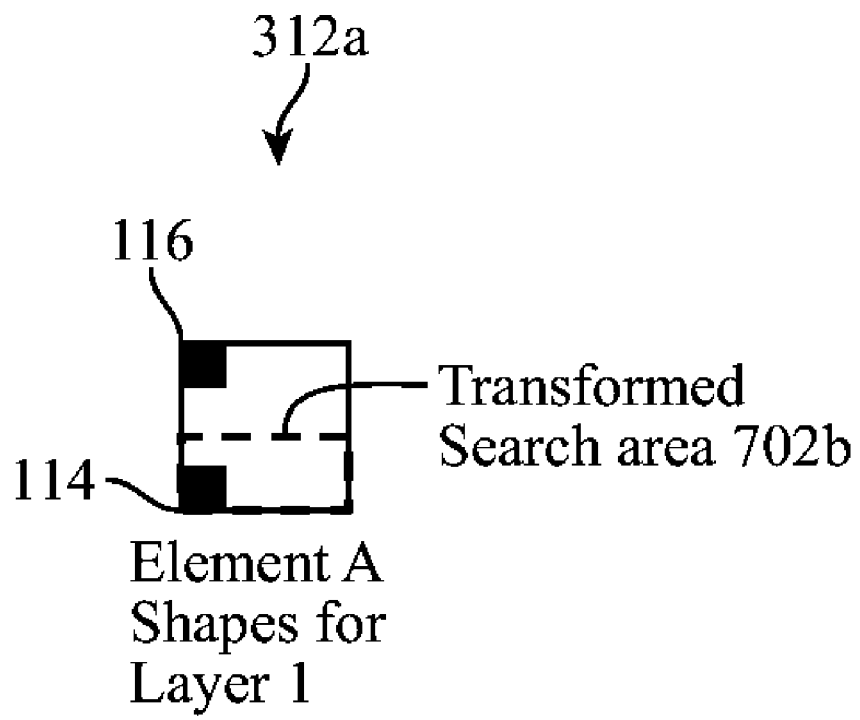
Figure 8F:
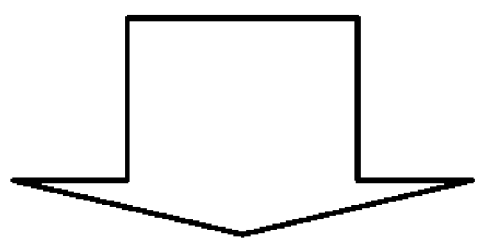

A search of the shape tree 312a (FIG. 3A) for the master of instance A2 is performed. To depict a search of the shape tree, FIG. 8F shows the re-defined search area 702b overlaid on the shape tree 312a for layer 1 of element A. Here, it can be seen that shape 114 falls within the boundaries of search area 702b. Therefore, the process reports shape 114 as being within/intersecting with the search area.

Figure 8G:
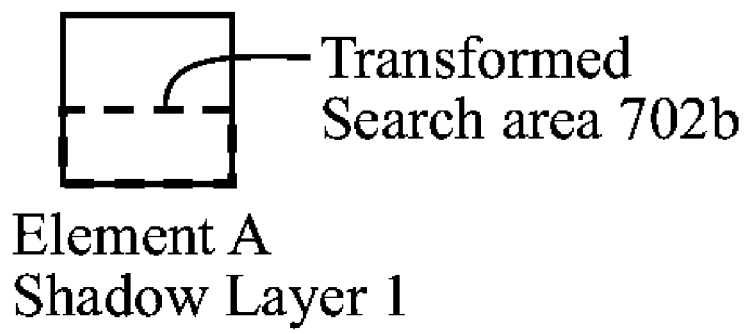

Next, the shadow tree for layer 1 of element A is searched with respect to the search area 702b. Referring to FIG. 8G, shown is the search area 702b overlaid onto the visualization of the shadow tree 401 (FIG. 4) for layer 1 of element B. Here, it can be seen that no shadows within shadow tree 401 intersect with the boundaries of the search area 702b. Therefore, the process ends unless additional recursive searches still need to be performed for shadows that have been previously identified.

Figure 9A:
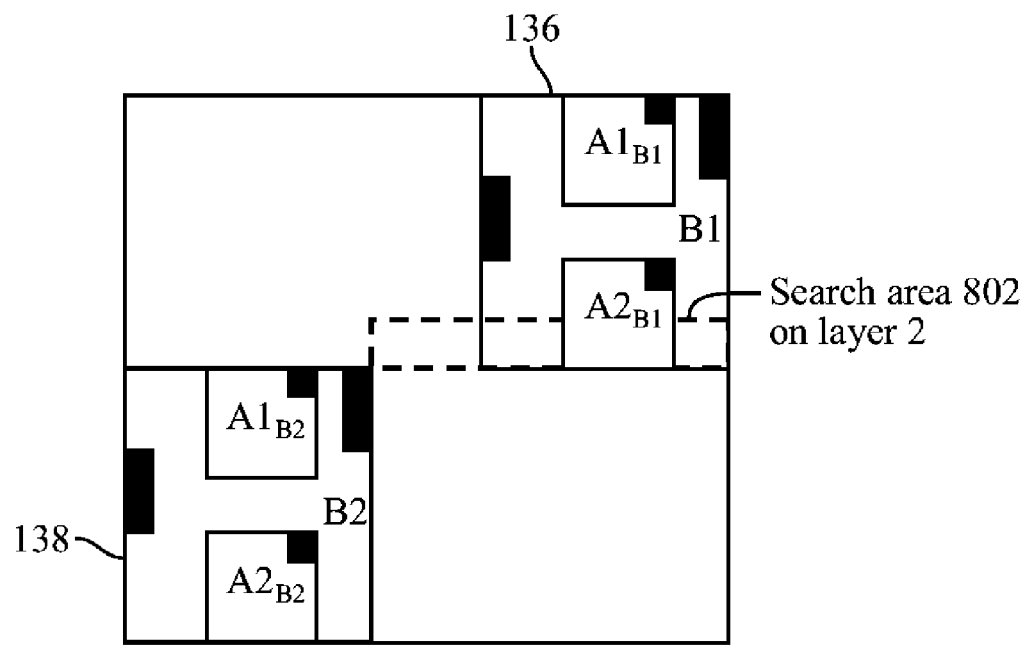
Figure 9A:
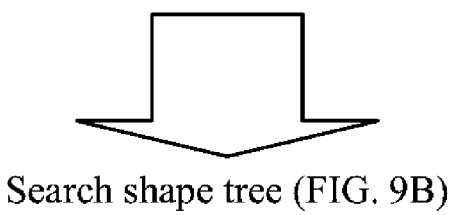
Figure 9B:
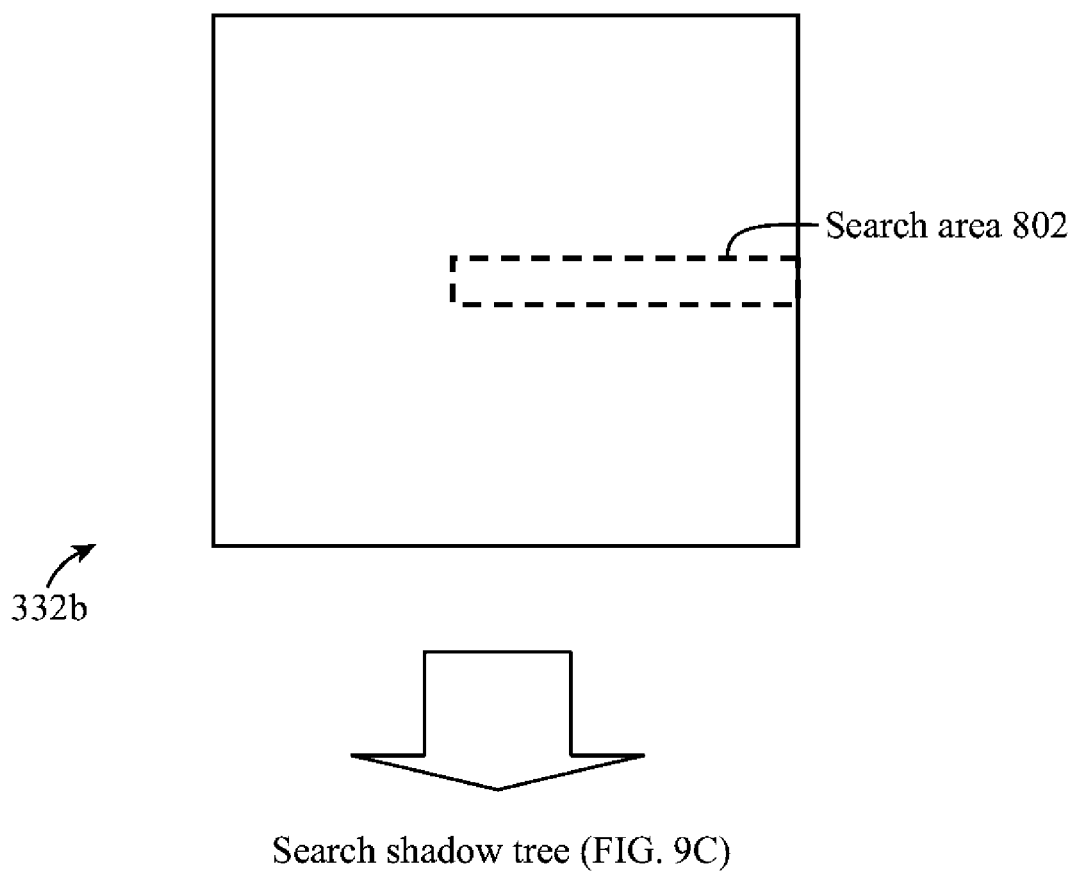

Next, assume that the search is for objects on layer 2 of geometric element C. FIG. 9A shows a search area 802 that has been defined for layer 2 to search for shapes within element C. A search of the appropriate shape tree is performed. To depict a search of the shape tree, FIG. 9B shows the search area 802 overlaid on the shape tree 332b (FIG. 3A) for layer 2 of element C. Here, it can be seen that the boundaries of search area 802 do not intersect any shapes within shape tree 332b. Therefore, the process does not report any shapes at this tine.

Figure 9C:
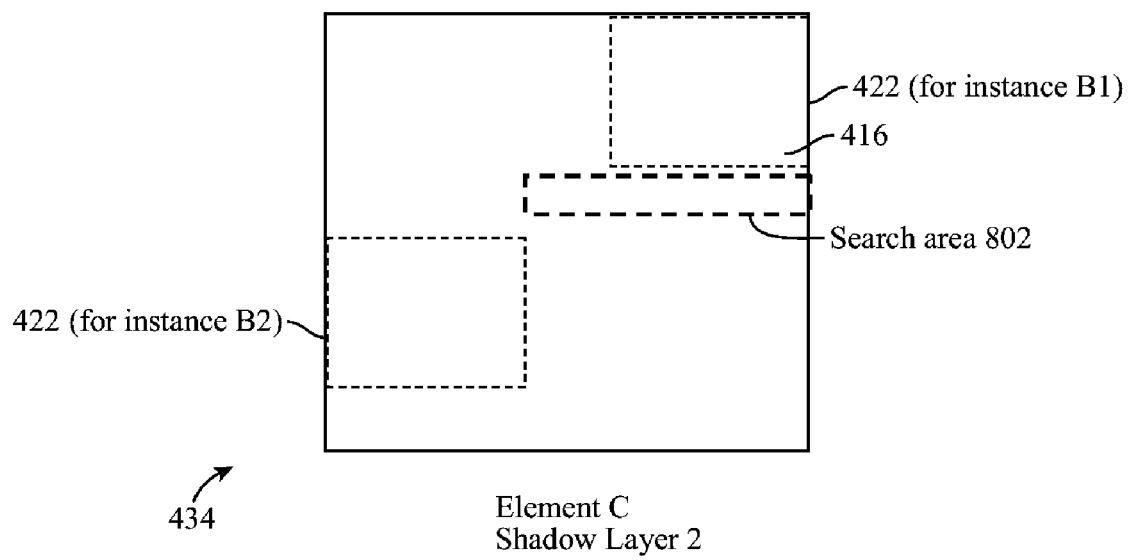

The shadow tree for layer 2 is then searched with respect to the search area 802. Referring to FIG. 9C, shown is the search area 802 overlaid onto a visualization of the shadow tree 434 (FIG. 6A) for layer 2 of element. Here, it can be seen that no shadows within shadow tree 434 fall within or intersect the boundaries of the search area 802. Therefore, no shapes are reported as being within the search area on layer 2.

Note that this search area over layer 2 of element C does not return any found objects, despite the fact that the search area actually encompasses a portion of instance B1 136 (as can be seen on FIG. 9A). Because the shadow tree is configured to track only the actual boundaries of shapes for instances on the specified layer, and no shapes exist within the search area on layer 2 of element C, the search does not return any found objects. This highlights a significant advantage of the present embodiment of the invention, which can greatly reduce unnecessary searching of hierarchical elements that do not have shapes in tile search area within the layer being searched.

Connectivity Extraction

Figure 10:
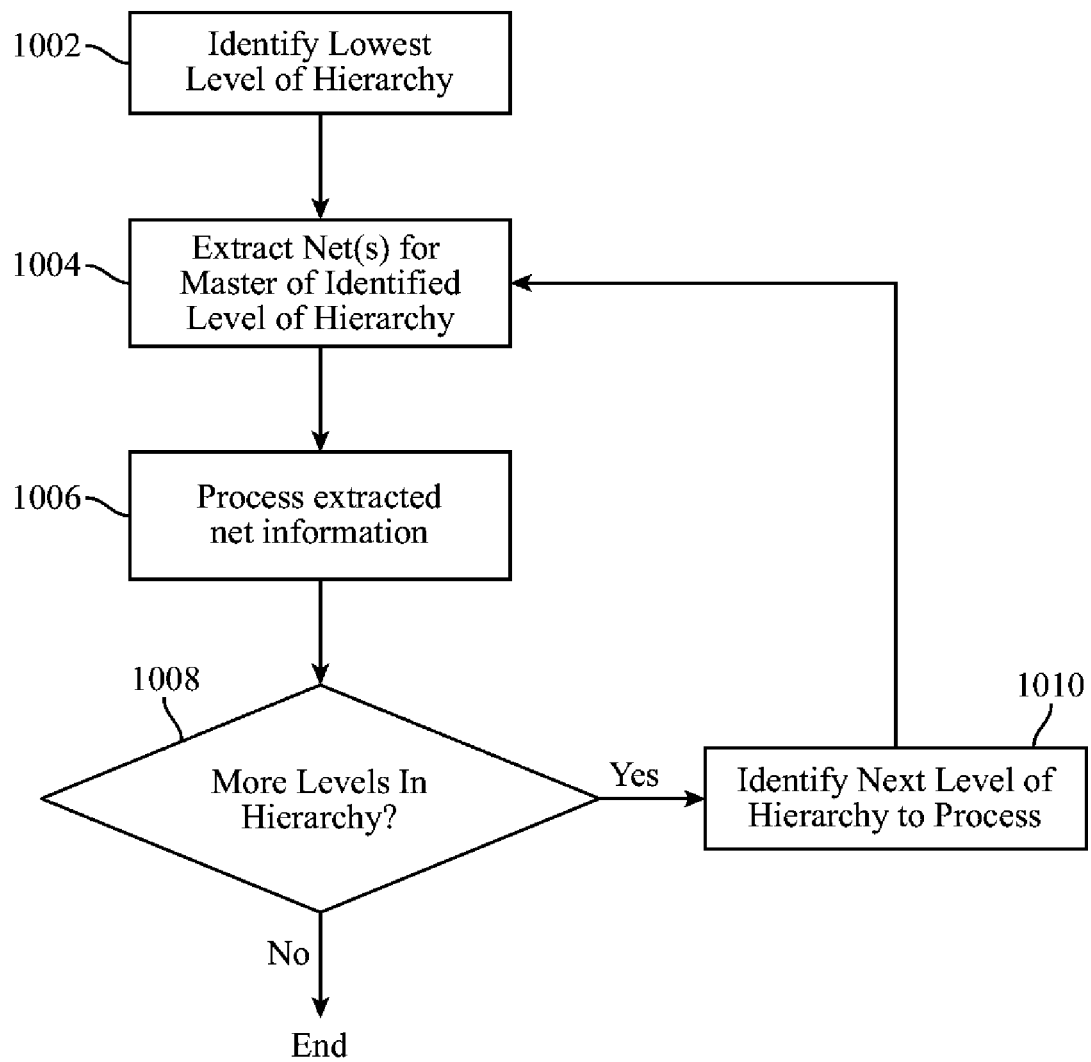
FIG. 10 is a flowchart of a process for connectivity extraction according to an embodiment of the invention.

FIG. 10 shows a flowchart of an embodiment of a process for connectivity extraction. At 1002, the lowest level of the design hierarchy for which connectivity extraction is desired is identified. The connectivity extraction operation is performed against a portion or all of the design at a particular level of the design hierarchy. That level of the design hierarchy may contain one or more instances of the design from other levels of the design hierarchy. These instances may, in turn, contain their own nested instances at even lower levels of the design hierarchy through multiple additional levels of the hierarchy. Analysis is performed the determine the lowest level of tile design hierarchy present in the portion of the circuit design for which connectivity extraction is desired. The master occurrence for that lowest level of the design hierarchy is first processed in the present embodiment.

At 1004, the net(s) for the master occurrence of the identified level is extracted. In the present approach, tile nets for only tile master occurrence is extracted—connectivity extraction is not individually performed for every instance of that master. Unlike traditional approaches, the process does not require every instance of the occurrence to be flattened and nets identified for shapes for each instance. Instead, as described in more detail below, the information gathered from flattening the master occurrence is stored and referenced as needed when processing other levels of the design hierarchy. Further detailed information about the action in 1004 is provided in conjunction with the description of FIG. 1.

At 1006, the information for the extracted nets are processed. An example structure that may be maintained or managed at 1006 in one embodiment of the present invention is the "virtual terminal." The virtual terminal provides a mechanism to connect a net at a given hierarchical level of the design to other nets at other levels in the design. If a net at a higher level of the design includes the shapes from an instance that is associated with a net at the lower level of the design, then the net at higher level of the hierarchy will include an instance of the virtual terminal to the net at the lower level of the design. The instance of the virtual terminal provides a structure that references the contents of the net at the lower level of the design hierarchy. The instances of the shapes associated with the net at the lower hierarchical level can be derived based upon the reference provided by the instance terminal. These virtual terminal structures can be tracked and maintained at 1006. The advantage of using virtual terminals is that nets at higher levels of the design hierarchy no longer need to specifically include each shape for each net at other levels of the hierarchy. Instead, these other shapes are implicitly included and derived for the net based upon the references to these other nets/shapes via instances of the virtual terminals.

In one embodiment, the virtual terminal for a net at a hierarchical level is created only if that net is actually included in another net at a higher level of the design hierarchy. In this approach, when 1004 extracts a net for a given master occurrence, the net will be associated with an instance of a virtual terminal to the net at a lower level of the design hierarchy. If the virtual terminal at the lower level of the design hierarchy has not yet been created, then the respective virtual terminal is created at 1006.

In an alternate embodiment, each net that is identified is always associated with a virtual terminal, regardless of whether or not the net is immediately identified as belonging to a net a another level of the design hierarchy. Therefore, if the net is later associated with another net, the instance of that terminal can be immediately associated with the other net without requiring the action of creating a terminal at that time for the net at the lower level of the hierarchy.

At 1008, a determination is made whether additional levels of the hierarchy remain to be processed. If so, then the next level of the hierarch is identified (1010) and the process returns back to 1004 to process this identified level of the design hierarchy.

Figure 11:
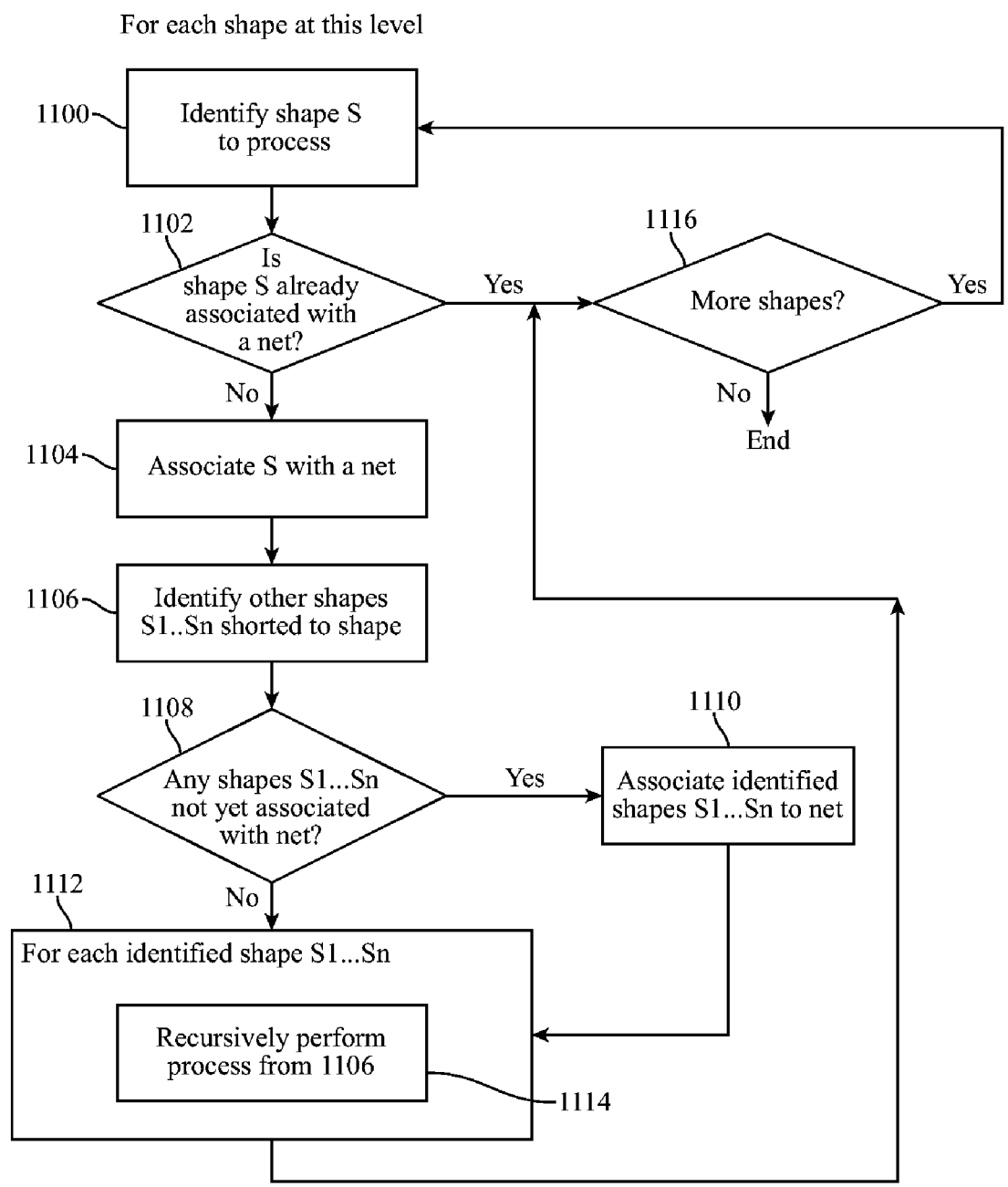
FIG. 11 is a flowchart of a process for identifying connected shapes according to an embodiment of the invention.

FIG. 11 is a flowchart of an embodiment of a process for extracting the nets at each hierarchical level. In general, each shape at the level is "chased" to determine all other shapes that directly or indirectly connect to that shape. All of the shapes that are identified as being connected or shorted together are associated with the same net identifier. The process generally loops through all shapes at a particular level to a net that is associated with the shape. Initially, a first shape (S) is identified for processing (1100). A determination is made whether the selected shape S is already associated with a net (1102). In one embodiment, a data structure associated with the shape S includes a field that contains the identity of the net for that shape. If the shape S has already been associated with a net, e.g., based upon an earlier iteration of the process, then the relevant data field for the shape S would already contain the identification of the net associated with the shape.

If the shape S is already associated with a net, then a determination is made whether there exists additional shapes that have not yet been processed at the present level of the design hierarchy (1116). If there exists additional shapes, then the process returns back to 1100 to select another shape for processing).

If the shape S has not yet been associated with a net, then a new net identifier is created and is associated with the shape (1104). A determination is made at this point whether there are other shapes S1 . . . Sn that connect the present shape S. One approach for making this determination is to draw a search window having a border that exactly matches the outline of shape S, and using the process described with respect to FIG. 7 to determine whether any other shapes fall within that search window. This determination can also be made for shapes that connect from another layer of the design, e.g., through a via. If these other shapes S1 . . . Sn connect to shape S (1108), then these other shapes are also associated with the same net identifier value (1110).

For each of these identified shapes S1 . . . Sn, the process recursively repeats from 1106 to identify other shapes that connect to each of these shapes. This will identify any additional shapes that connect to the original shape S through a chain of these other shapes S1 . . . Sn. Each iteration of this action will further identify additional chains of connected shapes until an identification is made of all shapes that connect, directly or indirectly, to the original shape S. By the end of this process, all of the connected shapes will be associated with the same net identifier that was assigned to shape S.

At this point, a determination is made whether there exists other shapes to process at the present level of the design hierarchy (1116). One approach is to review the data structure for each shape to see if all the shapes have already been associated with a net identified. If so, the process ends. Otherwise, another shape is selected that is not yet associated with a net identifier (1100) and the process repeats for the new shape S. Another approach is to just select another shape at the level without regard to whether it is already associated with a net (but which has not yet been processed at the outer loop from 1100), and make an immediate determination whether the shape is already associated with a net (1102). If there are no additional shapes, the process ends.

Figure 12:
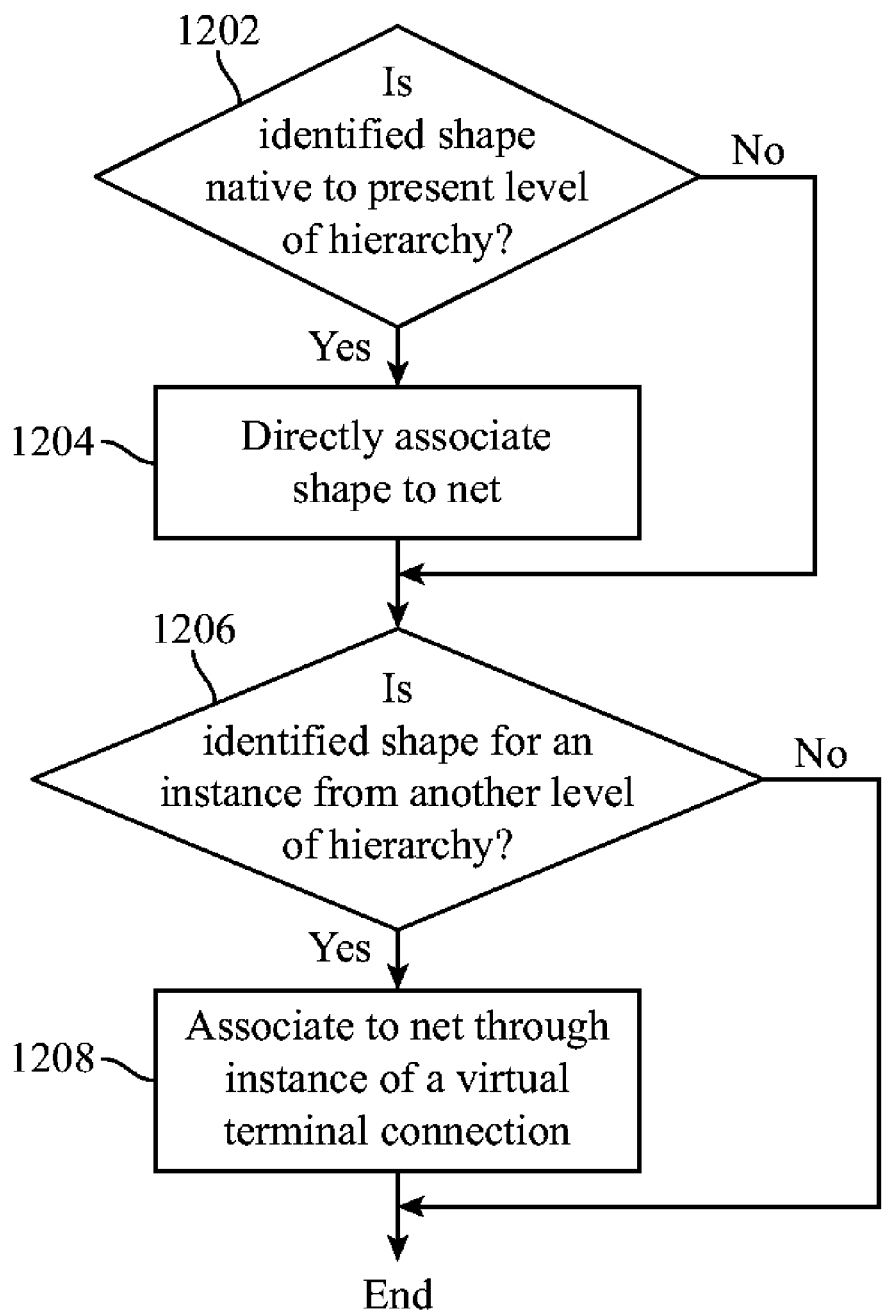
FIG. 12 is a flowchart of a process for associating a shape with a net according to an embodiment of the invention.

FIG. 12 is a flowchart of a process for associating a net identifier to a shape in the present level of the design hierarchy (1104 in FIG. 11). In one embodiment, each shape in the design represented in the master occurrence for the level may be associated with a data structure that tracks information about that shape. The data structure associated with the shape includes a field that identities the net within the occurrence that is associated with the shape. If the shape is native to the present level of the design hierarchy (1202), then the data structure for that shape is modified to include the identifier for the net to which it is presently being assigned (1204). In addition, a structure to track nets at the preset hierarchical level can be modified or created to include the net identifier.

As previously noted, in one embodiment, a virtual terminal may be created to allow a net at one level of the design hierarchy to reference and derive shapes for a net at another level of the design hierarchy. If the identified shape is from another level of the design hierarchy (1206), then an instance of a virtual terminal is created that references the terminal to the relevant net for that shape at the other level of the design hierarchy (1208).

Figure 13:
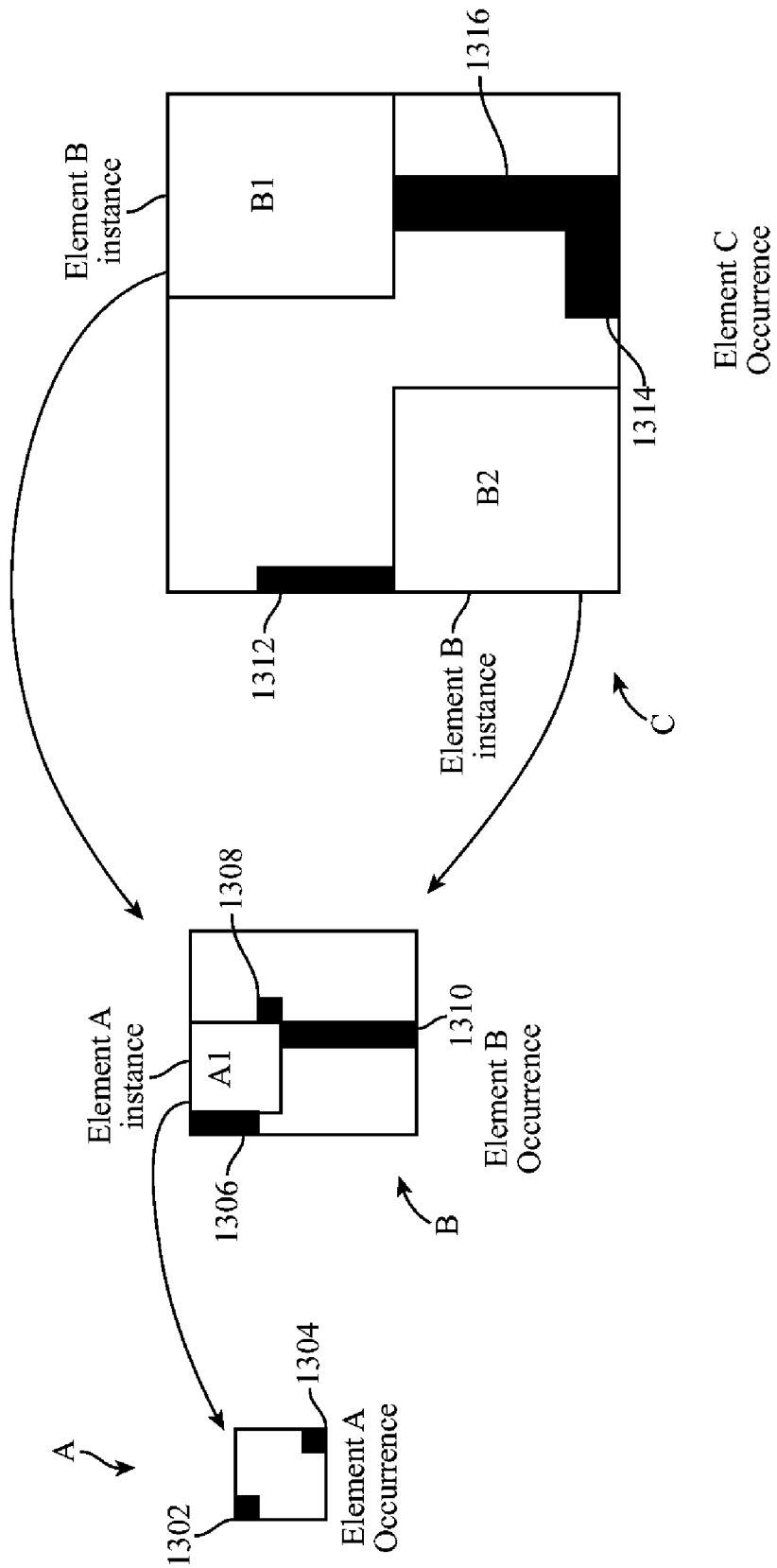
FIG. 13 shows an example design hierarchy.

To illustrate the processes of FIGS. 10-12, reference is now made to the example design hierarchy shown in FIG. 13. The element A occurrence includes two shapes 1302 and 1304. At a different level in the IC design, an occurrence of element B includes its own shapes 1306, 1308, and 1310 as well as an instance A1 of element A. At yet another level of the IC design, an occurrence of element C includes shapes 1312, 1314, and 1316 as well as two instances B1 and B2 of element B. Instances B1 and B2 each contain their own nested instance of element A. In the hierarchy of FIG. 13, each instance provides a logical reference to its master occurrence rather than a physical manifestation of the occurrence at the instance locations. For purposes of this example, it is assumed that all shapes are on the same layer of the design.

Figure 14:
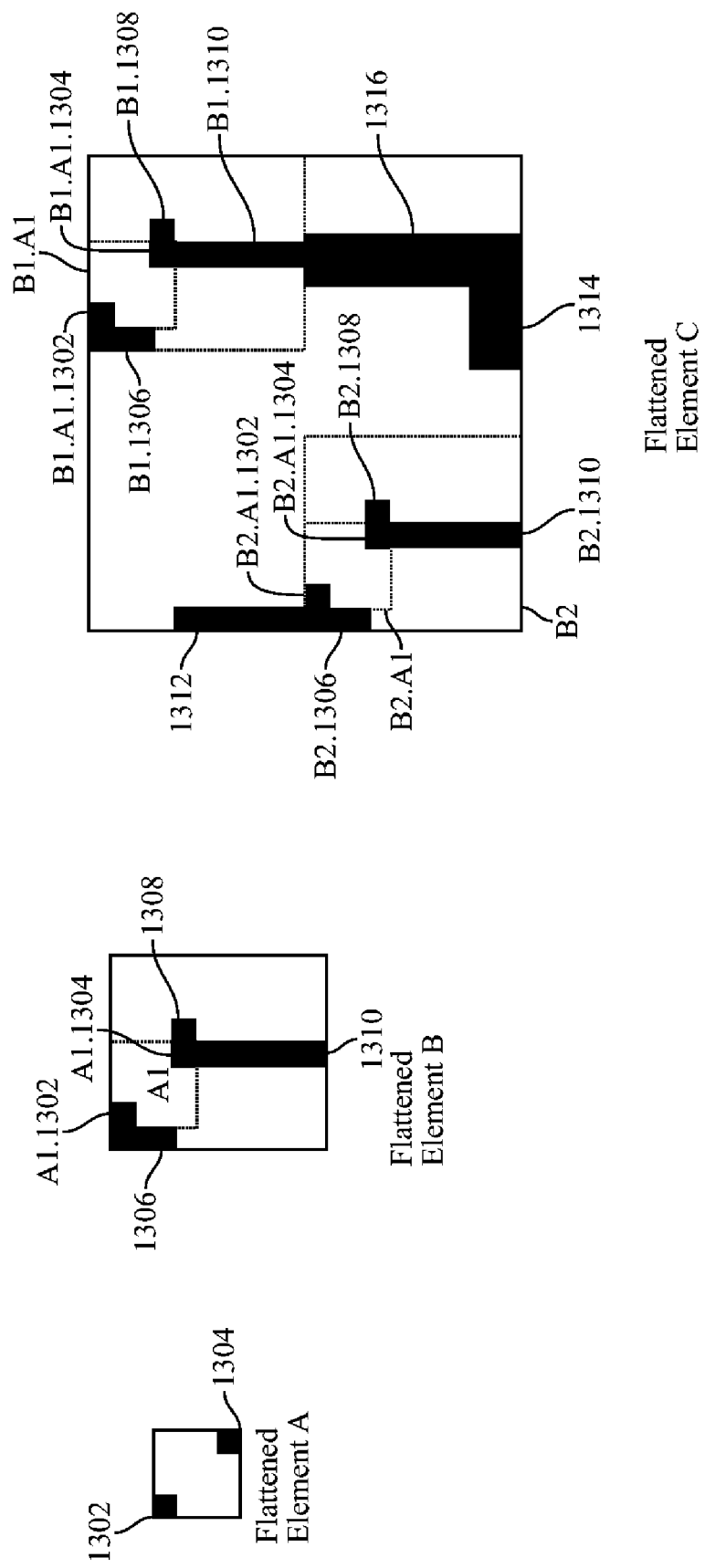
FIG. 14 shows a flattened version of the design hierarchy of FIG. 13.

In the traditional approach to extracting connectivity the entire design hierarchy would be flattened to allow one to determine the shapes that connect to one another. Here, if it is desired to extract the nets for this hierarchy under the traditional approach, then each of the elements A, B, and C would be flattened. FIG. 14 shows a flattened view of the design hierarchy of FIG. 13. In the flattened view, rather than inserting instances of elements into the design, actual copies of the shapes from the different levels of the design are placed in the appropriate locations within the design data. As shown in FIG. 14, the flattened view of the element A occurrence does not change since it does not contain any instances of shapes from other levels of the design. However, the flattened version of element B explicitly includes shapes A1.1302 and A1.1308, rather than an instance A1 that refers back to the master occurrence for Element A. Similarly, the flattened version of element C explicitly includes shapes B1.1306, B1.1308, and B1.1310 rather than an instance B1 that refers back to the master occurrence for Element B. In addition, it is noted that rather than including a nested instance A1 in instance B1, element C explicitly includes shapes B1.A1.1302 and B1.A1.1304 instead of a reference to these shapes in the master occurrence for Element A. Likewise, rather than including an instance B2 and its nested instance B2.A1 in element C that implicitly references the shapes associated with these instances, the flattened version of Element C explicitly includes shapes B2.1306, B2.1308, B2.1310, B2.A1.1302, and B2.A1.1304.

By flattening this design hierarchy, it can easily be seen, at each level of the hierarchy, which of the shapes connect to one another. Therefore, flattening the entire design provides a fairly simplistic approach for identify nets in a hierarchical design. Each collection of connected shapes at a given level would comprise its own net at that level.

However, flattening the entire design to extract connectivity information can also be highly inefficient. While only a simple design hierarchy is shown in FIG. 13-14, imagine a more typical design that includes many thousands or millions of shapes (and numerous levels of nested instances), with many thousands or millions of instances to unfold that are scattered throughout the hierarchical design. A significant amount of system resources must be expended just to unfold the design before connectivity extraction can be performed, which would affect the speed in which it takes to obtain results and possibly affect other work being performed on the system. Moreover, once the shapes in the design have been unfolded, a considerable amount of system memory would be needed to store and operate upon the flattened design. This is, of course, despite the fact that the same set of shapes would be repeated over and over again for each unfolded instance of the same design element. A small example of this inefficiency can be seen in FIG. 14 in which the flattened version of Element C explicitly includes all the shapes for both instance B1 and B2, even though both instances refer to the same set of shapes. This example of inefficiency is multiplied many times over in a typical hierarchical design in which a master occurrence for a design element may be instantiated many thousands or millions of times.

The present embodiment of the invention provides an approach for extracting connectivity from a hierarchical design in which the entire design does not have to be unfolded. FIGS. 15*a-c*, 16*a-c*, and 17*a-d* illustrate an embodiment of this process against the design hierarchy of FIG. 13. The present illustrated example will be described with reference to the actions shown in the flowcharts of FIGS. 10, 11, and 12.

As noted in the description of the flowchart of FIG. 10, each hierarchical level of the design is processed, from the lowest level to the highest. One reason for taking this action is because the higher levels of the design hierarchy incorporate instances of the lower levels of the design hierarchy, and will therefore include shapes that can be derived based upon nets that are identified at the lower levels. As such, it is helpful to first identify the nets in the lower levels of the hierarchy so that they may be easier referenced when processing the higher levels of the design hierarchy.

Figure 15A:
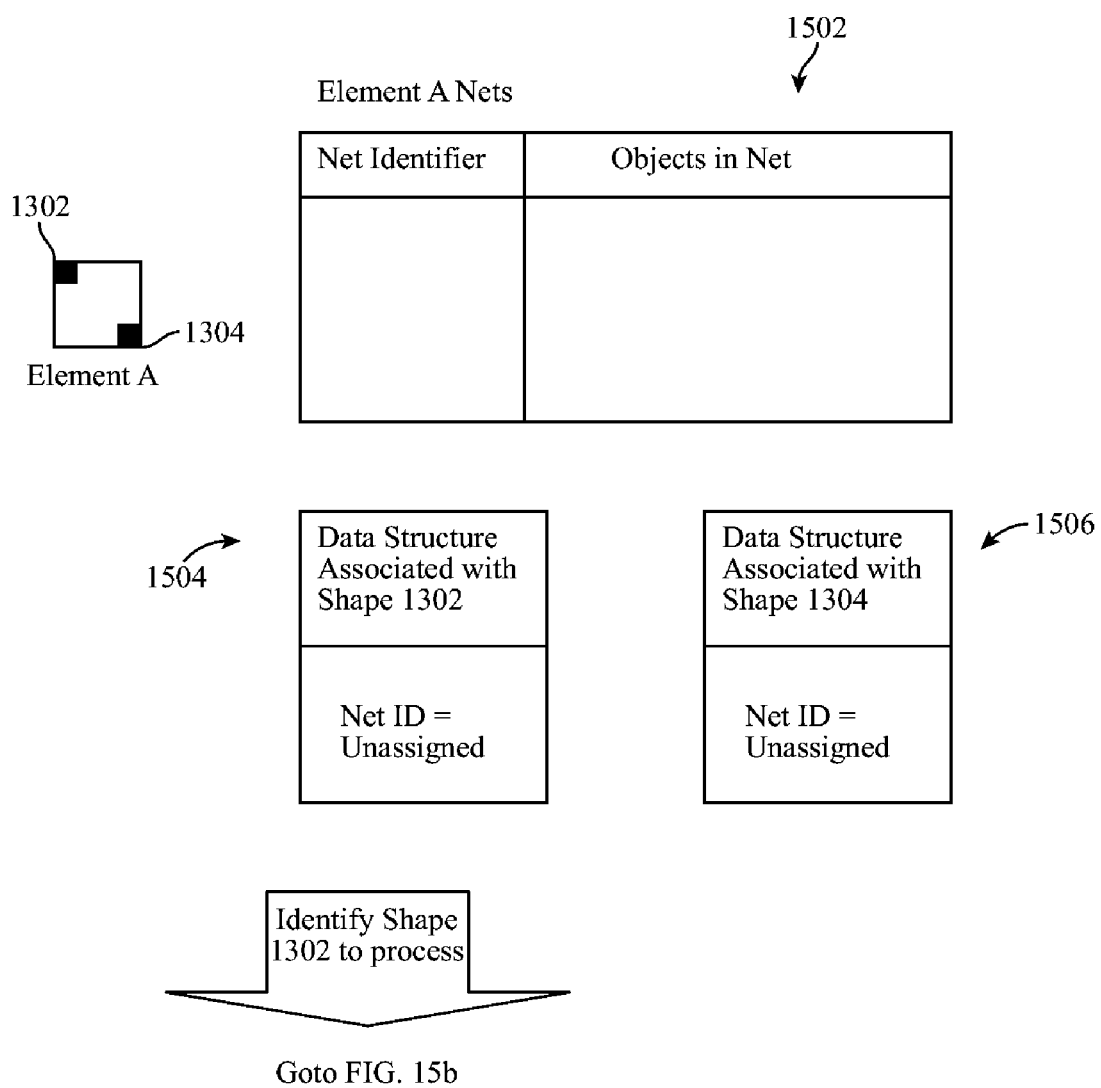
Figure 15C:
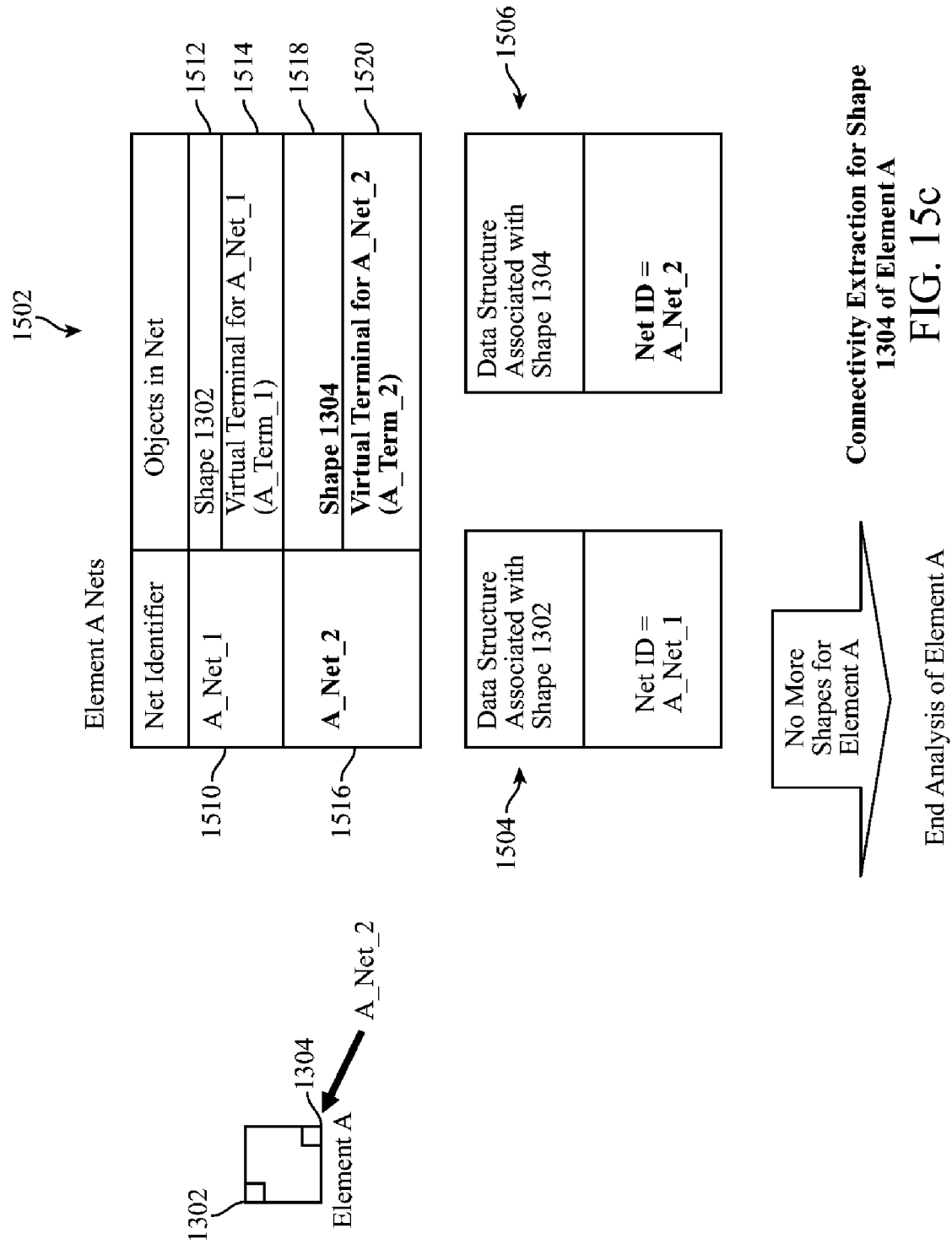
Figure 16B:
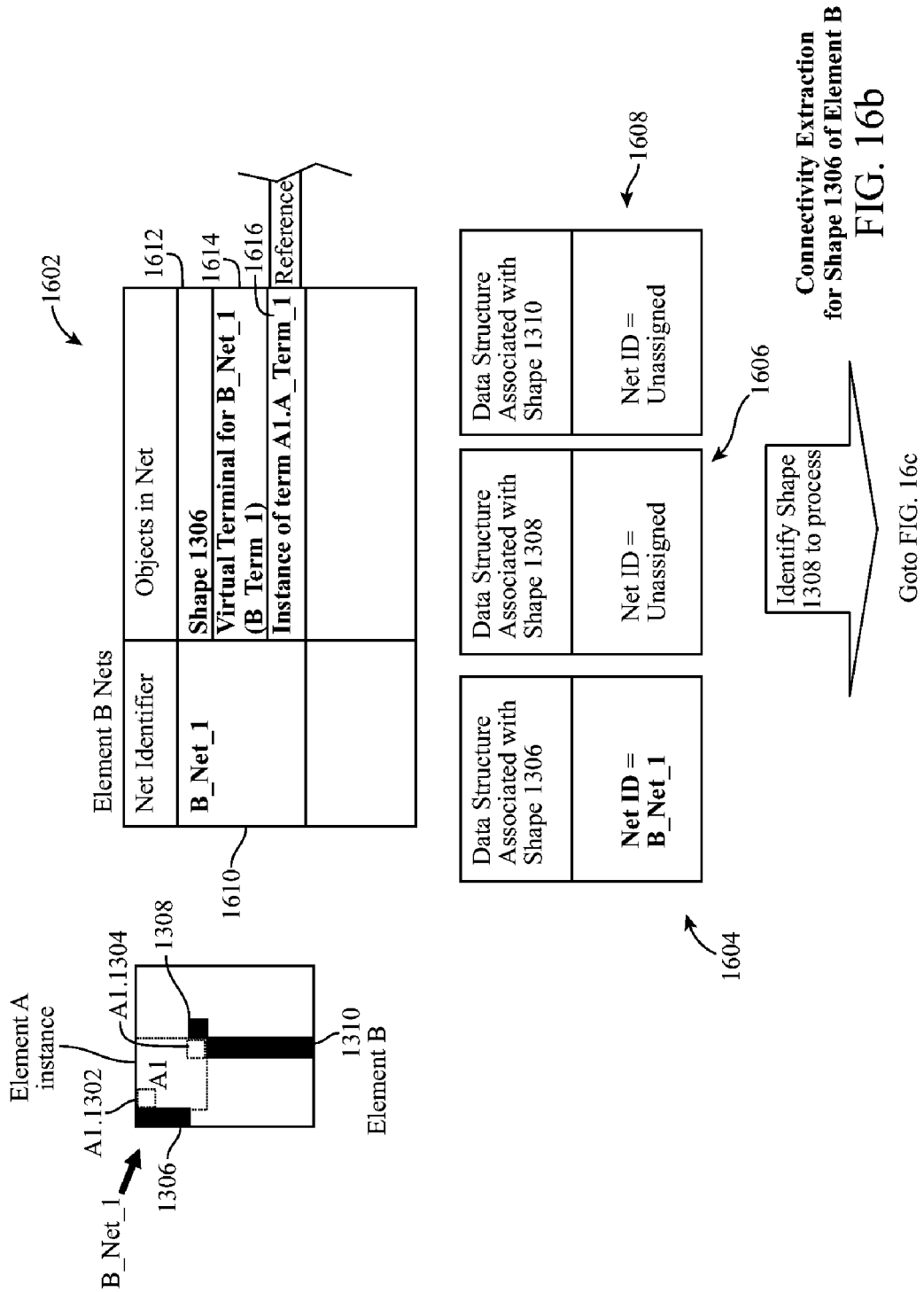
Figure 16B:
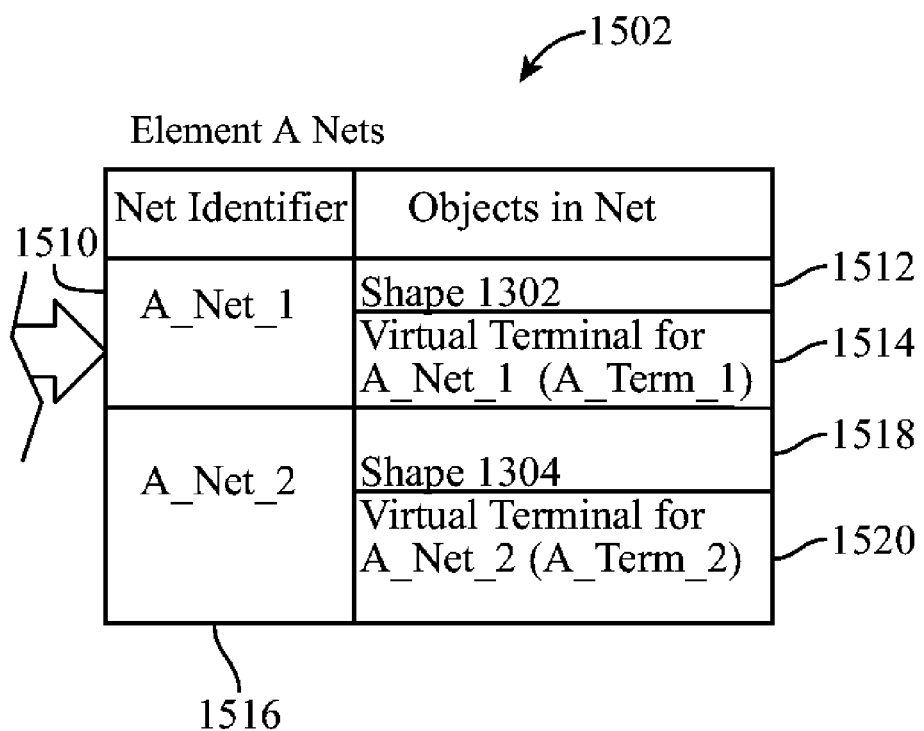
Figure 16C:
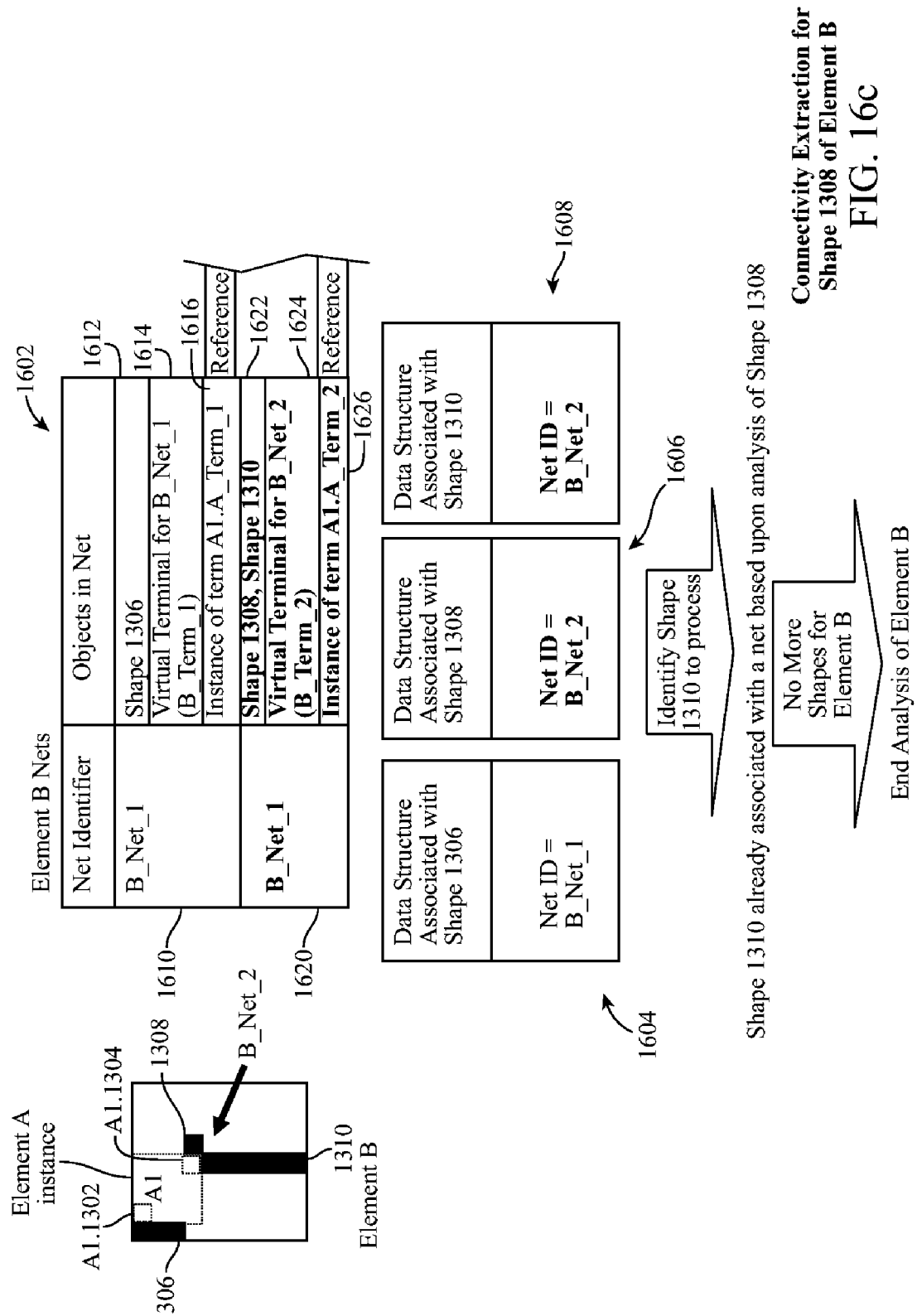
Figure 16C:
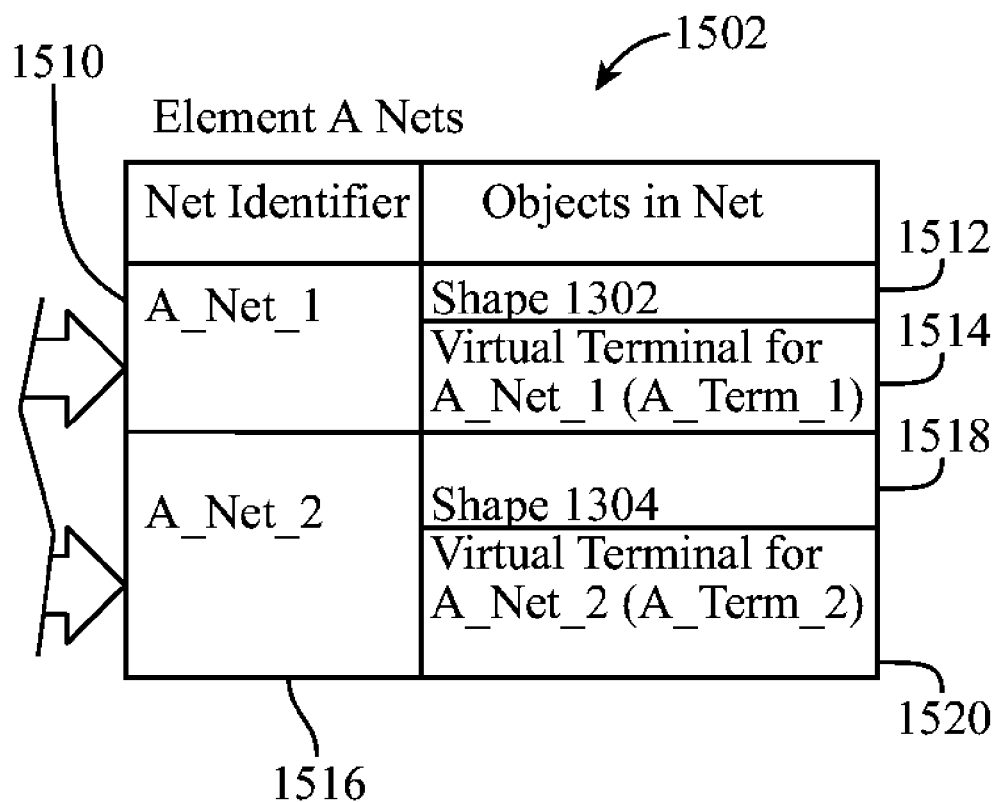

In the example design hierarchy of FIG. 13, element A is the lowest level of the design hierarchy. Therefore, the process begins by first extracting the nets for the master occurrence for element A. FIG. 15*a* shows example data structures or elements that may be used or accessed for connectivity extraction of element A in one embodiment of the invention. For convenience, the master occurrence of element A is reproduced on the left side of this figure. An example structure 1502 is shown in this figure to track the contents of nets identified for element A. Here, since connectivity extraction has not yet been performed, structure 1502 does not contain any connectivity information. As can be seen, element A includes two explicit shapes 1302 and 1304. One or more data structures can be maintained to track information about each of the shapes in element A. In FIG. 15*a*, shown is a structure 1504 that tracks information about shape 1302, including the identifier of the net associated with this shape. A structure 1506 tracks information about shape 1304, including the identifier of the net associated with this shape. Since connectivity extraction has not yet been performed, structures 1504 and 1506 do not yet contain net identifiers for their respective shapes.

Each explicit shape at the present hierarchical layer of the design is processed to identify the net associated with that shape. Here, the process randomly selects shape 1302 as the first shape to process for element A (although the process could start with any of the explicit shapes 1302 or 1304 in element A). An initial determination is made whether shape 1302 is already associated with a net (1102 of FIG. 1). A scan of the structure 1504 corresponding to shape 1302 makes it clear that shape 1302 is not yet associated with a net. Therefore, referring to FIG. 15*b*, a new net identifier (embodied in this figure as the example identifier "A_Net_1") is created and is associated with shape 1302, e.g., by adding an entry in structure 1504 that associates this shape to the net identifier "A_Net_1" (1104 of FIG. 11). Structure 1502 is modified to include an entry 1510 for the new net for element A, which includes a field 1512 to identify the shapes in this net. Field 1512 in entry 1510 identifies shape 1302 as being part of net "A_Net_1".

At this point, all shapes connected to shape 1302, whether directly or indirectly, are identified and are associated with net "A_Net_1" (1106-1114 of FIG. 11). One way to identify shapes connected to shape 1302 is to create a search window having a border that exactly matches the outline of shape 1302, and using the process described with respect to FIG. 7 to determine whether any other shapes fall within that search window. If any shapes fall within the boundaries of this search window, then these other shapes are also associated with the same net identifier and are themselves processed to identify more connected shapes. This process continues until all directly or indirectly connected shapes to shape 1302 are identified. Here, there are no other shapes connected to shape 1302. Therefore, net A_Net_1 only identifies shape 1302 as the sole shape in this net (as shown by example in entry 1510 of structure 1502).

A virtual terminal may be created to provide a mechanism to reference net A_Net_1 at the present hierarchical level of the design to other nets at other levels in the design. At another level of the hierarchal design of FIG. 13, a net at the higher level of the design may include an instance of element A in a position that causes shape 1302 to connect to one or more shapes that explicitly appear at that higher level of the design. Rather than explicitly unfolding shape 1302 at that higher level of the design, a virtual terminal is created for the net associated with shape 1302 (A_Net_1) to allow nets at other levels to implicitly reference and to derive the shape instances for the net associated with shape 1302. At die higher level of the design hierarchy, an instance of the terminal is embedded into the connected net to perform this referencing functionality.

At the present level of the design hierarchy, a virtual terminal can therefore be associated with net A_Net_1. In the present embodiment, entry 1510 in structure 1502 is modified to include a field 1514 that associates a virtual terminal (embodied as the example terminal identifier "A_Term_1") to net A_Net_1. The terminal identifier in field 1514 therefore provides a referencing structure for nets at other levels of the design hierarchy to refer connectivity and to derive shapes corresponding to net A_Net_1 at the present level of the design hierarchy. As previously stated, the creation of a virtual terminal can be performed for every net at a hierarchical level of the design, regardless of whether or not the net is immediately identified as connected to shapes at another level of the design hierarchy. If the net is later associated with another net, the instance of that terminal can be immediately associated with the other net without requiring tile action of creating a terminal at that time for the net at the lower level of the hierarchy. This approach is illustrated in the present example. Alternatively, a virtual terminal is only created as-needed, based upon later analysis at higher levels of the design, when a determination has been made whether a net at the higher hierarchical level actually connects to a shape at a lower hierarchical level. In this approach, when a net is extracted for a given master occurrence, the net will be associated with an instance of a virtual terminal to the net at a lower level of the design hierarchy. If the virtual terminal at the lower level of the design hierarchy has not yet been created, then the respective virtual terminal is created.

At this point, shape 1302 and its connected shapes (none in this example) have been fully processed. Therefore, a determination is made whether there are additional shapes at the present hierarchical level to process. Here, shape 1304 of element A still needs to be processed. A determination is made whether shape 1304 is already associated with a net (1102 of FIG. 11). A scan of the structure 1506 corresponding to shape 1304 makes clear that shape 1304 is not yet associated with a net. Therefore, referring to FIG. 15c, a new net identifier (embodied in this figure as the example identifier "A_Net_2") is created and is associated with shape 1304, e.g., by adding an entry in structure 1506 that associates this shape to the net identifier "A_Net_2" (1104 of FIG. 11). Structure 1502 is modified to include an entry 1516 for the new net A_Net_2 for element A, which includes a field 1518 to identify the shapes in this net. Here, field 1518 in entry 1516 identifies shape 1304 as being part of net "A_Net_2".

All shapes connected to shape 1304, whether directly or indirectly, are now identified and are associated with net "A_Net_2" (1106-1114 of FIG. 11). As before, one way to identify shapes connected to shape 1304 is to create a search window having a border that exactly matches the outline of shape 1304, and using the process described with respect to FIG. 7 to determine whether any other shapes fall within that search window. If any shapes fall within the boundaries of this search window, then these other shapes are also associated with the same net identifier and are themselves processed to identify more connected shapes. Here, there are no other shapes connected to shape 1304. Therefore, net A_Net_2 only identifies shape 1304 as the sole shape in this net (as shown by example in entry 1516 of structure 1502). A virtual terminal is also associated with net A_Net_2. Entry 1516 in structure 1502 is modified to include a field 1520 that associates a virtual terminal (embodied as the example terminal identifier "A_Term_2") to net A_Net_2.

Shape 1304 and its connected shapes (if any) have been fully processed. A determination is made whether there are additional shapes at the present hierarchical level to process. Here, the master occurrence of element A does not contain any more shapes. Therefore, the nets for element A have all been identified (e.g., in structure 1502).

Now that the master occurrence for element A has been processed, the next level of the design hierarchy is identified and processed for connectivity extraction (1008, 1010 in FIG. 10). Referring back to FIG. 13, it can be seen that element B is the next level of the design hierarchy. Therefore, the master occurrence for element B is processed next.

As before, the process proceeds by extracting the nets for the master occurrence for element B. FIG. 16a shows example data structures/objects that may be used or accessed for connectivity extraction of element B in one embodiment of the invention. For conveniences the master occurrence of element B is reproduced on the left side of this figure. An example structure 1602 is shown to track the contents of nets identified for element B. Since connectivity extraction has not yet been performed, structure 1602 does not contain any connectivity information. Element B includes three explicit shapes 1306, 1308, and 1310. One or more data structures can be maintained to track information about each of the shapes in element B. In FIG. 16a, shown is a structure 1604 that tracks information about shape 1306, including the identifier of the net associated with this shape. A structure 1606 tracks information about shape 1308, including the identifier of the net associated with this shape. Another structure 1608 tracks information about shape 1310, including the identifier for the net associated with shape 1310. Since connectivity extraction has not yet been performed, structures 1604, 1606, and 1608 do not yet contain net identifiers for their respective shapes.

Each explicit shape at the present hierarchical layer of the design (i.e., element B) is processed to identify the net associated with that shape. For this example, the process randomly selects shape 1306 as the first shape to process for element B (although the process could start with any of the explicit shapes 1306, 1308 or 1310 in element B). An initial determination is made whether shape 1306 is already associated with a net (1102 of FIG. 11). A scan of the structure 1604 corresponding to shape 1306 makes it clear that shape 1306 is not yet associated with a net. Therefore, referring to FIG. 16b, a new net identifier (embodied in this figure as the example identifier "B_Net_1") is created and is associated with shape 1306, e.g., by adding an entry in structure 1604 that associates shape 1306 to the net identifier "B_Net_1" (1104 of FIG. 11). Structure 1602 is modified to include an entry 1610 for the new net for element B, which includes a field 1612 to identify the shapes in this net. Field 1612 in entry 1610 identifies shape 1306 as being part of net "B_Net_1".

All shapes connected to shape 1306, whether directly or indirectly, are now identified and are associated with net "B_Net_1" (1106-1114 of FIG. 11). As before, a search window can be created having a border that exactly matches the outline of shape 1306 and the process described with respect to FIG. 7 can be used to determine whether any other shapes connect to shape 1306.

If any shapes explicitly at this hierarchical level fall within the boundaries of this search window, then these other shapes are directly associated with the same net identifier (1202-1204 of FIG. 12). If, however, the identified shapes are within nested instances from another level of the hierarchy, then an instance of a virtual terminal is created to associate the present net with the net at the other hierarchical level (1206-1208 of FIG. 12).

In the present example, shape 1306 is not connected to any native shapes explicitly located at the present hierarchical level. However, it can be seen that shape 1306 shorts to shape A1.1302, which is the instantiation of shape 1302 from instance A1 of element A. Shape 1302 is part of net A_Net_1 from element A. Since shape A1.1302 is an instantiation of shape 1302 from another hierarchical level in the design, the present net B_Net_1 can refer to the contents of this other net A_Net_1, thereby implicitly associating all shapes associated with the other net A_Net_1 to the present net B_Net_1. This type of referencing is accomplished in the present embodiment by creating an instance 1616 (referred to as A1.Term_A1) of the terminal A_Term_1 associated with net A_Net_1, and associating this instance 1616 to the present net B_Net_1.

In this manner, it is not required for the entire contents of an instance to be unfolded in the present hierarchical level when performing connectivity extraction. Instead, once a connection/short is identified to any instantiation of a shape from an instance of an element from another hierarchical level, an instance of the corresponding terminal for the net associated with that shape can be created to form the appropriate reference between the present net and the shapes associated with the terminal. In the present example, the instance terminal 1616 (A1.Term_A1) would be created to implicitly associate any shapes at lower levels of the hierarchy connected to shape 1302 of element A with the present net B_Net_1. The shapes in the net at the lower hierarchical level can be derived from the instance terminal. In this example, the shape instance A1.1302 can be derived by following the reference path through the instance terminal 1616 to refer to entry 1510 for net A_Net_1, and accessing field 1512 to identify shape 1302. Therefore, the work that was performed with reference to FIGS. 15a-c to identify nets for element A is leveraged to and re-used by other levels of the design hierarchy that connect to shapes instances of element A. Regardless of the number of instances of element A in the overall design, the unfolding aspects of performing connectivity extraction for element A is performed only once but is referenced as many times as needed to establish the nets associated with the shapes in the various instances of element A. This provides a considerable advantage and efficiency gain over the traditional approaches that require each and every instance of a given element to be unfolded throughout a design in order to perform connectivity extraction.

All shapes connected to the presently considered shape 1306 are themselves processed in an iterative or recursive manner to identify other shapes that indirectly connect to shape 1306, and therefore would belong to the present net, which is further iteratively repeated as needed for each identified shape until all connected shapes have been found. Here, only the instantiation of shape A1.1302 has been identified as being connected to shape 1306. Therefore, a search is performed to identify additional shapes that would short to the geometric boundaries of the instantiation of shape A1.1302. One approach is, like before, to create a search window that is sized consistent with the geometric boundaries of shape A1.1302 and perform the process of FIG. 7 to identify all other shapes that intersect with this shape. Another approach is to draw a search window that has a boundary consistent with all of the shapes associated with the net A_Term_1 for shape 1302 from element A, but which is located at its corresponding location to instantiation A1.1302. In the present example, it is assumed that no further shapes connect directly or indirectly to shape 1306.

A virtual terminal may be created to provide a mechanism to connect net B_Net_1 at the present hierarchical level of the design to other nets at other levels in the design. At the present level of the design hierarchy, a virtual terminal can therefore be associated with net B_Net_1. In the present embodiment, entry 1610 in structure 1602 is modified to include a field 1614 that associates a virtual terminal (embodied as the example terminal identifier "B_Term_1") to net B_Net_1. The terminal identifier in field 1614 therefore provides a referencing structure for nets at other levels of the design hierarchy to refer connectivity to net B_Net_1 at the present level of the design hierarchy.

At this point, shape 1306 and its connected shapes have been fully processed. Therefore, a determination is made whether there are additional shapes at the present hierarchical level to process. Here, shape 1308 of element B still needs to be processed. A determination is made whether shape 1308 is already associated with a net (1102 of FIG. 11). A scan of the structure 1606 corresponding to shape 1308 makes clear that shape 1308 is not yet associated with a net. Therefore, referring to FIG. 16c, a new net identifier (embodied in this figure as the example identifier "B_Net_2") is created and is associated with shape 1308, e.g., by adding an entry in structure 1606 that associates this shape to the net identifier "B_Net_2" (1104 of FIG. 11). Structure 1602 is modified to include an entry 1620 for the new net B_Net_2, which includes a field 1622 to identify the shapes in this net. Here, field 1622 in entry 1620 identifies shape 1308 as being part of net "B_Net_2".

All shapes connected to shape 1308, whether directly or indirectly, are identified and are associated with the same net "B_Net_2" (1106-1114 of FIG. 11). As before, one way to identify shapes connected to shape 1308 is to create a search window having a border that exactly matches the outline of shape 1308, and using the process described with respect to FIG. 7, to determine whether any other shapes fall within that search window. If any shapes fall within the boundaries of this search window, then these other shapes are also associated with the same net identifier and are themselves processed to identify more connected shapes.

Shape 1308 is not directly connected to any native shapes explicitly located at the present hierarchical level. However, it can be seen that shape 1308 shorts to shape instance A1.1304, which is the instantiation of shape 1304 from instance A1 of element A. Shape 1304 is part of net A_Net_2 from element A. Since shape A1.1304 is an instantiation of shape 1304 from another hierarchical level in the design, the present net B_Net_2 can refer to the contents of this other net A_Net_2, thereby implicitly associating all shapes associated with the other net A_Net_2 to the present net B_Net_2. This type of referencing is accomplished in the present embodiment by creating an instance 1626 (referred to as A1.A_Term_2) of the terminal A_Term_2 associated with net A_Net_2, and associating this instance 1626 to the present net B_Net_2.

The instantiation of A1.1304 is itself processed to determine additional shapes that connect/short to this shape instantiation. As previously stated, one approach is to create a search window that is sized consistent with the geometric boundaries of shape A1.1304 and perform the process of FIG. 7 to identify all other shapes that intersect with this shape. Another approach is to draw a search window that has a boundary consistent with all of the shapes associated with the net A_Term_2 for shape 1304 from element A, but which is located at its corresponding location to instantiation A1.1304. In the present example, either approach would be equivalent and produce the same result, which would identify shape 1310 as being connected to the geometric boundaries of shape instance A1.1304. Therefore, since shape 1310 is native to the present hierarchical level of element B, the structure 1608 associated with shape 1310 is modified to include an association between this shape to the present net B_Net_2. In addition, the entry 1620 in the structure 1602 is modified at filed 1622 to explicitly associate shape 1310 to net B_Net_2. In this example, it is assumed that no other shapes directly or indirectly connect to shape 1308.

A virtual terminal may be created to provide a mechanism to connect net B_Net_2 at the present hierarchical level of the design to other nets at other levels in the design. At the present level of the design hierarchy, a virtual terminal can therefore be associated with net B_Net_2. In the present embodiment, entry 1620 in structure 1602 is modified to include a field 1624 that associates a virtual terminal (embodied as the example terminal identifier "B_Term_2") to net B_Net_2. The terminal identifier in field 1624 therefore provides a referencing structure for nets at other levels of the design hierarchy to refer connectivity to net B_Net_2 at the present level of the design hierarchy.

A determination is made whether there are additional shapes at the present hierarchical level to process. Here, shape 1310 has not yet been handled at the outer loop of the process of FIG. 11. However, a determination is made whether this shape is already associated with a net. A review of structure 1608 allows an immediate determination that shape 1310 has already been associated with a net during an earlier iteration of the process. Therefore, further processing for shape 1310 is skipped and an additional determination is made whether there are other explicit shapes at the present hierarchical level to process. In the present example, there are no further explicit shapes to process in the outer loop of the process of FIG. 11. It is noted that in the present embodiment, only shapes explicitly existing at the present hierarchical level are processed at the outer loop pursuant to the process of FIG. 11. This would include shapes 1306, 1308, and 1310 in the present example. Shape instances such as A1.1302 and A1.1304 are not independently processed; instead, these shape instances are only processed if they connect to any of the explicit shapes at the present level. Therefore, since shapes 1306, 1308, and 1310 have all been processed, the processing of the master occurrence for element B is completed.

Now that the master occurrence for element B has been processed, the next level of the design hierarchy is identified and processed for connectivity extraction (1008, 1010 in FIG. 10). Referring back to FIG. 13, it can be seen that element C is thee next level of the design hierarchy. Therefore, the master occurrence for element C is processed next.

Figure 17A:
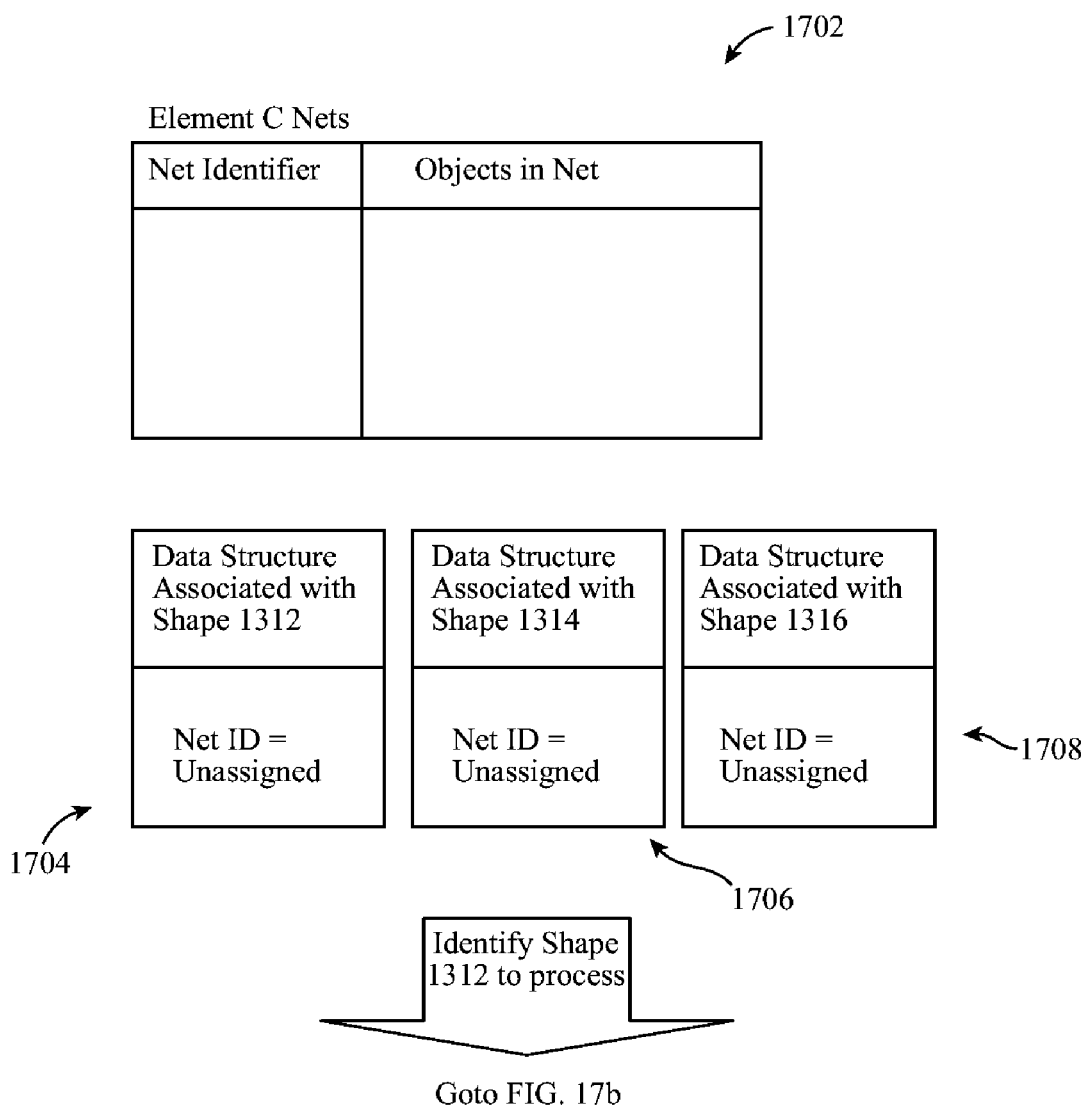
Figure 17B:
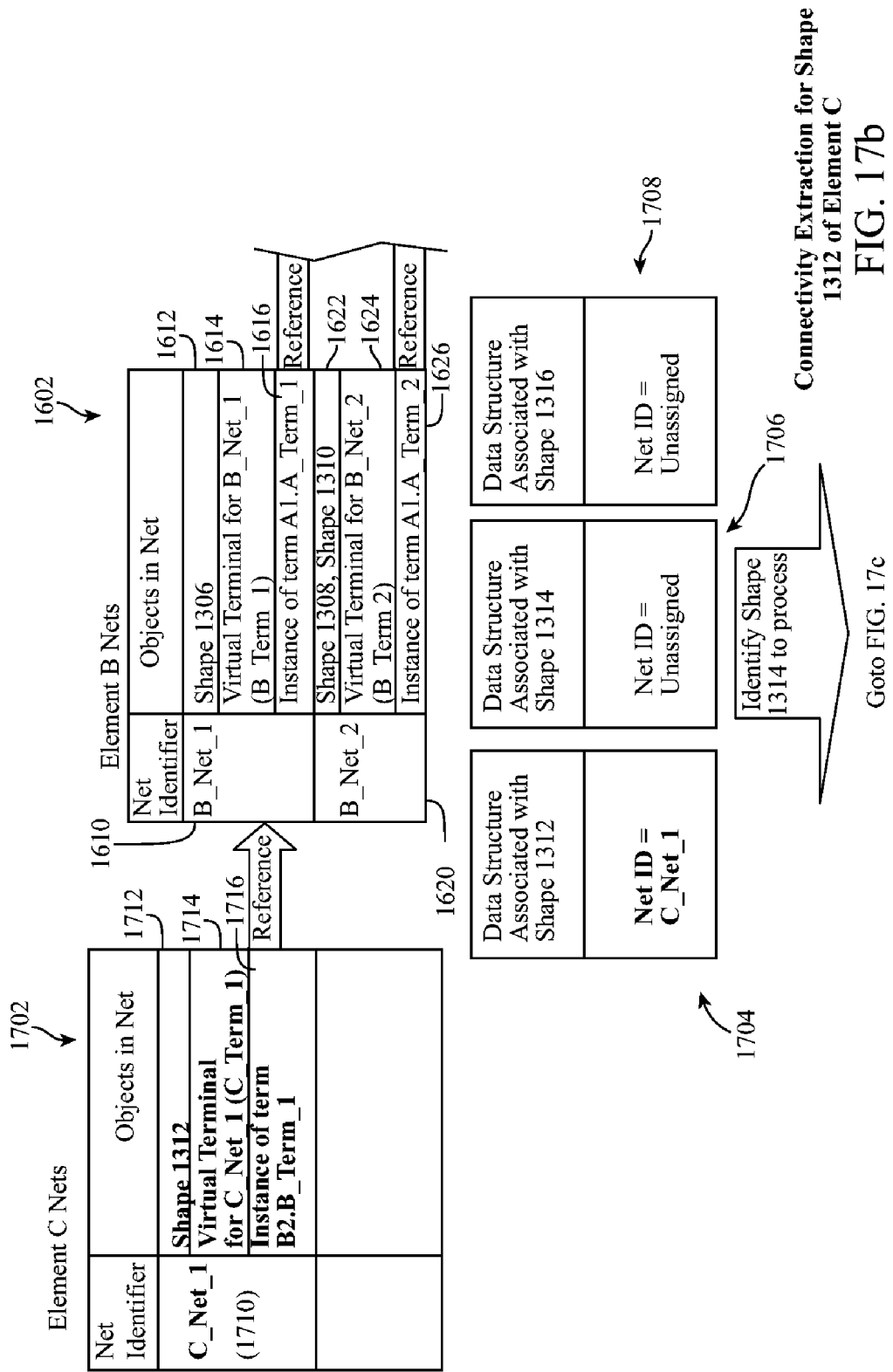
Figure 17B:
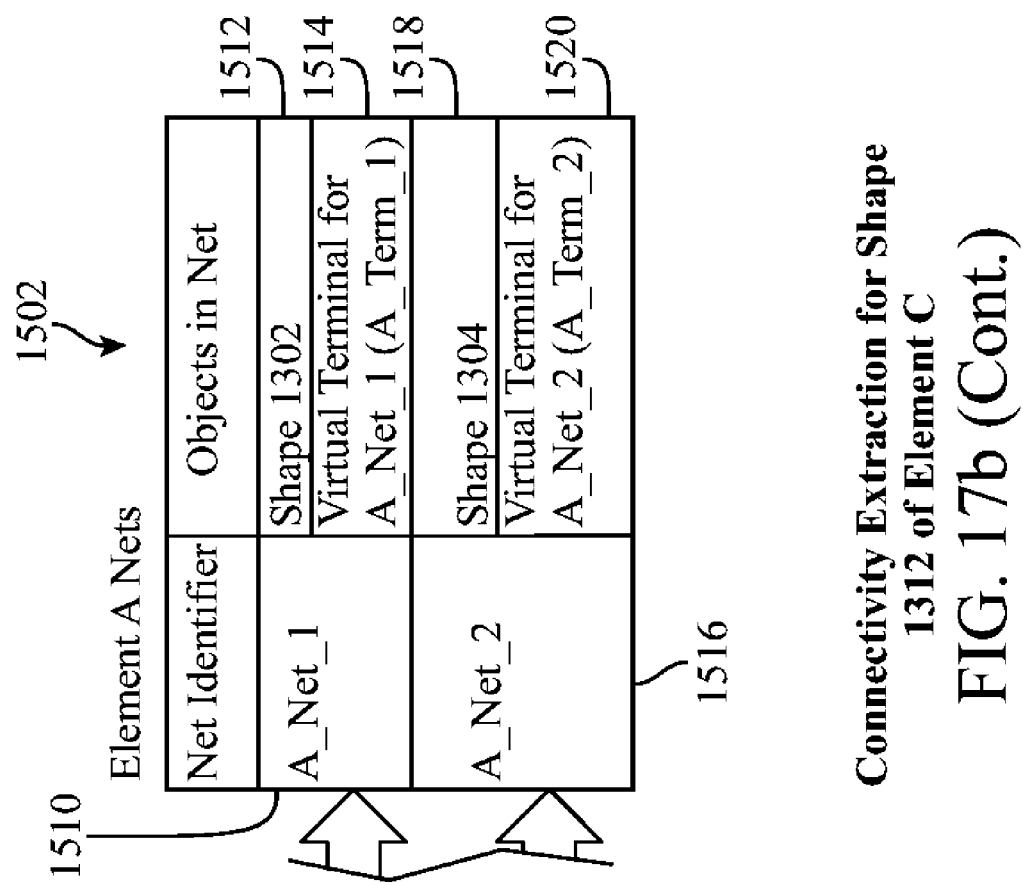

FIG. 17a shows example data structures or elements that may be used or accessed for connectivity extraction of element C in one embodiment of the invention. An example structure 1702 is used to track the contents of nets identified for element C. Since connectivity extraction has not yet been performed, structure 1702 does not contain any connectivity information. Element C includes three explicit shapes 1312, 1314, and 1316. One or more data structures can be maintained to track information about each of the shapes in element C. In FIG. 17a, shown is a structure 1704 that tracks information about shape 1312, including the identifier of the net associated with this shape. A stricture 1706 tracks information about shape 1314, Each explicit shape at the present hierarchical layer of the design (i.e., element C) is processed to identify the net associated with the shape at each hierarchical level/master element. For this example, the process randomly selects shape 1312 as the first shape to process for element C (although the process could start with any of the shapes in element C). An initial determination is made whether shape 1312 is already associated with a net. A scan of the structure 1704 corresponding to shape 1312 makes it clear that shape 1312 is not yet associated with a net. Therefore, referring to FIG. 17b, a new net identifier (embodied in this figure as the example identifier "C_Net_1") is created and is associated with shape 1312, e.g., by adding an entry in structure 1704 that associates shape 1312 to the net identifier "C_Net_1 ". Structure 1702 is modified to include an entry 1710 for the new net for element C, which includes a field 1712 to identify the shapes in this net. Field 1712 in entry 1710 identifies shape 1312 as being part of net "C_Net_1".

All shapes connected to shape 1312, whether directly or indirectly, are now identified and are associated with net "C_Net_1 ". As before, a search window can be created having a border that exactly matches the outline of shape 1312 and the process described with respect to FIG. 7 can be used to determine whether any other shapes connect to shape 1312.

Shape 1312 is not connected to any native shapes explicitly located at the present hierarchical level. However, it can be seen that shape 1312 shorts to shape instance B2.1306, which is the instantiation of shape 1306 from instance B2 of element B. Shape 1306 is part of net B_Net_1 from element B. Since shape B2.1306 is an instantiation of shape 1306 from another hierarchical level in the design, the present net C_Net_1 can refer to the contents of this other net B_Net_1, thereby implicitly associating all shapes associated with the other net B_Net_1 to the present net C_Net_1. This type of referencing is accomplished in the present embodiment by creating an instance 1716 (referred to as B2.B_Term_1) of the terminal B_Term_1 associated with net B_Net_1, and associating this instance 1716 to the present net C_Net_1. In effect, net C_Net_1 includes all shapes explicitly present at the present hierarchical level (as shown in filed 1712) as well as all shapes implicitly referenced by the instance terminal 1716.

Instance terminal 1716 references a net B_Net_1 that itself contains an instance terminal 1616 that references another net A_Net_1. Therefore, the shapes that are associated with net C_Net_1 are derived by considering the native shapes at the present level (shape 1312), the shapes associated with instance terminal 1716 to net B_Net_1 (shape 1306), as well the shapes associated with instance terminal 1616 to net A_Net_1 (shape 1302). In practice, any number of chained instance terminals may exist for a net in the hierarchical structure.

All shapes connected to the presently considered shape 1312 are themselves processed in an iterative or recursive manner to identify other shapes that indirectly connect to shape 1312, and therefore would belong to the present net, which is further iteratively repeated as needed for each identified shape until all connected shapes have been found. Here, it is assumed that no additional shapes (other than the shapes already identified) are directly or indirectly connected to shape 1312.

A virtual terminal may be created to provide a mechanism to connect net C_Net_1 at the present hierarchical level of the design to other nets at other levels in the design. At the present level of the design hierarchy, a virtual terminal can therefore be associated with net C_Net_1. In the present embodiment, entry 1710 in structure 1702 is modified to include a field 1714 that associates a virtual terminal (embodied as the example terminal identifier "C_Term_1") to net C_Net_1. The terminal identifier in field 1614 therefore provides a referencing structure for nets at other levels of the design hierarchy to refer connectivity to net C_Net_1 at the present level of the design hierarchy. If element C is the highest hierarchical level of the present analysis, then the virtual terminal for nets at this level does not need to be created.

At this point, shape 1312 and its connected shapes have been fully processed. Therefore, a determination is made whether there are additional native shapes at the present hierarchical level to process. Here, shape 1314 of element C still needs to be processed. A determination is made whether shape 1314 is already associated with a net. A scan of the structure 1706 corresponding to shape 1314 makes clear that shape 1314 is not yet associated with a net. Therefore, referring to FIG. 17c, a new net identifier (embodied in this figure as the example identifier "C_Net_2") is created and is associated with shape 1314, e.g., by adding an entry in structure 1706 that associates this shape to the net identifier "C_Net_2". Structure 1702 is modified to include an entry 1720 for the new net C_Net_2, which includes a field 1722 to identify the shapes in this net. Field 1722 in entry 1720 initially identifies shape 1314 as being part of net "C_Net_2".

All shapes connected to shape 1314, whether directly or indirectly, are identified and are associated with the same net "C_Net_2". It can be seen that shape 1316 is connected to shape 1314. Therefore, the entry 1720 in structure 1702 is modified such that field 1722 also identifies shape 1316 as being associated with net C_Net_2. In addition, the structure 1708 associated with shape 1316 is modified to make an association between shape 1316 and net C_Net_2.

In the iterative/recursive manner contemplated by the process of FIG. 11, all shapes connected to shape 1316, whether directly or indirectly, are further identified at this point. Here, shape 1316 is not directly connected to any native shapes explicitly located at the present hierarchical level. However, it can be seen that shape 1316 shorts to shape instance B1.1310, which is the instantiation of shape 1310 from instance B1 of element B. Shape 1310 is part of net B_Net_2 from element B. Since shape B1.1310 is an instantiation of shape 1310 from another hierarchical level in the design, the present net C_Net_2 can refer to the contents of this other net C_Net_2, thereby implicitly associating all shapes associated with the other net C_Net_2 to the present net C_Net_2. This type of referencing is accomplished in the present embodiment by creating an instance 1726 (referred to as B1.B_Term_2) of the terminal B_Term_2 associated with net B_Net_2, and associating this instance 1726 to the present net C_Net_2.

Instance terminal 1726 references a net B_Net_2 that itself contains an instance terminal 1626 that references another net A_Net_2. Therefore, the shapes that are associated with net C_Net_2 are derived by considering the native shapes at the present level (shape 1314, 1316), the shapes associated with instance terminal 1726 to net B_Net_1 (shape instances B1.1308 and B1.1310), as well the shapes associated with instance terminal 1626 to net A_Net_2 (shape instance B1.A1.1304).

A determination is made whether there are additional shapes at the present hierarchical level to process. Shape 1316 has not yet been handled at the outer loop of the process of FIG. 11. However, a determination is made whether this shape is already associated with a net. A review of structure 1708 allows an immediate determination that shape 1316 has already been associated with a net C_Net_2 during an earlier iteration of the process. Therefore, further processing for shape 1316 is skipped and an additional determination is made whether there are other explicit shapes at the present hierarchical level to process. In the present example, there are no further explicit shapes to process in the outer loop of the process of FIG. 11. Since shapes 1312, 1314, and 1316 have all been processed, the processing of the master occurrence for element C is completed.

Connectivity Verification

Figure 18:
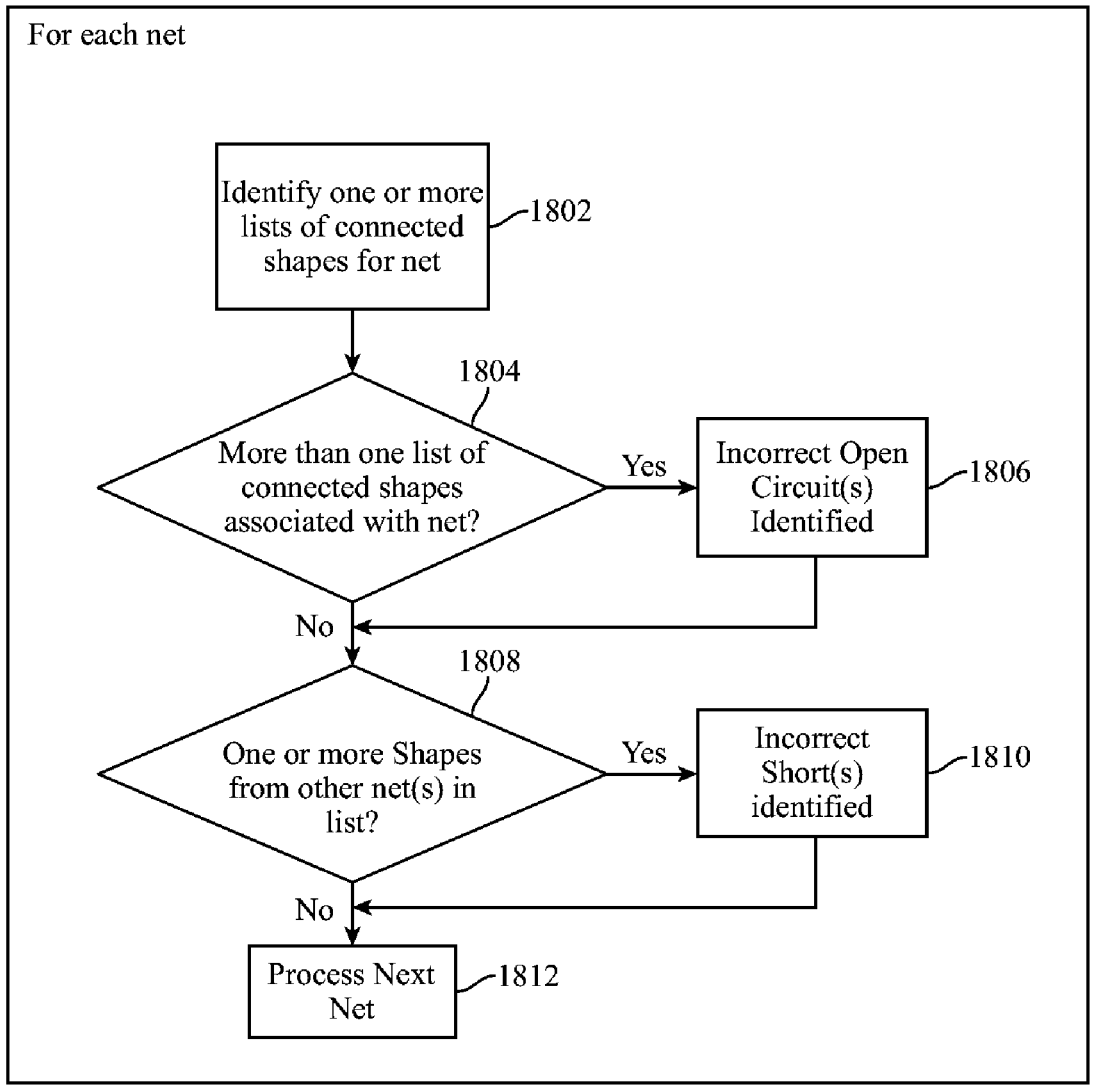
FIG. 18 is a flowchart of a process for updating connectivity according to an embodiment of the invention.

FIG. 18 is a flowchart of a process for verifying connectivity according to an embodiment of the invention. It is assumed that a list of nets already exists and the objective is to verify whether the actual connectivity between the shapes in the design is consistent with the list of nets. The process of FIG. 18 is performed for each identified net in the hierarchical design.

For each net, each of the shapes associated with the net are chased. During the process of verifying connected shapes for the net, all connected shapes are placed into the same "list" (1802). Each list will only contain shapes actually connected to each other. If a first shape is not connected to a second shape, then the first shape will appear in a different list from the second shape, even if the two shapes are supposed to be part of the same net. One or more lists of connected shapes will result from this type of analysis. The process of forming these lists according to one embodiment is described in more detail with respect to the flowchart of FIG. 19.

The number of lists of connected shapes will allow verification of the integrity of the net associated with the shapes (1804). If all of the shapes that have been examined are supposed to be associated with the same net, then the shapes should all be connected together. Only a single list of connected shapes should result from the analysis of 1802 if the present state of the design is consistent with the provided net information. If, however, an "open" exists anywhere among the set of shapes that are supposed to be associated with the same net (1806), then more than one list of connected shapes will result from the analysis of 1802.

If an open is identified, an indication of the open circuit can be returned back to the user. In addition, an initial determination of a solution to the open circuit can be performed. One example approach for determining, a "guide" to correct the open circuit is to perform a minimum spanning tree analysis over the shapes between the two lists of connected shapes. The guide will be the shortest path between the shapes for two lists of connected shapes, and will essentially be a path between a first shape in a first list and its closest second shape in a second list of connected shapes. A example approach for performing a minimum spanning tree analysis for shapes in a circuit design is disclosed in co-pending U.S. application Ser. No. 10/342,640, entitled "Method and Mechanism for Implementing a Minimum Spanning Tree", filed on Jan. 14, 2003, the contents of which are hereby explicitly incorporated by reference in its entirety.

The shapes within each of the lists will be examined to determine the net that is associated with each shape (1808). Since only a single net is presently being processed, all of the shapes identified and placed within the list(s) of connected shapes should be associated with the same net. If, however, a "short" exists anywhere among the set of shapes that are supposed to be associated with the same net, then one or more shapes from another net will be included among the list(s) of shapes (1810). If an improper short is identified, an indication of the open circuit can be returned back to the user at this point. In addition, an identification can be made of the specific shapes from the external net that is presented connected to the net under-examination.

Figure 19:
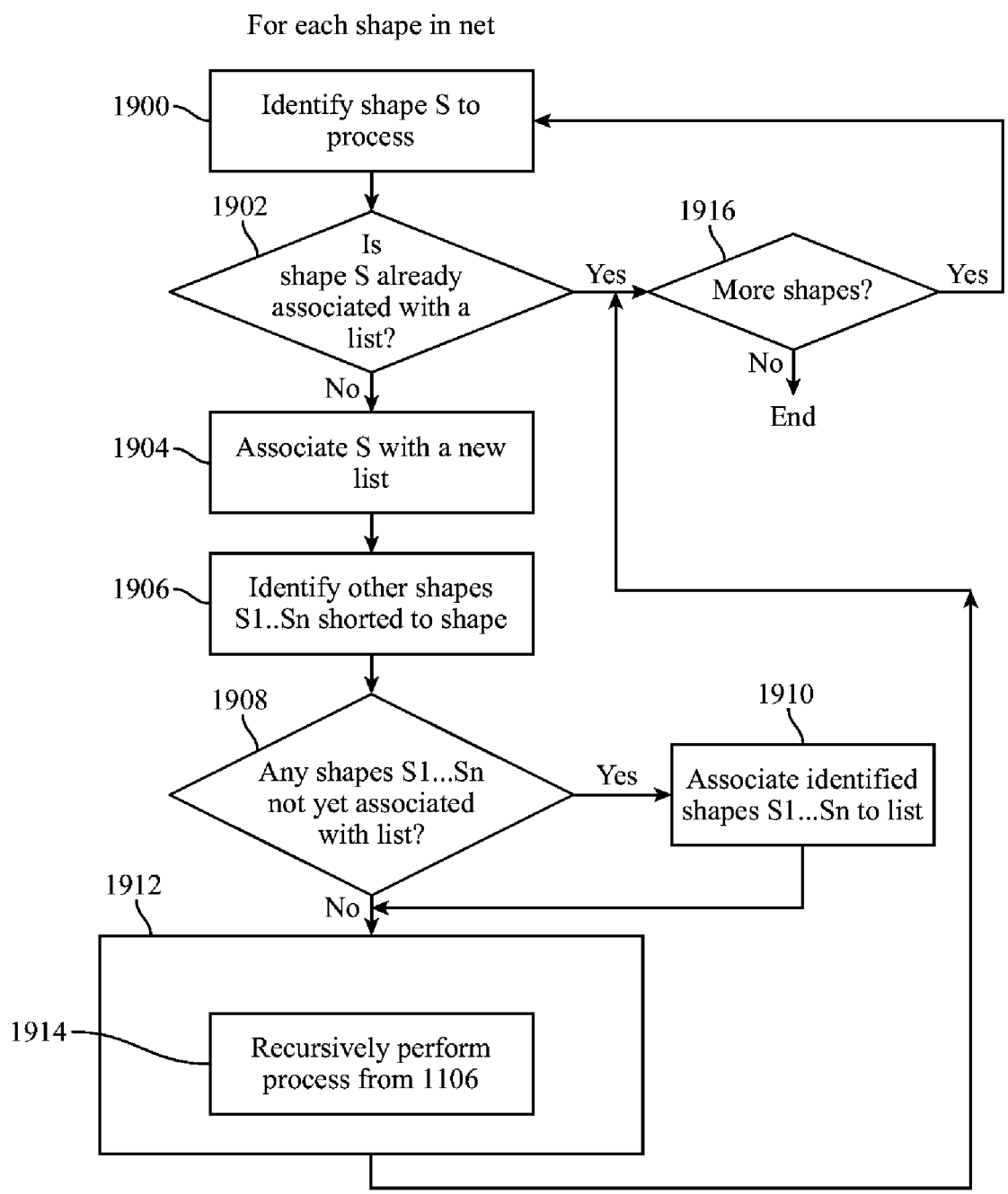
FIG. 19 a flowchart of a process for identifying connected shapes for connectivity extraction according, to an embodiment of the invention.

FIG. 19 is a flowchart of an embodiment of a process for identifying or "chasing" lists of connected shapes. All shapes that are identified as being connected or shorted together are associated with the same list of connected shapes. The process generally loops through all shapes that are associated with a given net in the design. Initially, a first shape (S) is identified for processing (1900). A determination is made whether the selected shape S is already associated with a list (1902). If the shape S has already been associated with a list, e.g., based upon an earlier iteration of the process, then a determination is made whether there exists additional shapes that have not yet been processed for the present net under examination (1916). If there are additional shapes to be processed, then the process returns back to 1900 to select another shape in the net for processing.

If the shape S has not yet been associated with a list, then a new list is created and is associated with the shape (1904). A determination is made at this point whether there are other shapes S1 . . . Sn that connect the present shape S. One approach for making this determination is to draw a search window having a border that exactly matches the outline of shape S, and using the process described with respect to FIG. 7 to determine whether any other shapes fall within that search window. If these other shapes S1 . . . Sn connect to shape S (1908), then these other shapes are also associated with the same list (1910).

For each of these identified shapes S1 . . . Sn, the process recursively/iteratively repeats from 1906 for each of these shapes. This will identify any additional shapes that connect to the original shape S through a chain of these other shapes S1 . . . Sn. Each iteration of this action will further identify additional chains of connected shapes until an identification is made of all shapes that connect, directly or indirectly, to the original shape S. By the end of this process, all of the connected shapes will be associated with the same list that was assigned to shape S.

A determination is made whether there exists other shapes to process at the present level of the design hierarchy (1916). One example approach is to review the data structure for each shape to identify shapes that are associated with the present net under examination. For these other shapes, the process returns back to 1900 to examine these other shapes.

Figure 17C:
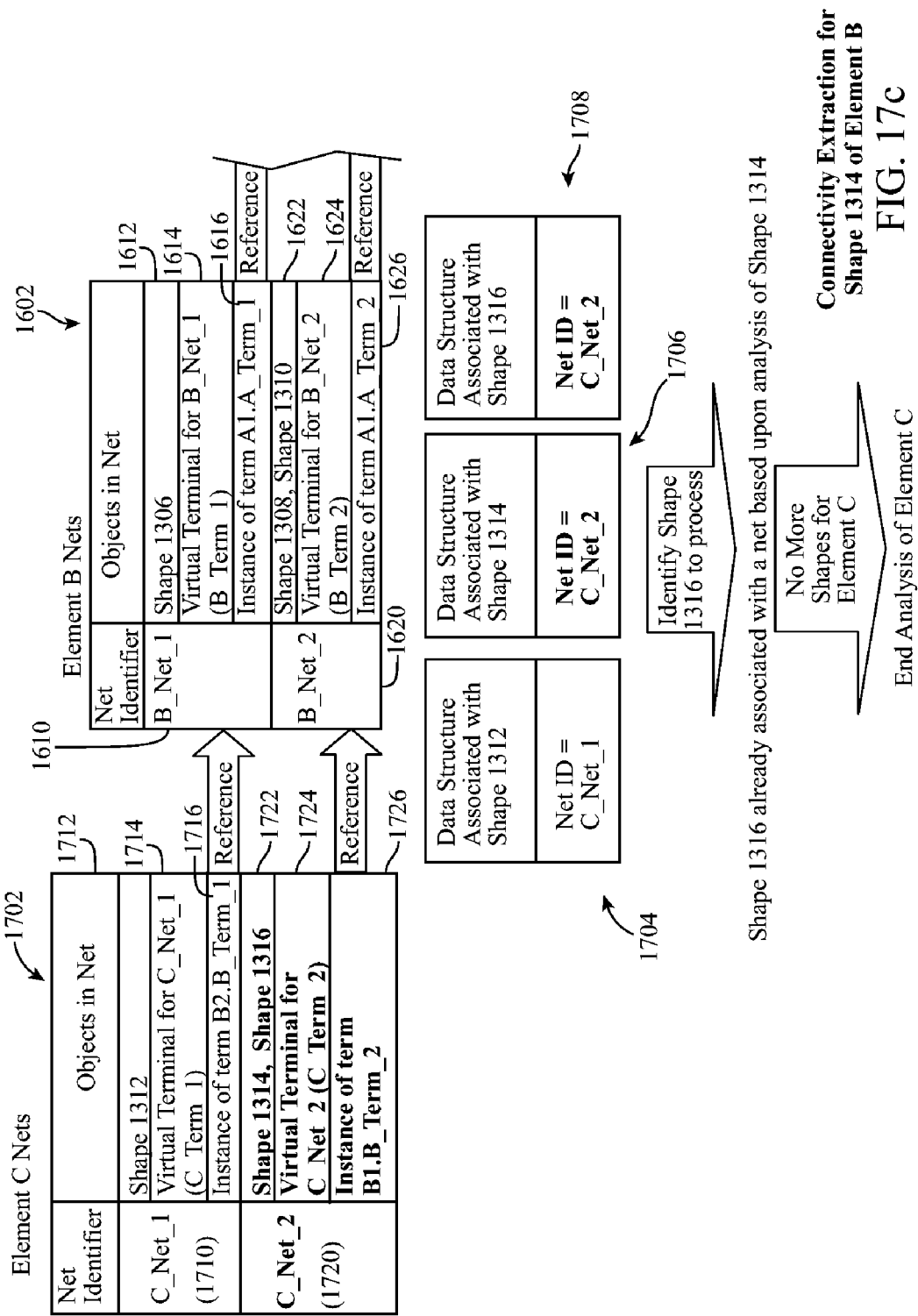
Figure 17C:
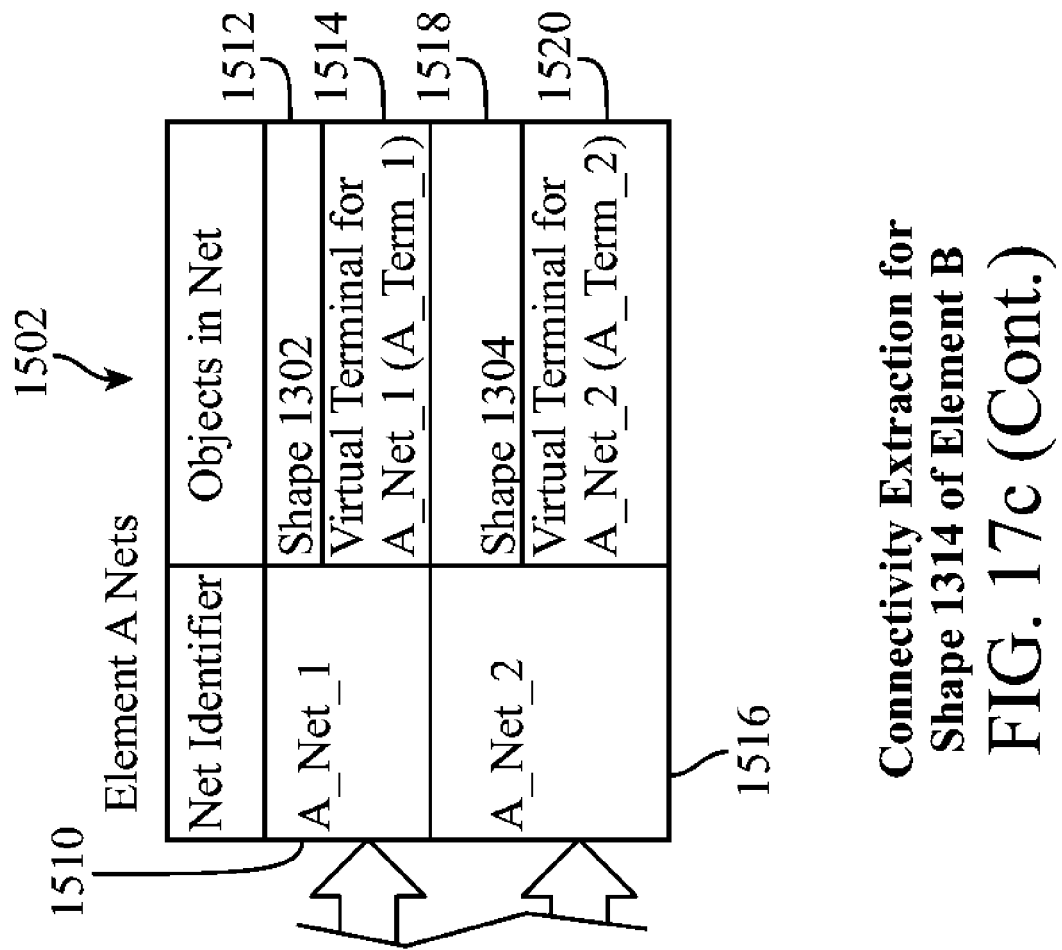
Figure 17D:
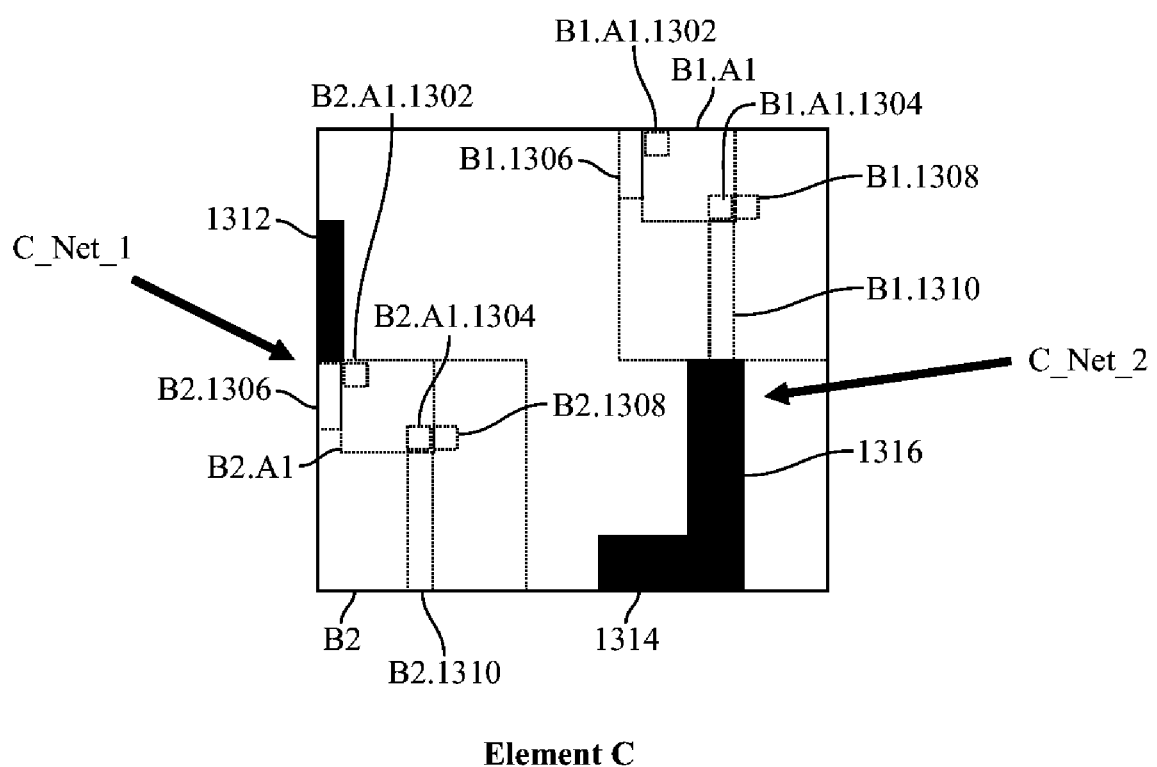

To illustrate the process for verifying connectivity according this embodiment of the invention, consider if a netlist is provided for element C of FIG. 13 which conforms to the net information derived and shown in stricture 1702 of FIG. 17c. As shown in entry 1720 of structure 1702, element C contains a net C_Net_2 containing explicit shapes 1314 and 1316 as well as instantiations of shapes B1.1310, B1.1308, and B1.A1.1304 (which are implicitly referenced based upon the instance terminal B1.B_Term_2 associated with this net that refers to a net B_Net_2 at the element B level of the design hierarchy).

Figure 20:
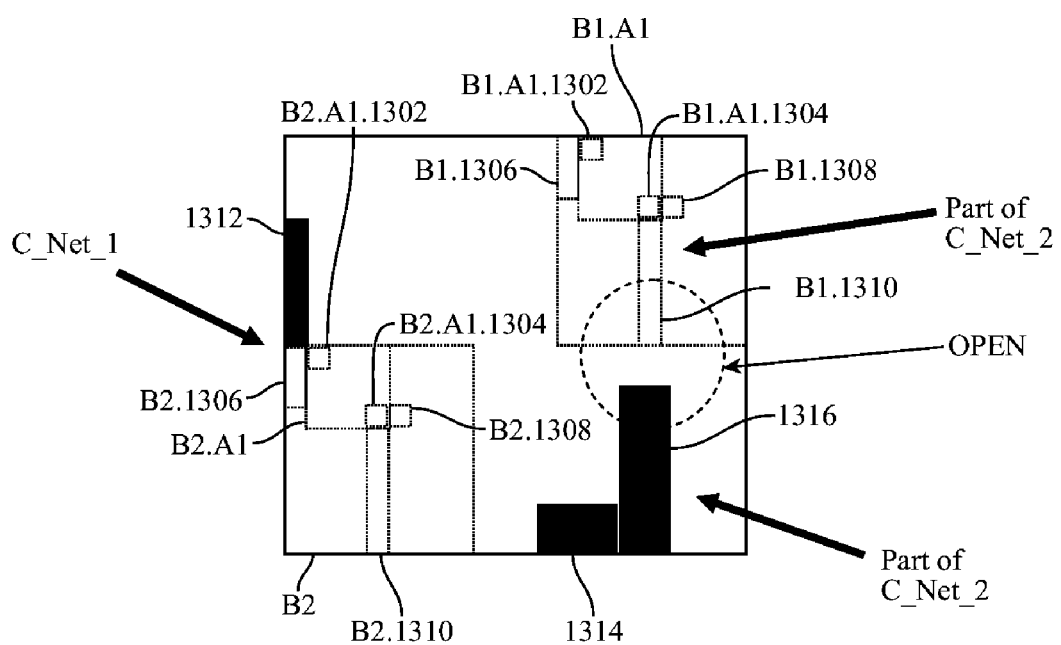
FIG. 20 shows an example level in a design hierarchy.

Assume that the actual state of the design for element C is as shown in FIG. 20. The visually shown difference between this version of element C and the version used to create the net information of structure 1702 is highlighted in the circled portion, in which an open gap exists between shape 1316 and the instantiation of shape B1.1310 in instance B1.

FIGS. 21a-d illustrate the automated process for performing connectivity verification to identify this type of open condition according to the present embodiment. The present illustrated example will be described with reference to the actions shown in the flowcharts of FIGS. 18 and 19.

FIG. 21a reproduces the structure 1702, which includes entry 1720 that contains net information for net C_Net_2. Consider if it is desired to verify the connectivity of shapes associated with this net. At this point, the first list 2102 of shapes for this net is empty, since the process has not yet processed any shapes for the net. Initially, a first shape is selected from among those shapes that are associated with the present net under examination, i.e., C_Net_2 (1900 of FIG. 19). One way to identify die shapes that are associated with the net under examination is to search the structures that are maintained to track the nets, e.g., the netlist or the example structure 1702 shown in FIG. 17c. For purposes of this example, the initial shape that is selected is shape 1314, although any of the other shapes associated with the net could have equally been selected as the initial shape.

A determination is made whether shape 1314 has already been associated with a list (1902 of FIG. 19). A scan of list 2102 makes clear that shape 1314 has not yet been associated with a list. Shape 1314 is thereafter associated with a list, e.g., by adding shape 1314 to the first list 2102 for the present net. Referring to FIG. 21b, shown is list 2102 modified to include an entry 2104 corresponding to shape 1314. In this example, entry 2104 also includes information about the net identifier that is associated with shape 1314, e.g., net C_Net_2. This net information can be identified, for example, by accessing the data structure 1706 associated with shape 1314 as shown in FIG. 17c.

At this point, all shapes connected to shape 1314, whether directly or indirectly, are identified and are associated with the same list 2102 (1908-1910 of FIG. 19). As previously described, one way to identify shapes connected to shape 1314 is to create a search window having a border that exactly matches the outline of shape 1314, and using the process described with respect to FIG. 7 to determine whether any other shapes fall within that search window. If any shapes fall within the boundaries of this search window, then these other shapes are also associated with the same list 2102 and are themselves processed in an iterative/recursive manner to identify more connected shapes (1912-1914 of FIG. 19). This process continues until all shapes that are directly or indirectly connected to shape 1314 have been identified.

In FIG. 20, it can be seen that shape 1316 is the only shape that is directly connected to shape 1314. A determination is made whether shape 1316 has already been associated with a list. A scan of list 2102 makes clear that shape 1316 has not yet been associated with a list. Therefore, shape 1316 is associated with the present list, e.g., by adding shape 1316 to the list 2102. Referring to FIG. 21c, shown is list 2102 modified to include an entry 2106 corresponding to shape 1316. In this example, entry 2106 also includes information that shows the net identifier associated with shape 1316, e.g., net C_Net_2. A determination is made whether additional shapes are connected to shape 1316. In this example, no further shapes are connected to shape 1316.

Since no other shapes are connected to these initial shapes 1314 and 1316, any further shapes that are identified as being associated with the same net are placed into one or more other lists. Therefore, a second list 2110 is created to hold the next set of connected shapes that are identified for the present net. The second list 2110 is initially empty of any contents.

The process now selects another shape that is associated with the present net C_Net_2 (action 1900 of FIG. 19). By referring to either the netlist or to entry 1720 in structure 1702, it can be determined that this net includes an instance terminal 1726 which refers to net B_Net_2, and from which shape instances B1.1310, B1.1308, and B1.A1.1304 can be derived as shapes within this net. In one embodiment, a single shape instance from among the group is now selected. In an alternate embodiment, the entire group of shape instances referenced by the instance terminal 1726 is selected as a composite shape. For the purposes of illustration, the entire group of related shape instances will be handled as a single entity in this example.

Figure 21D:
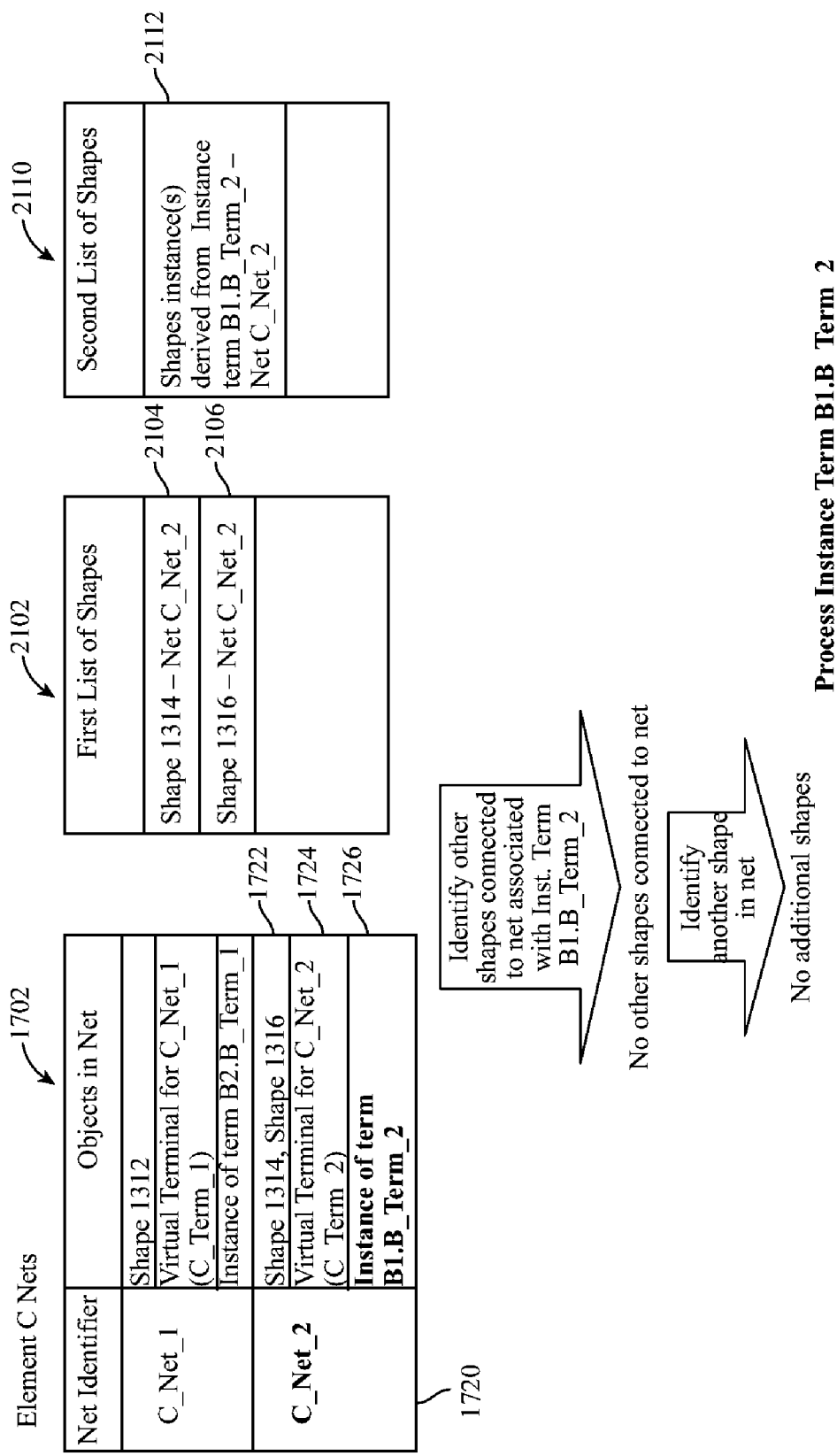

A determination is made whether the newly selected shape already belongs to an existing list. Here, the newly selected has not yet been associated with a group. Referring to FIG. 21d, the selected shape is thereafter associated with the second list 2110 by adding an entry 2112 that contains the identification of the selected shape. In addition, information about the specific net associated with the shape instances/instance terminal can be placed in entry 2112.

All shapes connected to the identified shape instance(s), whether directly or indirectly, are identified and are associated with the same list 2110. In the present example, no further shapes are connected to the shape instances referenced by the instance terminal 1726. Therefore, the process of identifying lists of connected shapes for the present net ends.

At this point, an evaluation is made of the list(s) of connected shapes that have been derived from the configuration of FIG. 20 (actions 1804-1806 of FIG. 18). If there are no opens in the actual configuration of shapes, then there should only be one list of connected shapes for the present net. If, however, one or more opens exist, then the number of list will be greater than one. The number of opens in the design exactly corresponds to value equivalent to (the number of lists−1).

Here, two lists of connected shapes have been identified for the net under examination, i.e., list 2102 and list 2110. Therefore, an open has been identified for the current state of the circuit design, as compared to the list of nets that has been provided. A candidate guide to provide a short between the two lists of shapes can be derived by performing a minimum spanning tree analysis to identify the shortest path between the two sets of shapes.

Figure 22:
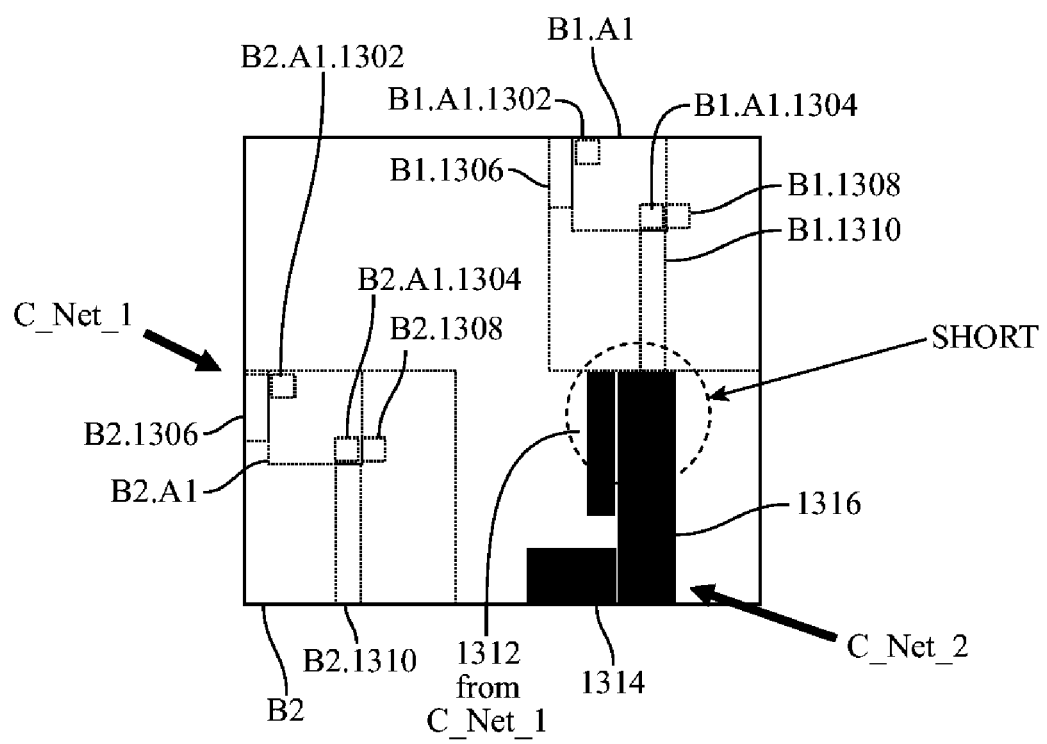
FIG. 22 shows an example level in a design hierarchy.

As another illustration of the process for verifying connectivity, consider if the actual state of the design for element C is as shown in FIG. 22. As before, a netlist is provided for element C which conforms to the net information derived and shown in structure 1702 of FIG. 17c. As shown in entry 1720 of structure 1702, element C contains a net C_Net_2 containing explicit shapes 1314 and 1316 as well as instantiations of shapes B1.1310, B1.1308, and B1.A1.1304 (which are implicitly referenced based upon the instance terminal B1.B_Term_2 associated with this net that refers to a net B_Net_2 at the element B level of the design hierarchy).

The visually shown difference between the version of element C in FIG. 22 and the version of element C used to create the net information of structure 1702 is highlighted in the circled portion of FIG. 22, which shows that shape 1312 has been shifted to short against shape 1316. Since shape 1312 and shape 1316 are associated with different nets according to the information in structure 1702, this is an improper short condition. FIGS. 23a-e illustrate the automated process for performing connectivity verification to identify this type of short condition according to the present embodiment. The present illustrated example will be described with reference to the process actions shown in the flowcharts of FIGS. 18 and 19.

Figure 23A:
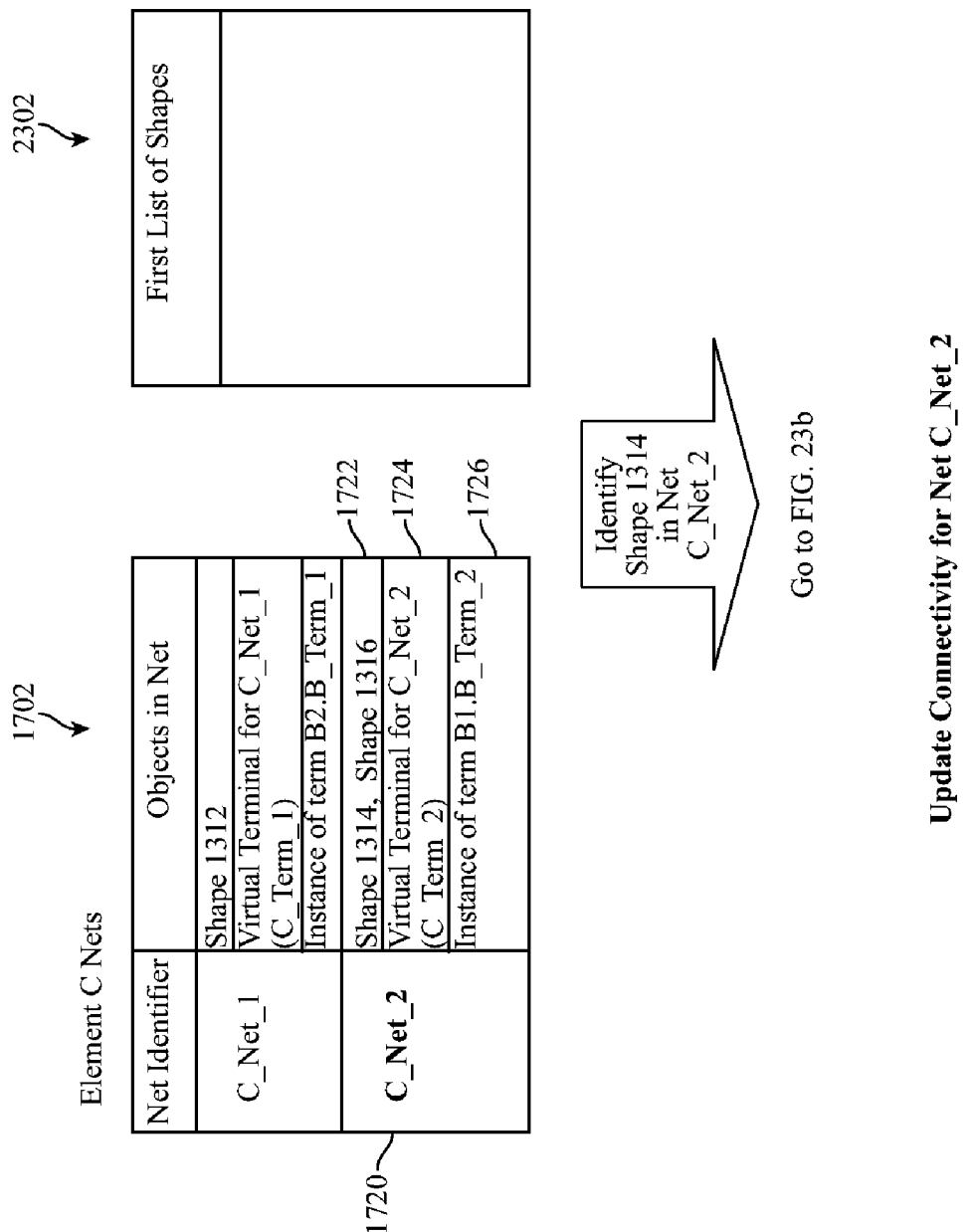

FIG. 23a reproduces the structure 1702, which includes entry 1720 that contains net information for net C_Net_2. Consider if it is desired to verify the connectivity of shapes associated with this net. At this point, the first list 2302 of shapes for this net is empty, since the process has not yet processed any shapes for the net. Initially, a first shape is selected from among those shapes that are associated with the present net under examination, i.e., C_Net_2 (1900 of FIG. 19). For purposes of this example, the initial shape that is selected is shape 1314, although any of the other shapes associated with the net could have equally been selected as the initial shape.

Figure 23B:
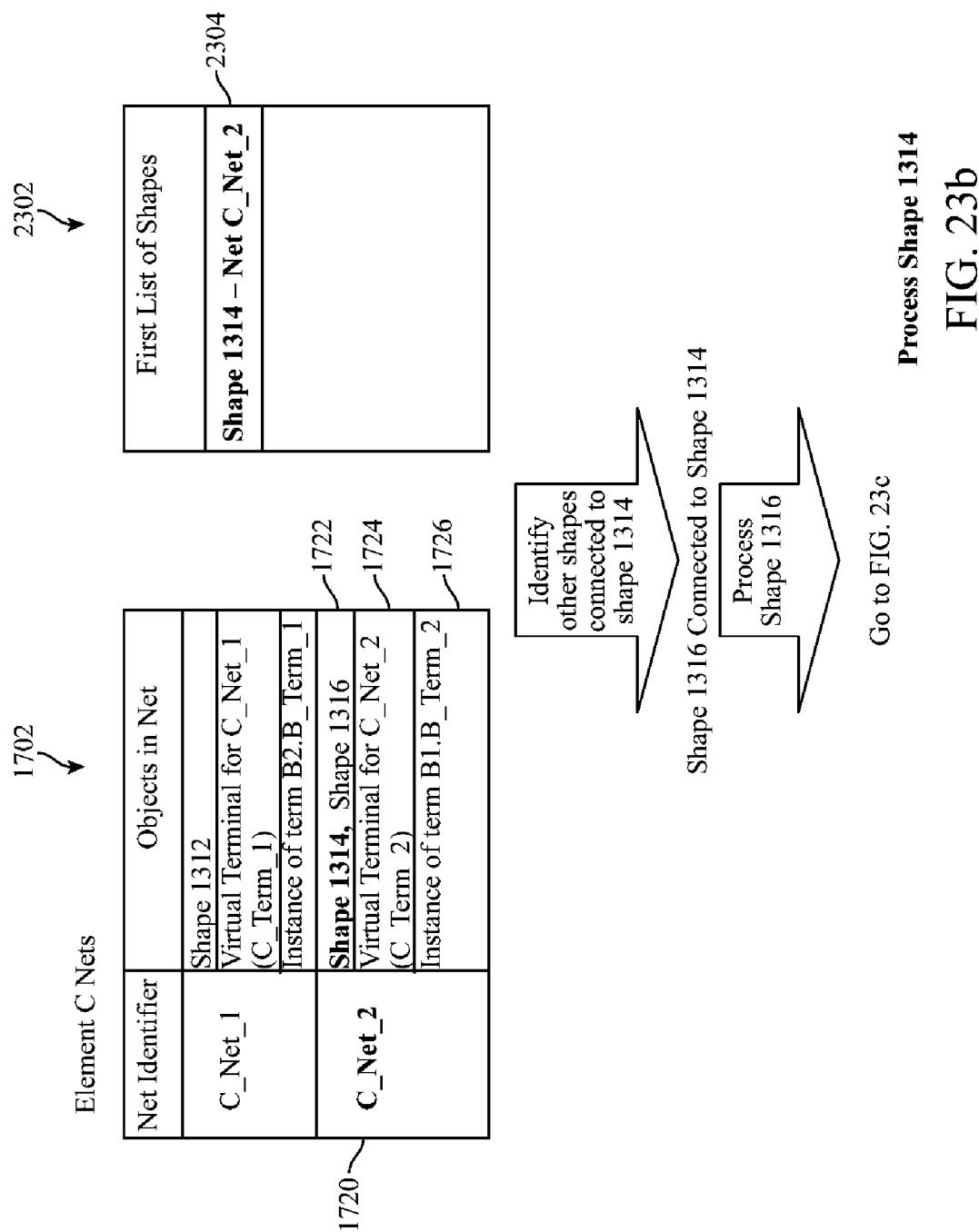

A determination is made whether shape 1314 has already been associated with a list (1902 of FIG. 19). A scan of list 2302 makes clear that shape 1314 has not yet been associated with a list. Shape 1314 is thereafter associated with a list, e.g., by adding shape 1314 to tile first list 2302 for the present net. Referring to FIG. 23b, shown is list 2302 modified to include an entry 2304 corresponding to shape 1314. In this example, entry 2304 also includes information about the net identifier that is associated with shape 1314, e.g., net C_Net_2. This net information can be identified, for example, by accessing the data structure 1706 associated with shape 1314 as shown in FIG. 17c.

At this point, all shapes connected to shape 1314, whether directly or indirectly, are identified and are associated with the same list 2302 (1908-1910 of FIG. 19). This process continues until all shapes that are directly or indirectly connected to shape 1314 have been identified.

In FIG. 22, it can be seen that shape 1316 is the only shape that is directly connected to shape 1314. There are no other shapes directly connected to shape 1302. A determination is made whether shape 1316 has already been associated with a list. A scan of list 2302 makes clear that shape 1316 has not yet been associated with a list. Therefore, shape 1316 is associated with the present list, e.g., by adding shape 1316 to the list 2302. Referring to FIG. 23c, shown is list 2302 modified to include an entry 2306 corresponding to shape 1316. In this example, entry 2306 also includes information that shows the net identifier associated with shape 1316, e.g., net C_Net_2.

Figure 23D:
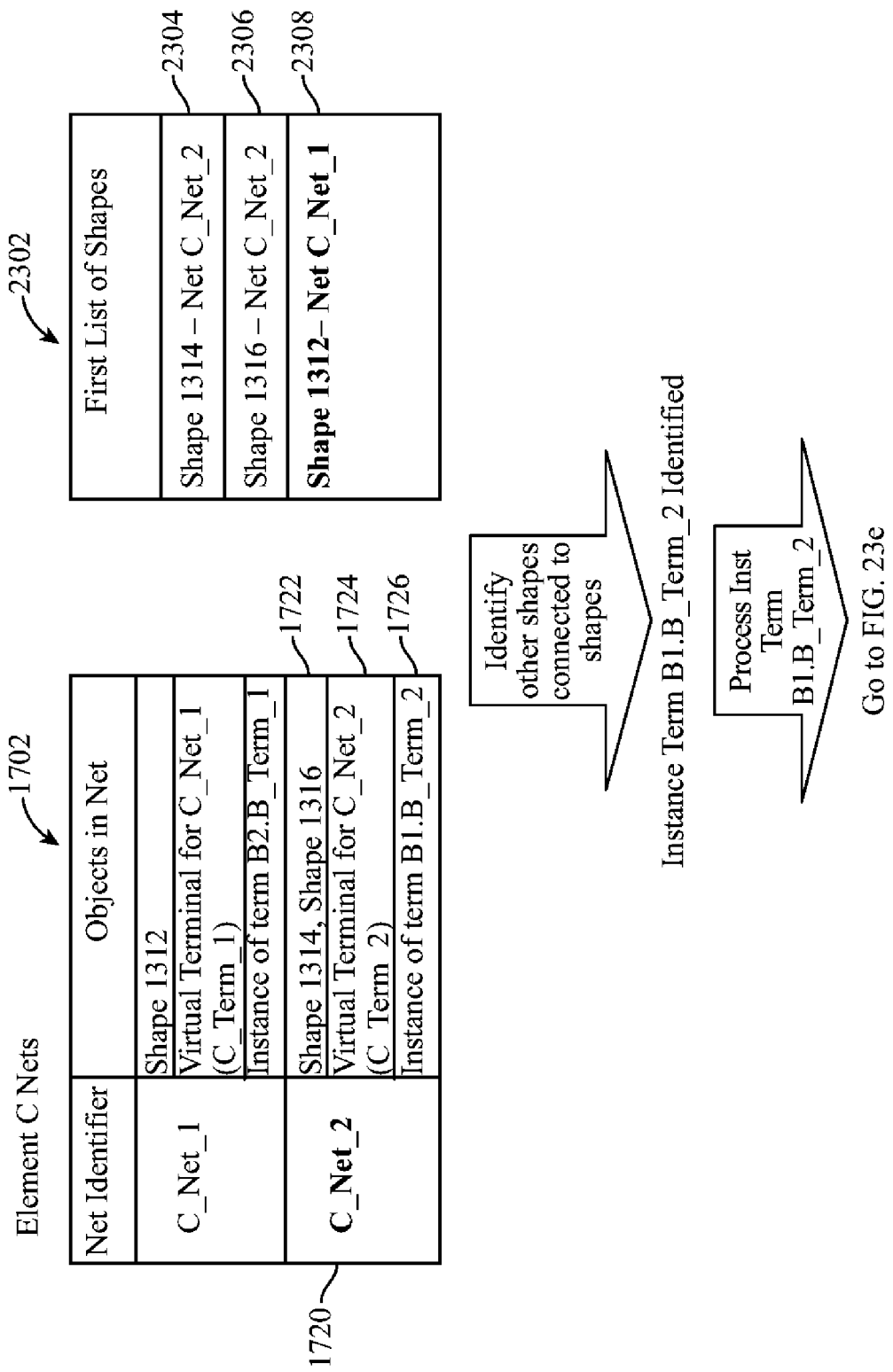

A determination is made whether additional shapes are connected to shape 1316. In this example, shape 1312 is identified as being directly connected to shape 1316. A determination is made whether shape 1312 has already been associated with a list. A scan of list 2302 makes clear that shape 1312 has not yet been associated with a list. Therefore, shape 1312 is associated with the present list, e.g., by adding shape 1312 to the list 2302. Referring to FIG. 23d, shown is list 2302 modified to include an entry 2308 corresponding to shape 1312. In this example, entry 2308 also includes information that shows the net identifier associated with shape 1312, e.g., net C_Net_1.

The process now selects another shape that is connected to either shape 1312 or 1316. In the present example, it can be seen that shape instance B1.1310 is directly connected to shape 1316; and that shape instances B1.1308 and B1.A1.1304 are indirectly connected. In one embodiment, each of these shape instances are individually identified as being a connected shape (e.g., using the process of FIG. 7), and are individually added to the list 2302. In an alternate embodiment, the entire group of shape instances for a given net are referenced by the instance terminal 1726 and are is selected/referenced as a composite shape. For the purposes of illustration, the entire group of related shape instances will be handled as a single entity in this example.

Figure 23E:
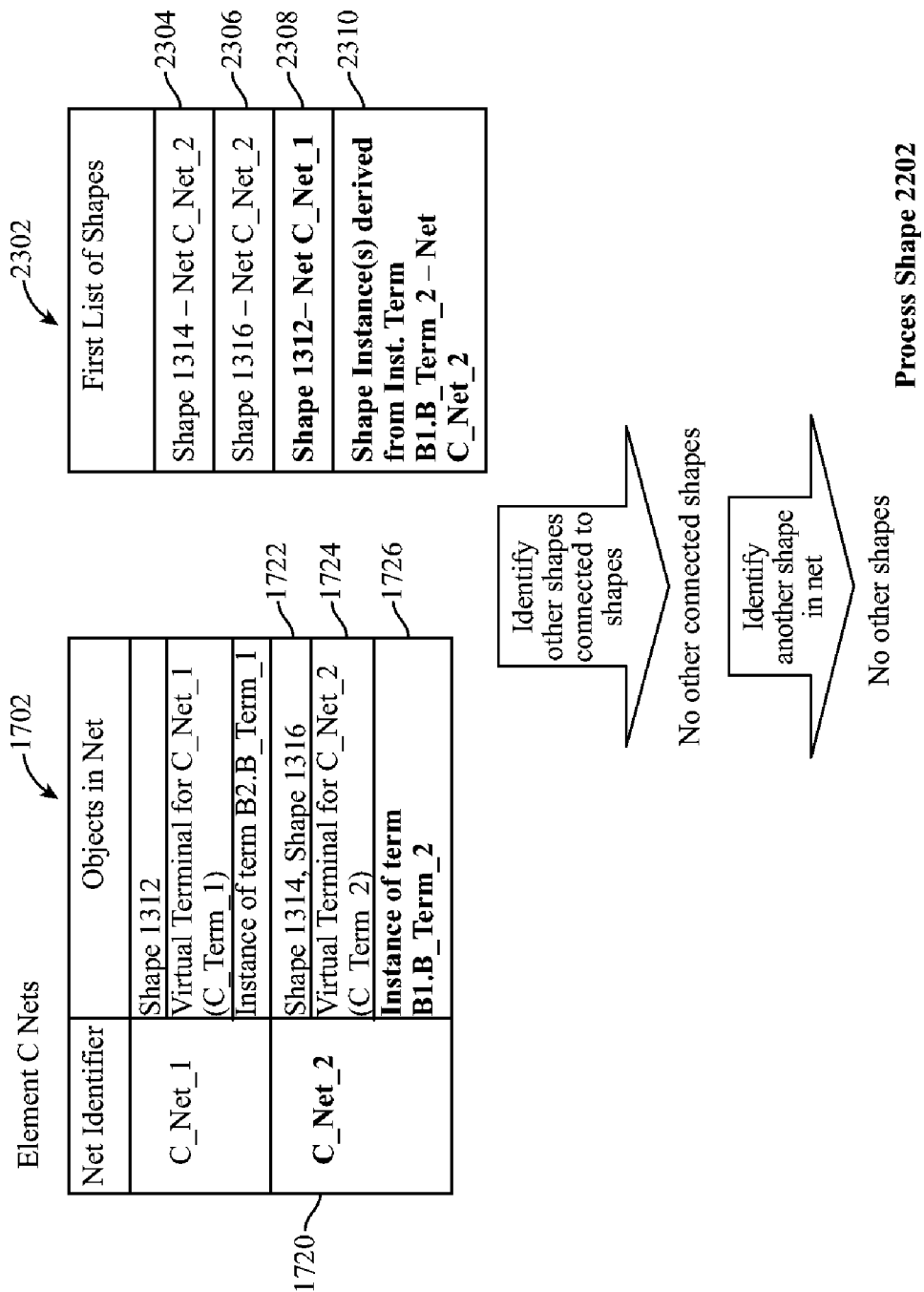

A determination is made whether the newly selected shape instance(s) already belong to an existing list. Here, the newly selected instance(s) have not yet been associated with a group. Referring to FIG. 23e, the selected shape is thereafter associated with the list 2302 by adding an entry 231.0 that contains the identification of the selected instance(s). In the present example, an identification of the instance terminal 1726 is placed in entry 2310 to allow reference to the shape instances that have been identified and associated with the present list. In addition, information about the specific net associated with the shape instances/instance terminal can be placed in entry 2310.

All shapes connected to the identified shape instance(s), whether directly or indirectly, are identified and are associated with the same list 2110. In the present example, no further shapes are connected to any of the shapes associated with the net under present examination. Therefore, the process of identifying lists of connected shapes for the present net ends.

An evaluation is made of the list(s) of connected shapes that have been derived from the configuration of FIG. 22. If there are no opens in the actual configuration of shapes, then there should only exist one list for the present net. If, however, one or more opens exist, then the number of list will be greater than one. The number of opens in the design exactly corresponds to value equivalent to (the number of lists−1). Here, there is only a single list of nets, i.e., list 2302. Therefore, no opens have been identified for the current state of the circuit design.

Further analysis is performed against the list(s) to determine if any shorts exist in the actual shape configuration of FIG. 22 (action 1808-1810 of FIG. 18). If the list only contains shapes for the net under present examination, then no shorts have been identified. If, however, shapes associated with multiple nets are present in the lists, then one or more shorts haste been identified.

Here, the list 2302 of connected shapes for the present net C_Net_2 contains entries 2304, 2306, 2308, and 2310. Entries 2304, 2306, and 2310 correspond to shapes that are associated with the present net C_Net_2. However, entry 2308 corresponds to a shape 1312 that is associated with a different net C_Net_1. Therefore, a short has been identified.

Therefore, what has been described is a method and mechanism for managing and tracking connectivity of objects in an integrated circuit design. The present invention may be embodied as any combination of software, hardware, computer usable medium, or manual operations. In one specific embodiment, the invention is embodied as an EDA software tool for placing and/or routing integrated circuit designs.

These and other embodiments of the present invention may be realized in accordance with the above teachings and it should be evident that various modifications and changes may be made to the above-described embodiments without departing from the broader spirit and scope of the invention. The specification and drawings are, accordingly, to be regarded in an illustrative rather than restrictive sense and the invention measured only in terms of the claims.

SYSTEM ARCHITECTURE OVERVIEW

Figure 24:
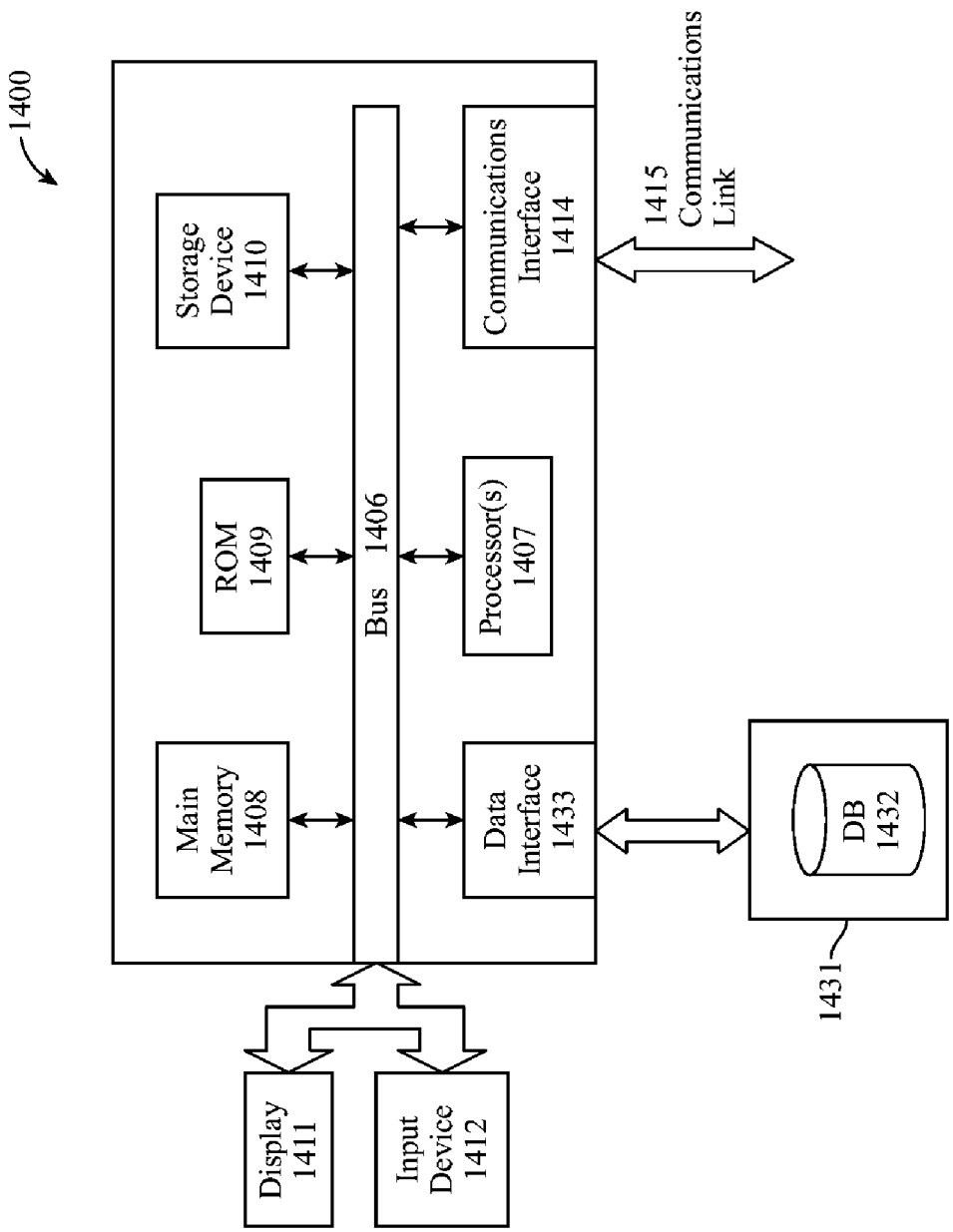
FIG. 24 shows an example computer system in which a method and mechanism for identifying and tracking shape connectivity can take place.

The execution of the sequences of instructions required to practice the invention may be performed in embodiments of the invention by a computer system 1400 as shown in FIG. 24. In an embodiment of the invention, execution of the sequences of instructions required to practice the invention is performed by a single computer system 1400. According to other embodiments of the invention, two or more computer systems 1400 coupled by a communication link 1415 may perform the sequence of instructions required to practice the invention il coordination with one another. In order to avoid needlessly obscuring the invention, a description of only one computer system 1400 will be presented below; however, it should be understood that any number of computer systems 1400 may be employed to practice the invention.

A computer system 1400 according to an embodiment of the invention will now be described with reference to FIG. 24, which is a block diagram of the functional components of a computer system 1400 according to an embodiment of the invention. As used herein, the term computer system 1400 is broadly used to describe any computing device that can store and independently run one or more programs.

Each computer system 1400 may include a communication interface 1414 coupled to the bus 1406. The communication interface 1414 provides two-way communication between computer systems 1400. The communication interface 1414 of a respective computer system 1400 transmits and receives electrical, electromagnetic or optical signals that include data streams representing various types of signal information, e.g., instructions, messages and data. A communication link 1415 links one computer system 1400 with another computer system 1400. For example, the communication link 1415 may be a LAN, in which case the communication interface 1414 may be a LAN card, or the communication link 1415 may be a PSTN, in which case the communication interface 1414 may be an integrated services digital network (ISDN) card or a modem.

A computer system 1400 may transmit and receive messages, data, and instructions, including program, i.e., application, code, through its respective communication link 1415 and communication interface 1414. Received program code may be executed by the respective processor(s) 1407 as it is received, and/or stored in the storage device 1410, or other associated nonvolatile media, for later execution.

In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals that include data streams representing various types of signal information, e.g., instructions, messages and data. In embodiments of the invention, the functions of the data interface 1433 may be performed by the communication interface 1414.

Computer system 1400 includes a bus 1406 or other communication mechanism for communicating instructions, messages and data, collectively, information, and one or more processors 1407 coupled with the bus 1406 for processing information. Computer system 1400 also includes a main memory 1408, such as a random access memory (RAM) or other dynamic storage device, coupled to the bus 1406 for storing dynamic data and instructions to be executed by the processor(s) 1407. The main memory 1408 also may be used for storing temporary data, i.e., variables, or other intermediate information during execution of instructions by the processor(s) 1407.

The computer system 1400 may further include a read only memory (ROM) 1409 or other static storage device coupled to the bus 1406 for storing static data and instructions for the processor(s) 1407. A storage device 1410, such as a magnetic disk or optical disk, may also be provided and coupled to the bus 1406 for storing data and instructions for the processor(s) 1407.

A computer system 1400 may be coupled via the bus 1406 to a display device 1411, such as, but not limited to, a cathode ray tube (CRT), for displaying information to a user. An input device 1412, e.g., alphanumeric and other keys, is coupled to the bus 1406 for communicating information and command selections to the processor(s) 1407.

According to one embodiment of the invention, an individual computer system 1400 performs specific operations by their respective processor(s) 1407 executing one or more sequences of one or more instructions contained in the main memory 1408. Such instructions may be read into the main memory 1408 from another computer-usable medium, Such as the ROM 1409 or the storage device 1410. Execution of the sequences of instructions contained in the main memory 1408 causes the processor(s) 1407 to perform the processes described herein. In alternative embodiments, hard-wired circuitry may be used in place of or in combination with software instructions to implement the invention. Thus, embodiments of tile invention are not limited to any specific combination of hardware circuitry and/or software.

The term "computer-usable medium," as used herein, refers to any medium that provides information or is usable by the processor(s) 1407. Such a medium may take many forms, including, but not limited to, non-volatile or volatile media. Non-volatile media, i.e., media that can retain information in the absence of power, includes the ROM 1409, CD ROM, magnetic tape, and magnetic discs. Volatile media, i.e., media that can not retain information in the absence of power, includes the main memory 1408.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense.

What is claimed is:

1. A computer implemented method for verifying connectivity for a hierarchical configuration of shapes representing an integrated circuit design, comprising:
    using at least one processor that is configured or programmed for performing a process, the process comprising:
    identifying one or more lists of connected shapes for a net in a hierarchical physical electronic design having a plurality of hierarchical levels, wherein
        the one or more lists of connected shapes are identified without requiring the hierarchical physical electronic design to be unfolded, and
        a hierarchical level of the plurality of hierarchical levels is considered as unfolded when an action of hierarchy flattening is performed on at least the hierarchical level;
    determining a number of lists of connected shapes that result from the act of identifying the one or more lists of connected shapes for the net; and
    identifying an open circuit if the number of lists from the act of determining the number of lists is greater than one.

2. The computer implemented method of claim 1, further comprising:
    determining whether a shape in the number of lists is not from the net; and
    identifying a short if the shape from the act of determining whether any shapes in the lists is from a different net.

3. The computer implemented method of claim 1, in which the process for identifying the one or more lists comprises, for each shape for the net:
    determining if the shape is associated with a list and associating the shape with the list if the shape has not previously been associated with a list; and
    identifying all other shapes that directly or indirectly connect to the shape and associating these all other shapes to the list.

4. The computer implemented method of claim 3, in which the act of identifying the all other shapes that indirectly connect to the shape is performed by iteratively performing the method for each directly connected shape.

5. The computer implemented method of claim 1, in which a first list is associated with a first set of connected shapes and a second list is associated with a second set of connected shapes, wherein the first set and the second set are not connected together.

6. The computer implemented method of claim 1, in which a candidate path is derived for the open that is identified.

7. The computer implemented method of claim 6, in which the candidate path is derived using minimum spanning tree analysis.

8. The computer implemented method of claim 1, in which the process is iteratively performed for each net at a given hierarchical level.

9. The computer implemented method of claim 1, in which a list of nets is provided.

10. The computer implemented method of claim 9, in which a net from within the list of nets includes a logical reference from a net at one hierarchical level to a net at another hierarchical level of the integrated circuit design.

11. The computer implemented method of claim 10, in which the logical reference comprises a virtual terminal.

12. A computer program product comprising a non-transitory computer usable storage medium storing instructions which, when executed by at least one processor, cause the at least one processor to perform a method for verifying connectivity for a hierarchical configuration of shapes representing an integrated circuit design, the method comprising:
    using at least one processor that is configured or programmed for performing a process, the process comprising:
    identifying one or more lists of connected shapes for a net in a hierarchical physical electronic design having a plurality of hierarchical levels, wherein
        the one or more lists of connected shapes are identified without requiring the hierarchical physical electronic design to be unfolded, and
        a hierarchical level of the plurality of hierarchical levels is considered as unfolded when an action of hierarchy flattening is performed on at least the hierarchical level;
    determining a number of lists of connected shapes that result from the act of identifying the one or more lists; and
    identifying an open circuit if the number of lists from the act of determining the number of lists is greater than one.

13. The computer program product of claim 12, the process further comprising:
    determining whether a shape in the number of lists is not from the net; and
    identifying a short if the shape from the act of determining whether any shapes in the lists is from a different net.

14. The computer program product of claim 12, the process further comprising:
    determining if the shape is associated with a list and associating the shape with the list if the shape has not previously been associated with a list; and
    identifying all other shapes that directly or indirectly connect to the shape and associating these all other shapes to the list.

15. The computer program product of claim 12, in which the process for identifying the all other shapes that indirectly connect to the shape is performed by iteratively performing the method for each directly connected shape.

16. The computer program product of claim 12, in which
    a first list is associated with a first set of connected shapes and a second list is associated with a second set of connected shapes, wherein the first set and the second set are not connected together, and
    a candidate path is derived for the open that is identified, wherein the candidate path is derived using minimum spanning tree analysis.

17. A system for extracting connectivity for a hierarchical configuration of shapes representing an integrated circuit design, comprising:
   at least one processor that is to:
   identify one or more lists of connected shapes for a net in a hierarchical physical electronic design having a plurality of hierarchical levels, wherein
      the one or more lists of connected shapes are identified without requiring the hierarchical physical electronic design to be unfolded, and
      a hierarchical level of the plurality of hierarchical levels is considered as unfolded when an action of hierarchy flattening is performed on at least the hierarchical level;
   determine a number of lists of connected shapes that result from the process for identifying the one or more lists; and
   identify an open if the number of lists from the process for determining the number of list is greater than one.

18. The system of claim 17, the process further comprising:
   determining whether a shape in the number of lists is not from the net; and
   identifying a short if the shape from the act of determining whether any shapes in the lists is from a different net.

19. The system of claim 17, the process further comprising:
   determining if the shape is associated with a list and associating the shape with the list if the shape has not previously been associated with a list; and
   identifying all other shapes that directly or indirectly connect to the shape and associating these all other shapes to the list.

20. The system of claim 17, in which the process for identifying the all other shapes that indirectly connect to the shape is performed by iteratively performing the method for each directly connected shape.

21. The system of claim 17, in which
   a first list is associated with a first set of connected shapes and a second list is associated with a second set of connected shapes, wherein the first set and the second set are not connected together, and
   a candidate path is derived for the open that is identified, wherein the candidate path is derived using minimum spanning tree analysis.

* * * * *